United States Patent
Wu et al.

(10) Patent No.: US 12,471,343 B2
(45) Date of Patent: Nov. 11, 2025

(54) GATE ISOLATION FEATURES IN SEMICONDUCTOR DEVICES AND METHODS OF FABRICATING THE SAME

(71) Applicant: Taiwan Semiconductor Manufacturing Company, Ltd., Hsin-Chu (TW)

(72) Inventors: Shao-Jyun Wu, New Taipei (TW); Yung Feng Chang, Hsinchu (TW); Tung-Heng Hsieh, Hsinchu County (TW); Bao-Ru Young, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 796 days.

(21) Appl. No.: 17/680,615

(22) Filed: Feb. 25, 2022

(65) Prior Publication Data

US 2022/0406900 A1    Dec. 22, 2022

Related U.S. Application Data

(60) Provisional application No. 63/211,714, filed on Jun. 17, 2021, provisional application No. 63/211,756, filed on Jun. 17, 2021.

(51) Int. Cl.
*H10D 64/01*    (2025.01)
*H01L 21/762*    (2006.01)
(Continued)

(52) U.S. Cl.
CPC ......... *H10D 64/01* (2025.01); *H01L 21/762* (2013.01); *H10D 30/6735* (2025.01); *H10D 62/118* (2025.01); *H10D 64/017* (2025.01)

(58) Field of Classification Search
CPC ............. H01L 21/762; H10D 30/0614; H10D 30/0616; H10D 30/6735; H10D 30/6757; H10D 64/017
See application file for complete search history.

(56) References Cited

U.S. PATENT DOCUMENTS 8,772,109 B2    7/2014    Colinge
8,785,285 B2    7/2014    Tsai et al.
(Continued)

FOREIGN PATENT DOCUMENTS

TW    202115901 A    4/2021
TW    202117818 A    5/2021
(Continued)

*Primary Examiner* — Moazzam Hossain
*Assistant Examiner* — Yuchang Liang
(74) *Attorney, Agent, or Firm* — HAYNES AND BOONE, LLP

(57) ABSTRACT

A method includes forming first and second semiconductor fins protruding from a substrate. Each of the first and second semiconductor fins includes a stack of alternating channel layers and non-channel layers. The method also includes forming a dielectric helmet between and protruding from the first and the second semiconductor fins, forming a dummy gate stack over the dielectric helmet, patterning the dummy gate stack to expose a portion of the dielectric helmet, removing the exposed portion of the dielectric helmet, and forming a metal gate structure, such that a remaining portion of the dielectric helmet separates the metal gate structure between the first and the second semiconductor fins. The method also includes forming a contact feature over a portion of the metal gate structure. A sidewall of the contact feature is between one of the semiconductor fins and the remaining portion of the dielectric helmet.

20 Claims, 57 Drawing Sheets

(51) Int. Cl.
*H10D 30/67* (2025.01)
*H10D 62/10* (2025.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2022/0399333 A1* | 12/2022 | Guler ................ H10D 30/6211 |

FOREIGN PATENT DOCUMENTS

| | | |
|---|---|---|
| TW | 202117819 A | 5/2021 |
| TW | 202119639 A | 5/2021 |
| TW | 202121698 A | 6/2021 |

* cited by examiner

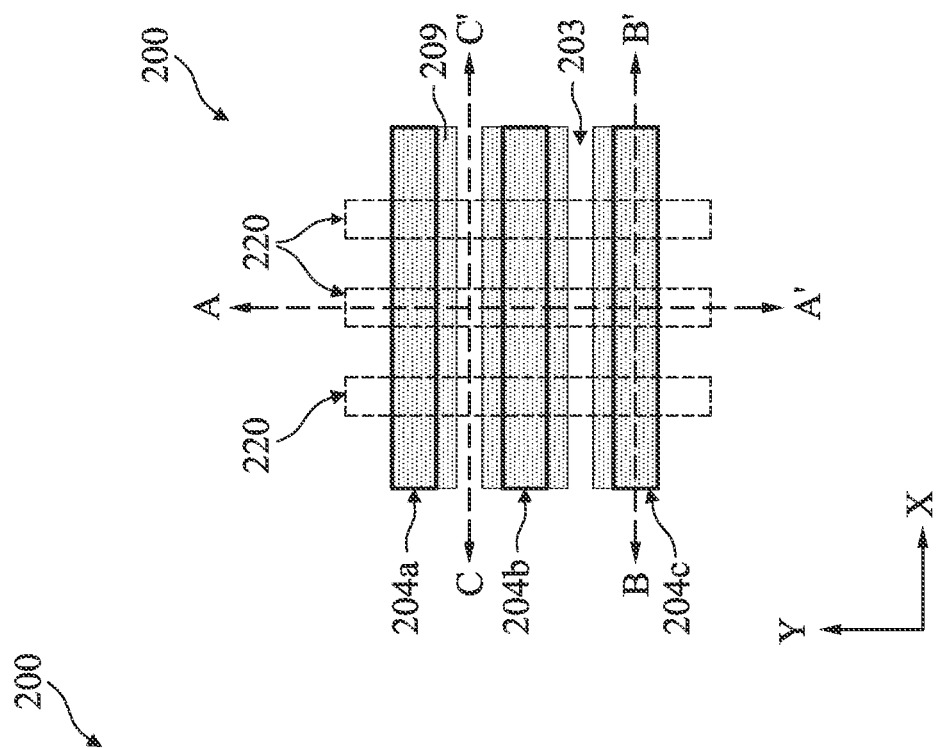
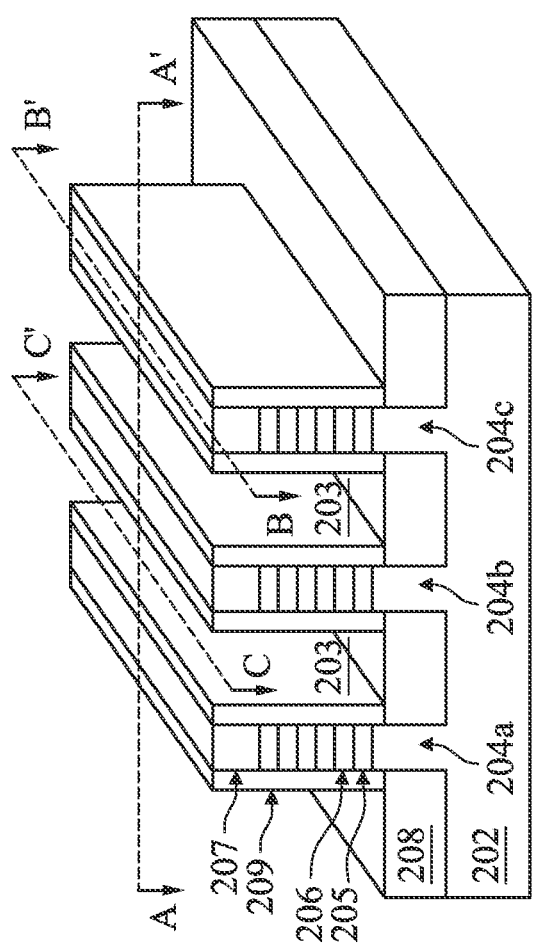
FIG. 2A
FIG. 2B

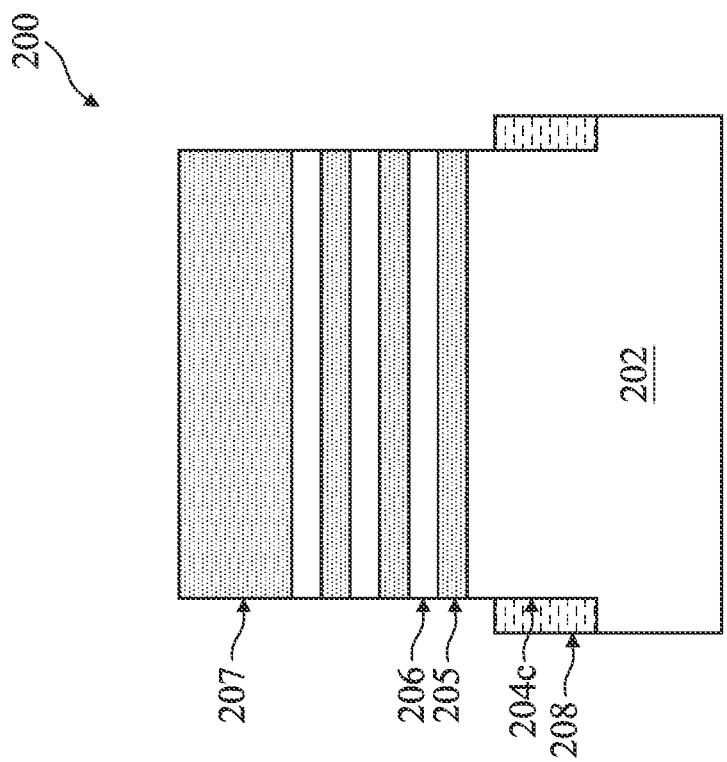
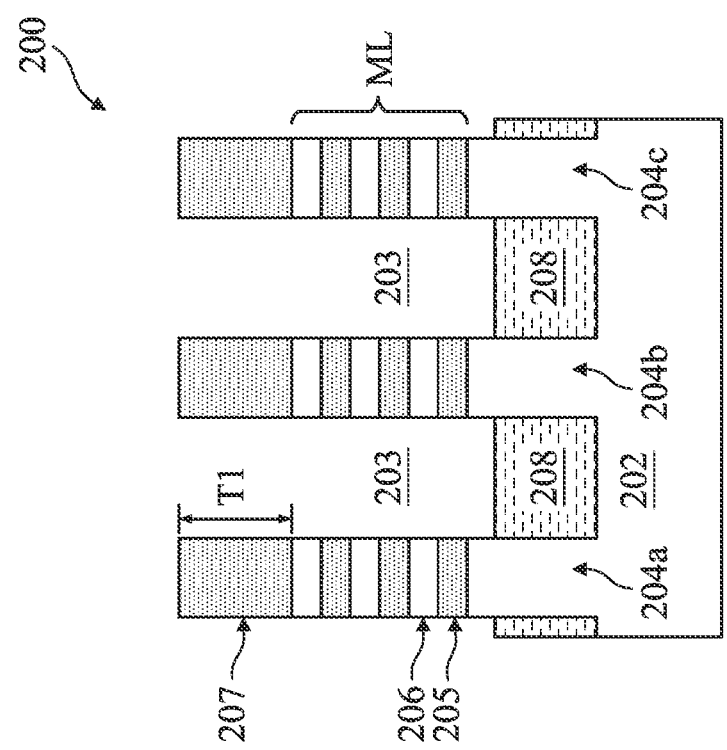

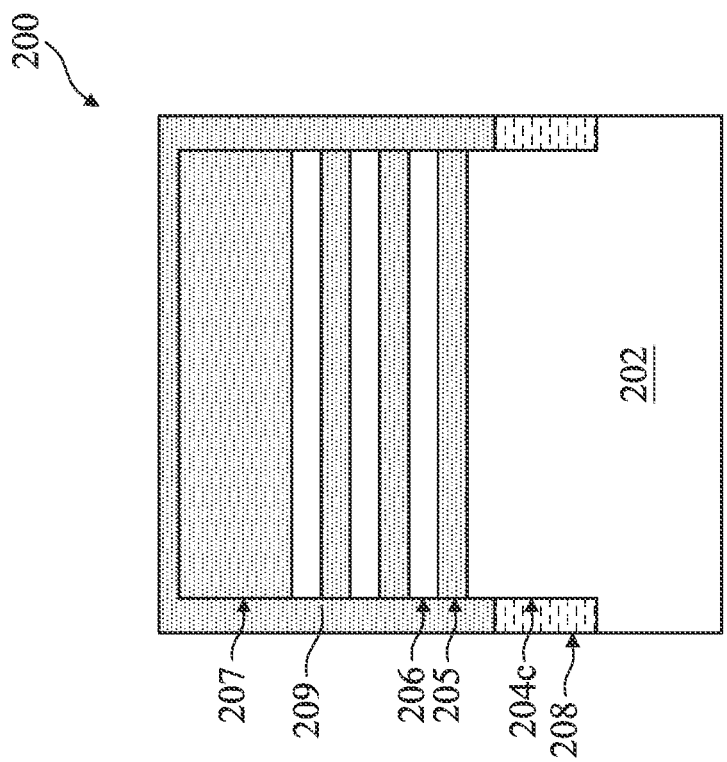
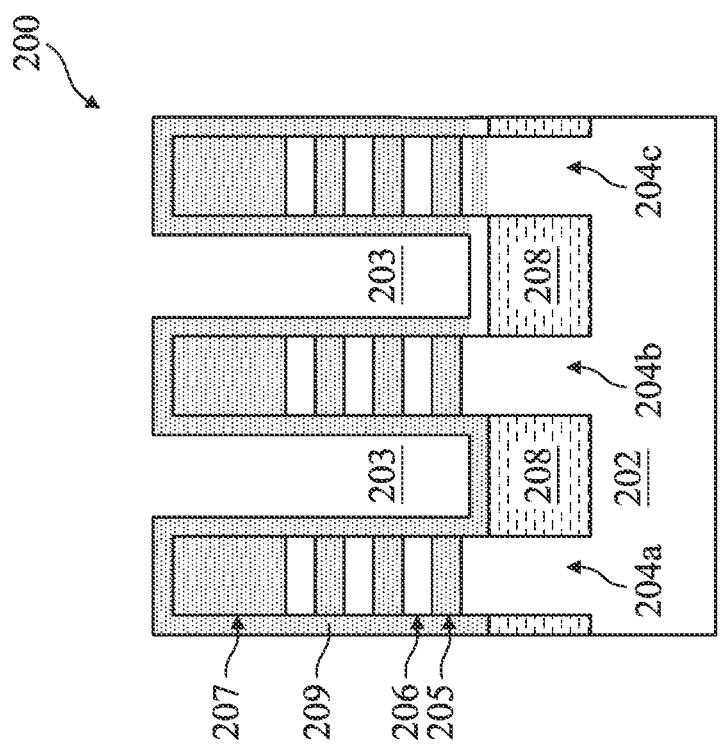

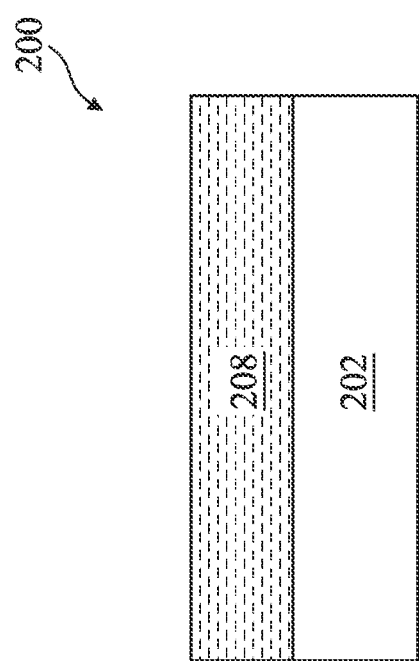

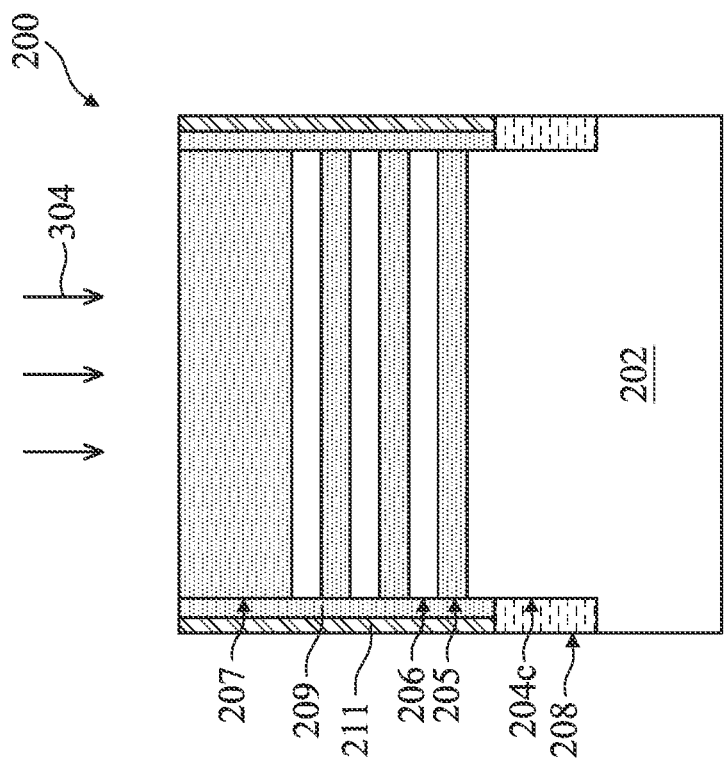
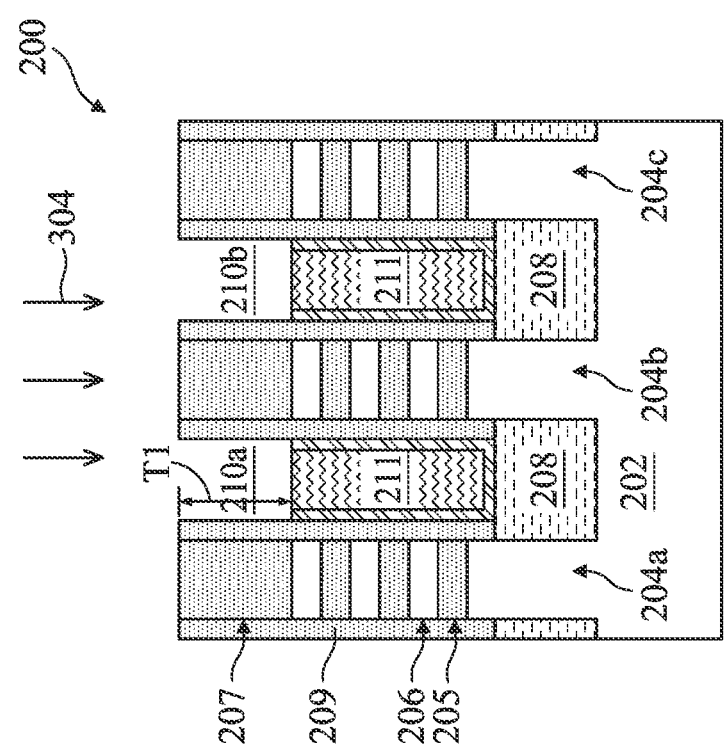
FIG. 7A
FIG. 7B

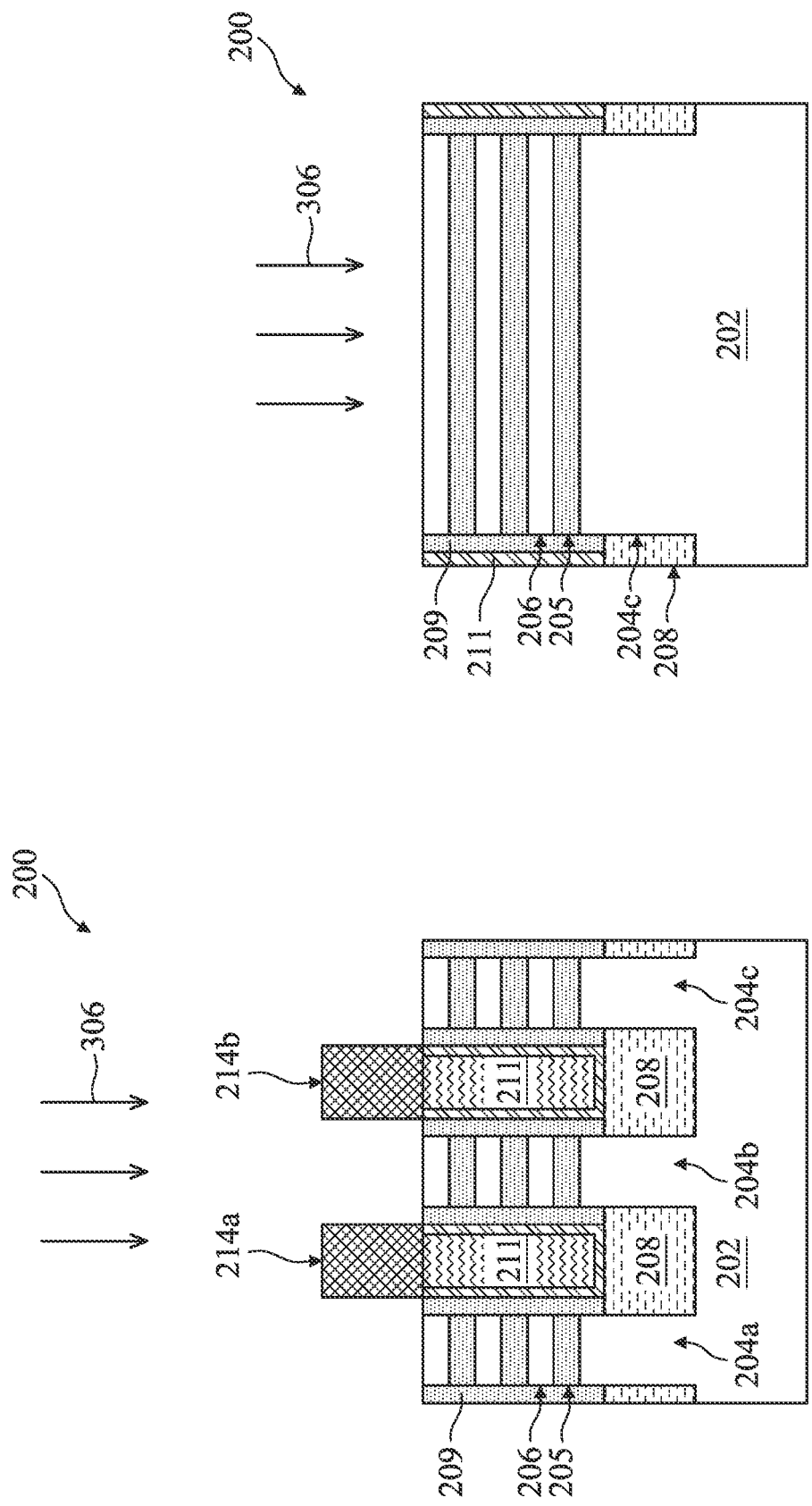

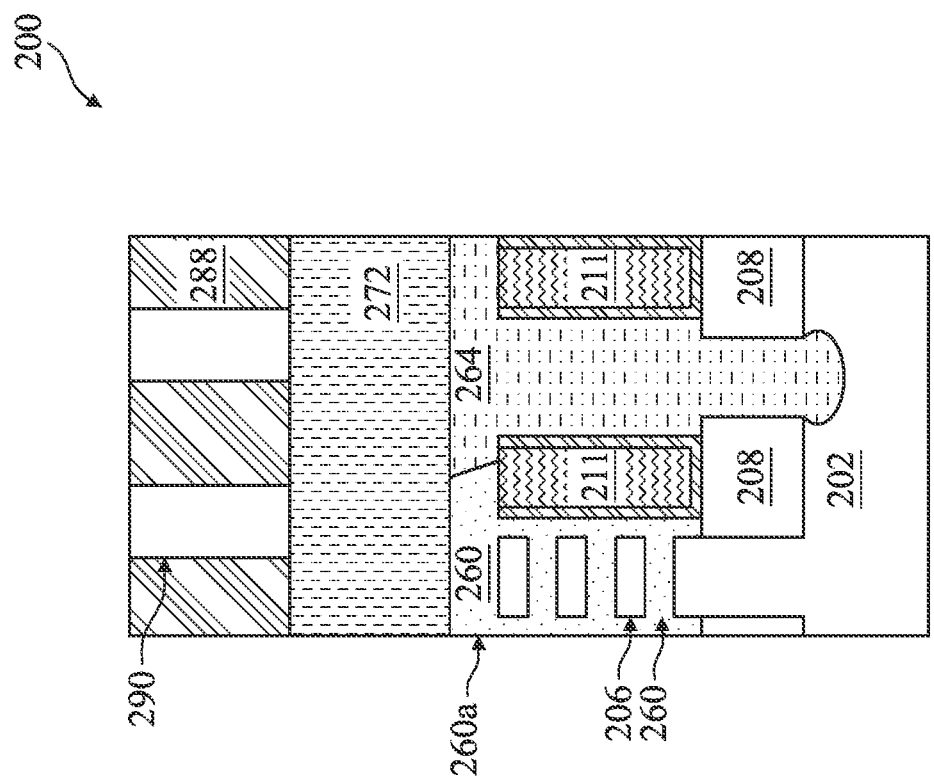
FIG. 22B-I

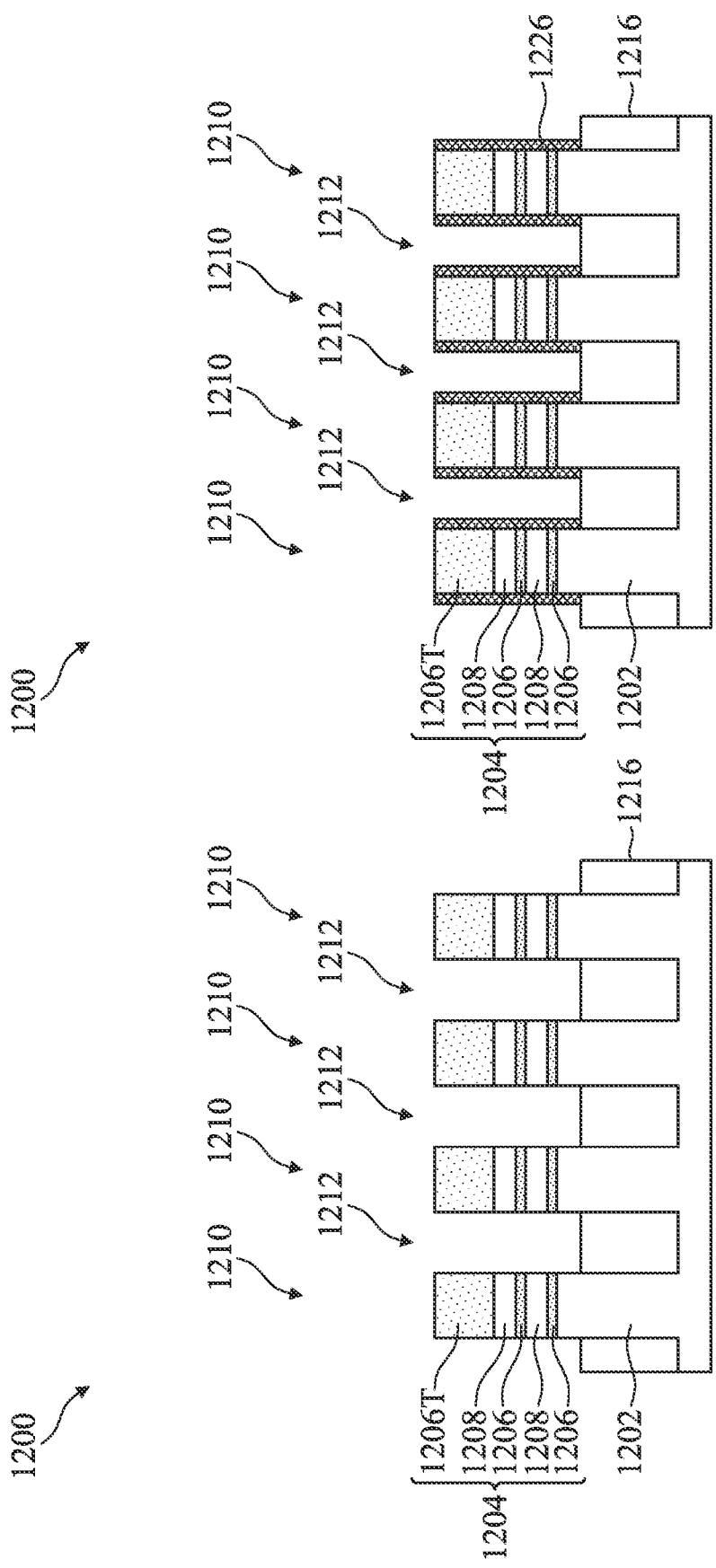

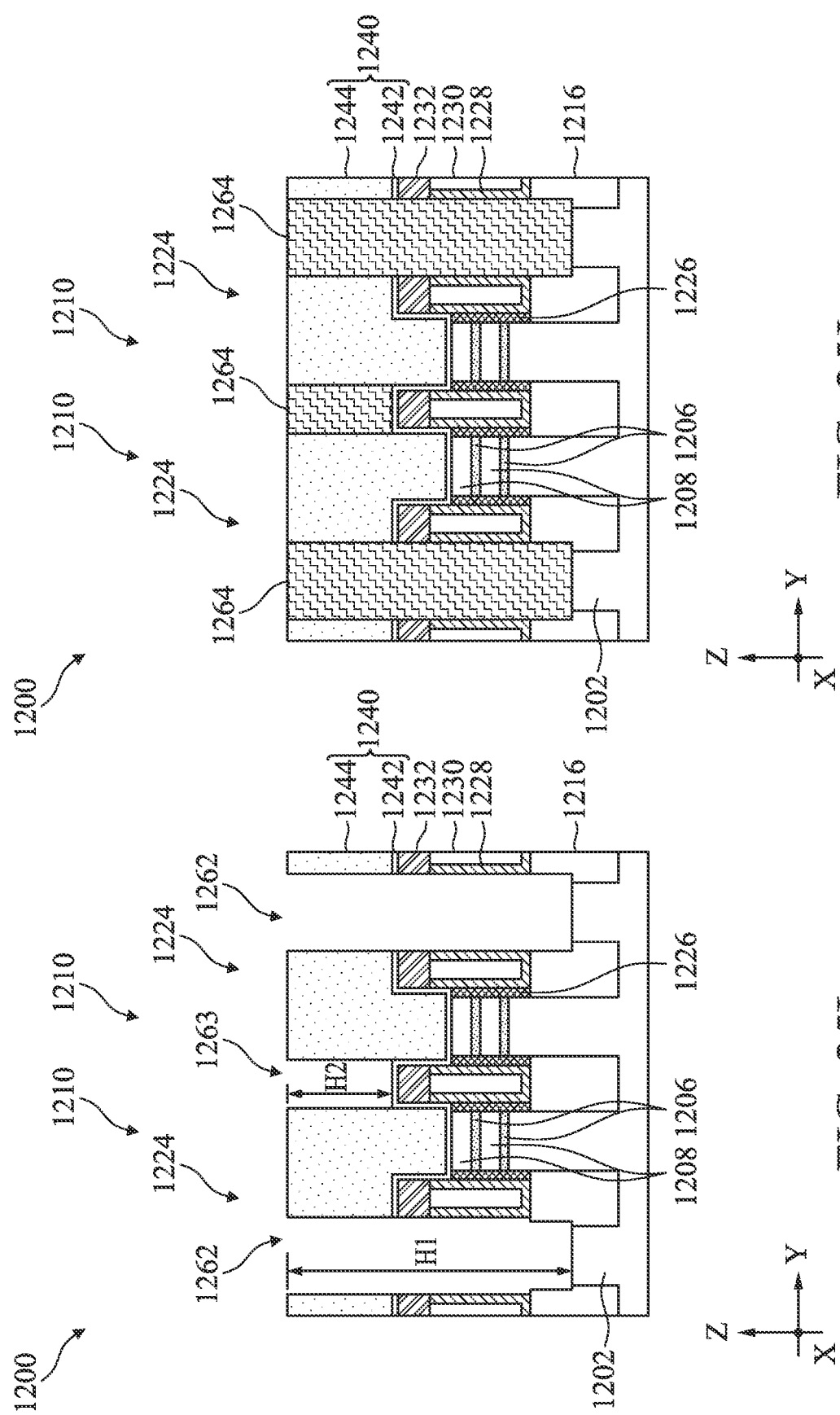

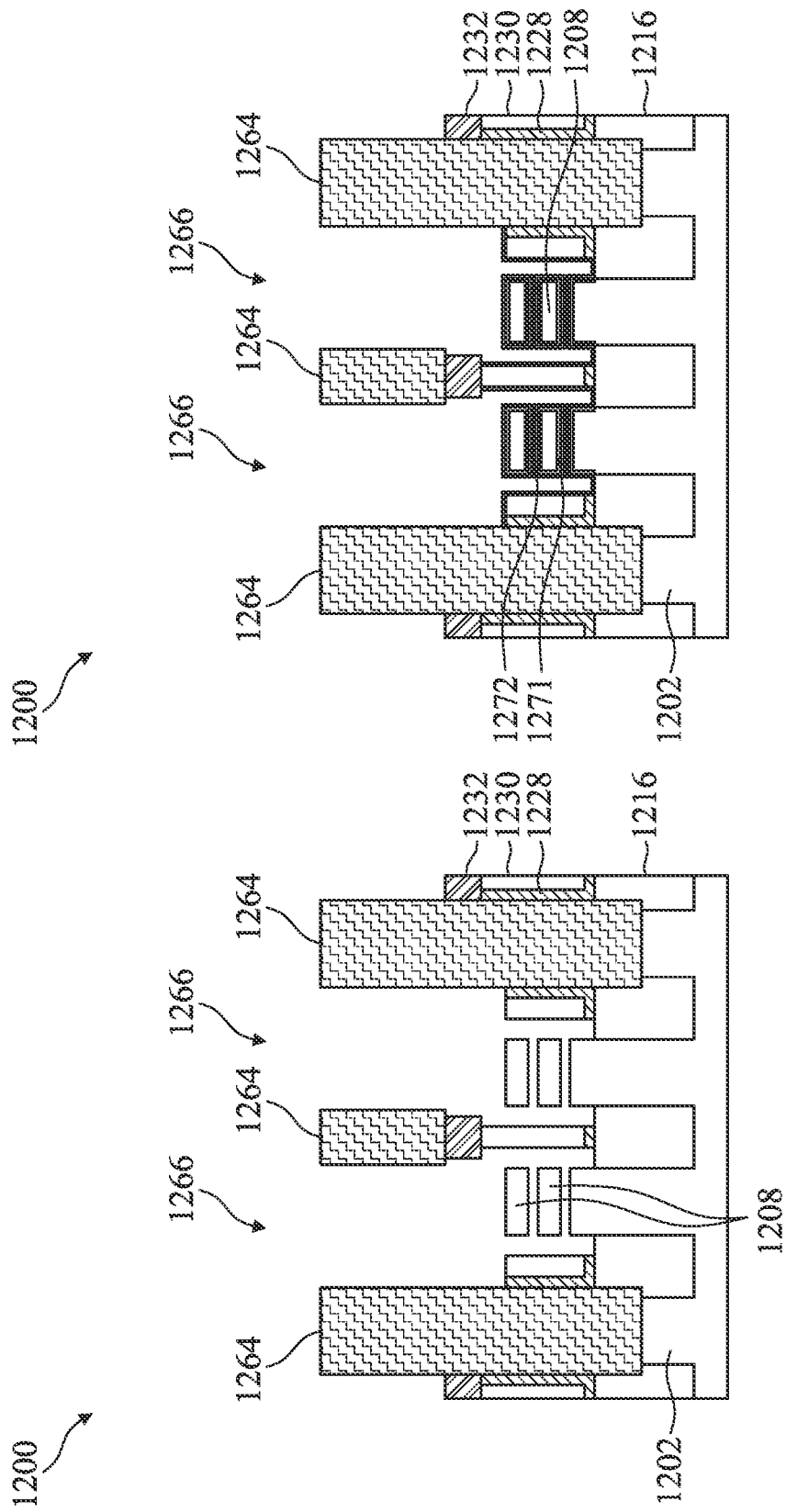

GATE ISOLATION FEATURES IN SEMICONDUCTOR DEVICES AND METHODS OF FABRICATING THE SAME

PRIORITY

This application claims priority to the U.S. Provisional Application Ser. No. 63/211,756, filed Jun. 17, 2021 and titled "Gate Isolation Features in Semiconductor Devices and Methods of Forming the Same," the entire disclosure of which is incorporated herein by reference. This application further claims priority to U.S. Provisional Patent Application No. 63/211,714, filed on Jun. 17, 2021, entitled "Semiconductor Device with Gate Cut Feature and Method for Forming the Same", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

Existing semiconductor fabrication methods, such as cut-poly-gate (CPO) and cut-metal-gate (CMG) processes, are generally adequate for providing isolation features between metal gate structures (MGs). However, they are not entirely satisfactory in all aspects. For example, a self-aligned CPO (SACPO) process may lead to insufficient M0 metal track (or conductive line) placement. A CMG process generally includes etching to form a cut trench in the MG and subsequently filling the cut trench with a dielectric material for isolation. In some instances, the CMG process may suffer from overlay (OVL) errors during the photolithography process, leading to inaccurate cutting results. Further inaccuracies may occur when simultaneously processing gates having different sized critical dimensions. For at least these reasons, improvements in structures and methods of forming metal gate isolation features are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A is a three-dimensional perspective view of a portion of an example semiconductor structure according to various embodiments of the present disclosure.

FIG. 2B is a planar top view of the semiconductor structure as shown in FIG. 2A according to various embodiments of the present disclosure.

FIGS. 3A, 4A, 5A, 6A, 7A, 8A, 9A, 10A, 11A, 12A, 13A, 13A-1, 13A-2, 14A, 15A, 16A, 17A, 18A, 19A, 20A, 21A, 21B, and 22A are cross-sectional views of the semiconductor structure taken along line AA' as shown in FIGS. 2A, 2B, and/or 13A during intermediate stages of the method shown in FIGS. 1A and/or 1B according to various embodiments of the present disclosure.

FIGS. 3B, 4B, 5B, 6B, 7B, 8B, 9B, 10B, 11B, 12B, 13B, 14B, 15B, 16B, 17B, 18B, 19B, and 20B are cross-sectional views of the semiconductor structure taken along line BB' as shown in FIGS. 2A, 2B, and/or 13A and corresponding to FIGS. 3A, 4A, 5A, 6A, 7A, 8A, 9A, 10A, 11A, 12A, 13A, 14A, 15A, 16A, 17A, 18A, 19A, and 20A, respectively, during intermediate stages of the method shown in FIGS. 1A and/or 1B according to various embodiments of the present disclosure.

FIGS. 3C, 4C, 5C, 6C, 7C, 8C, 9C, 10C, 11C, and 12C are cross-sectional views of the semiconductor structure taken along line CC' as shown in FIGS. 2A and/or 2B and corresponding to FIGS. 3A, 4A, 5A, 6A, 7A, 8A, 9A, 10A, 11A, and 12A, respectively, during intermediate stages of the method shown in FIGS. 1A and/or 1B according to various embodiments of the present disclosure.

FIGS. 22A, 22B, 23A, and 23B are planar top views of an example semiconductor structure according to various embodiments of the present disclosure.

FIG. 22B-I is a cross-sectional view of the semiconductor structure taken along line I-I as shown in FIG. 22B.

FIGS. 25A, 25B, 25C, 25D, 25E, 25F, 25G, 25H, 25I, 25J, 25K, 25L, 25M, 25N, 25O, and 25P are fragmentary cross-sectional views in a channel region of a workpiece during a fabrication process according to the method of FIG. 24, according to one or more aspects of the present disclosure.

DETAILED DESCRIPTION

Figure 1A:
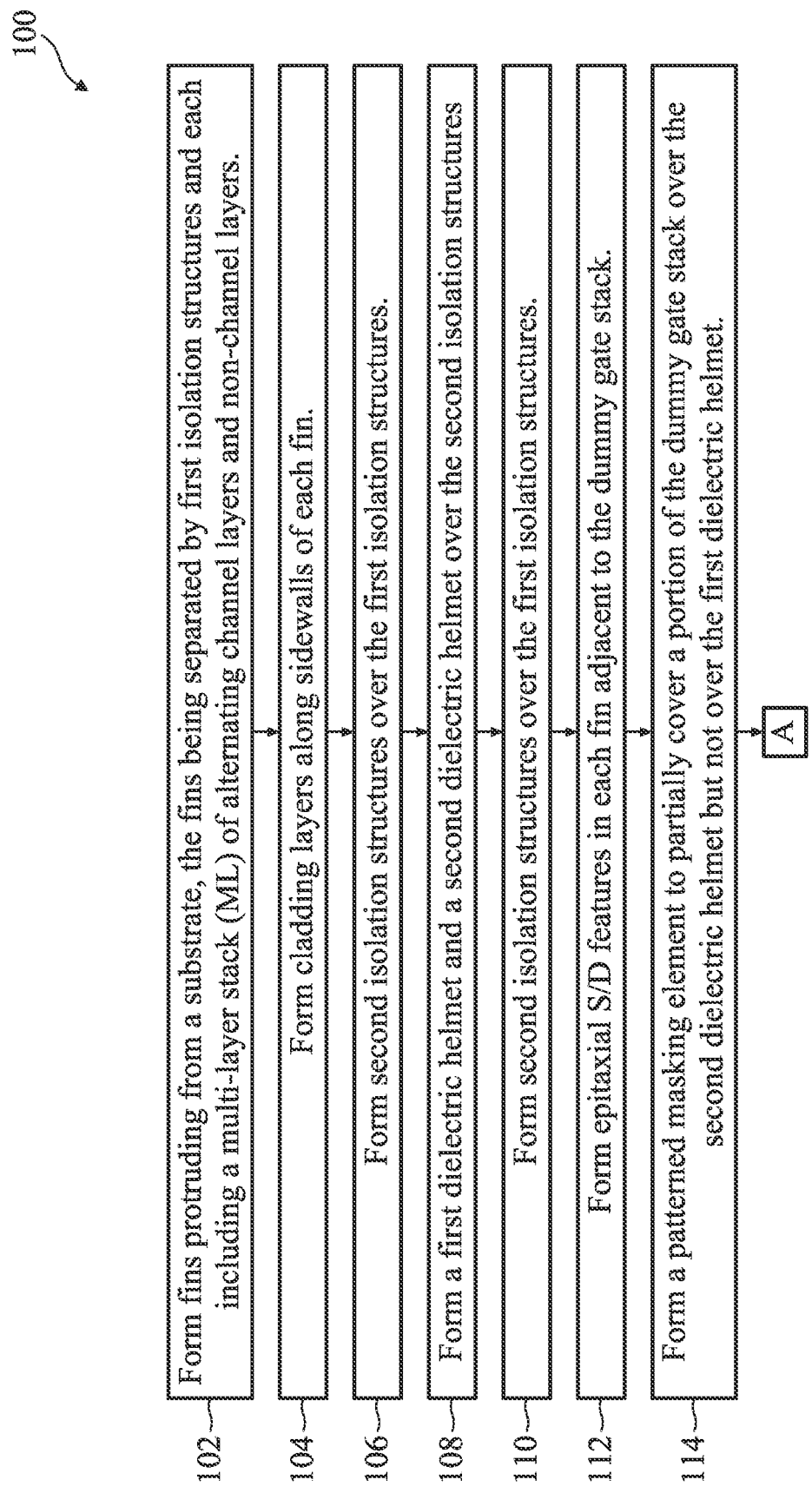
FIGS. 1A and 1B illustrate a flowchart of an example method for fabricating a semiconductor structure according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional nanostructure (NS) FETs (alternatively referred to as gate-all-around, or GAA, FETs and multi-bridge-channel (MBC) transistors). These semiconductor devices may be used in memory and/or standard logic cells of an integrated circuit (IC) structure. Generally, an NS FET includes a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications.

MBC transistors (alternatively GAA, NS FETs, etc.) may include short channel devices and long channel devices. As the names suggest, short channel devices have a shorter channel region than long channel devices. In some instances, the channel regions of short channel devices may be significantly smaller than the channel regions of long channel devices. The difference in size of the channel regions introduces difficulties in processing both regions simultaneously. For example, after forming a metal gate stack over the channel regions a metal gate etch back process may be performed to recess the metal gate stack. The metal gate etch back process has a processing window defined by the height of the metal gate stack, the height of isolation features, and the width of the channel region. Due to the difference in channel sizes, specifically the smaller amount of exposed area in the short channel devices, the etching rates of the short channel devices and the long channel devices are not the same. Methods disclosed herein, including the use of higher isolation features, increase the processing window of the metal gate etch process providing better control of the process and reducing failures in the process. The present disclosure includes multiple embodiments. Different embodiments may have different advantages, and no particular advantage is necessarily required of any embodiment.

Figure 1B:
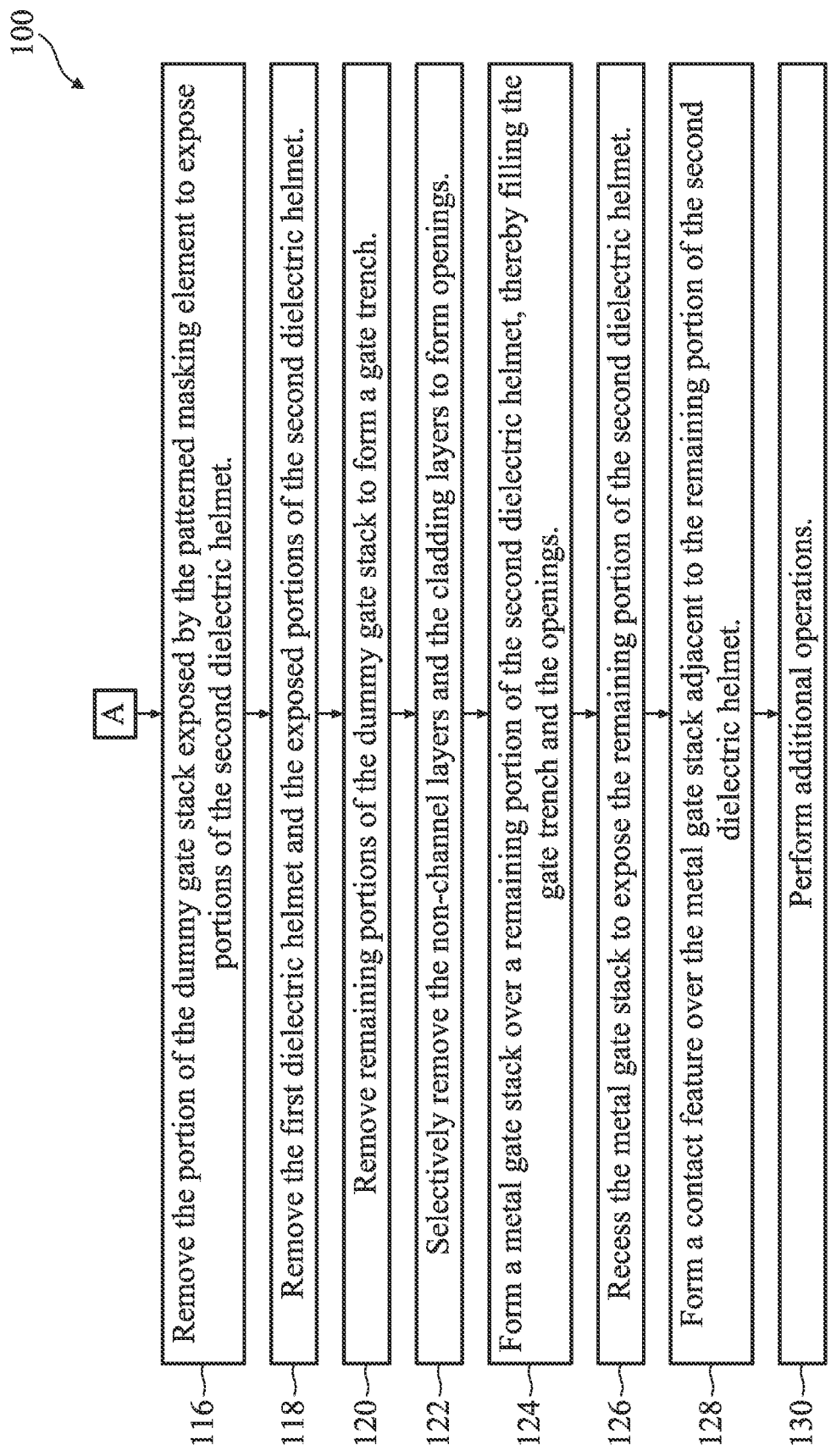
Figure 3C:
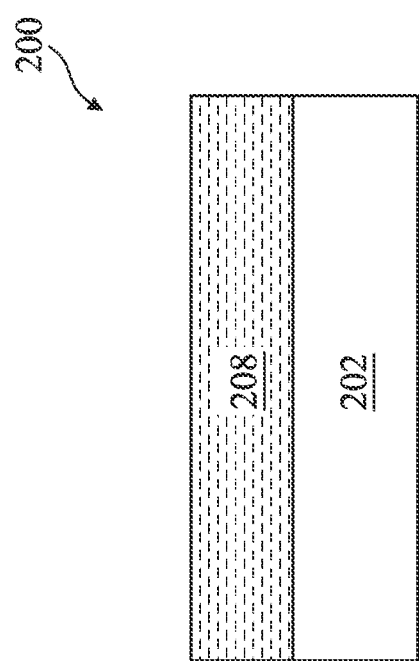
Figure 4C:
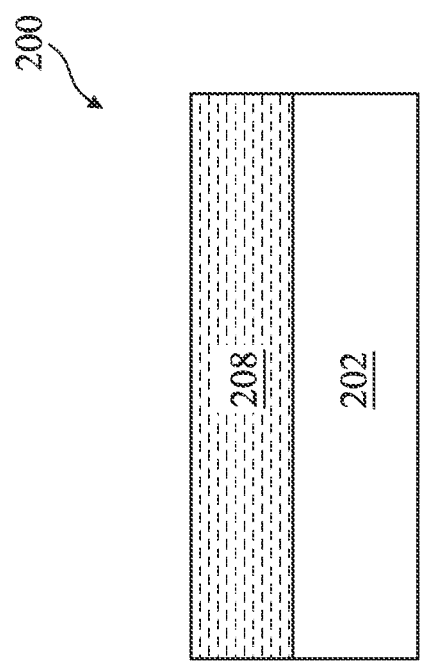

Referring now to FIGS. 1A and 1B collectively, a flowchart of a method 100 of forming a semiconductor structure 200 (hereafter simply referred to as the structure 200) is illustrated according to various aspects of the present disclosure. Method 100 is merely an example and is not intended to limit the present disclosure beyond what is explicitly recited in the claims. Additional operations can be provided before, during, and after method 100, and some operations described can be replaced, eliminated, or moved around for additional embodiments of the method. Method 100 is described below in conjunction with FIGS. 3A-23B, which are various cross-sectional and top planar views of the structure 200 at intermediate steps of method 100.

According to some embodiments of the present disclosure, FIG. 2A is a three-dimensional perspective view of the structure 200, or a portion thereof; FIG. 2B is a planar top view of the structure 200, or a portion thereof, as shown in FIG. 2A; FIGS. 3A, 4A, 5A, 6A, 7A, 8A, 9A, 10A, 11A, and 12A are cross-sectional views of the structure 200, or a portion thereof, taken along line AA' as shown in FIGS. 2A and/or 2B; FIGS. 3B, 4B, 5B, 6B, 7B, 8B, 10B, 11B, and 12B are cross-sectional views of the structure 200, or a portion thereof, taken along line BB' as shown in FIGS. 2A and/or 2B; FIGS. 3C, 4C, 5C, 6C, 7C, 8C, 10C, 11C, and 12C are cross-sectional views of the structure 200, or a portion thereof, taken along line CC' as shown in FIGS. 2A and/or 2B; FIG. 13C is a planar top view of the structure 200, or a portion thereof; FIGS. 13A, 14A, 15A, 16A, 17A 18A, 19A, 20A, 21A, and 21B are cross-sectional views of the structure 200, or a portion thereof, taken along line AA' of FIG. 13C; FIGS. 13B, 14B, 15B, 16B, 17B, 18B, 19B, and 20B are cross-sectional views of the structure 200, or a portion thereof, taken along line BB' of FIG. 13C; FIGS. 13D, 14C, 15C, 16C, 17C, 18C, 19C, and 20C are cross-sectional views of the structure 200, or a portion thereof, taken along line DD' of FIG. 13C; FIGS. 13E, 14D, 15D, 16D, 17D, 18D, 19D, and 20D are cross-sectional views of the structure 200, or a portion thereof, taken along line EE' of FIG. 13C; and FIGS. 22-23B are planar top views of the structure 200, or a portion thereof.

The structure 200 may be an intermediate device fabricated during processing of an IC, or a portion thereof, that may comprise standard logic circuits and/or static random-access memory (SRAM) circuits, passive components such as resistors, capacitors, and inductors, and active components such as NS FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. In the present embodiments, the structure 200 includes one or more NS FETs. The present disclosure is not limited to any particular number of devices or device regions, or to any particular device configurations. Additional features can be added to the structure 200, and some of the features described below can be replaced, modified, or eliminated in other embodiments of the structure 200.

At operation 102, referring to FIGS. 1A and 2A-3C, method 100 forms the structure 200 that includes multiple active three-dimensional device regions (hereafter referred to as fins) 204a, 204b, and 204c protruding from a semiconductor substrate (hereafter referred to as the substrate) 202, where the fins 204a-204c are separated by isolation features 208.

The substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing.

In the present embodiments, referring to FIGS. 2A, 3A, and 3B, each fin 204a-204c includes a multi-layer structure (ML) of alternating non-channel layers (or sacrificial layers) 205 and channel layers 206 stacked vertically over protruding portions of the substrate 202, as well as a hard mask layer 207 over the ML. In the present embodiments, the non-channel layers 205 are sacrificial layers configured to be removed at a subsequent processing step, thereby providing openings between the channel layers 206 for forming metal gate structures therein. Each channel layer 206 may include a semiconductor material such as, for example, Si, Ge, SiC, SiGe, GeSn, SiGeSn, SiGeCSn, other suitable semiconductor materials, or combinations thereof, while each non-channel layer 205 has a composition different from that of the channel layer 206. In one such example, the channel layer 206 may include elemental Si and the non-channel layer 205 may include SiGe. In another example, the channel layer 206 may include elemental Si and the non-channel layer 205 may include elemental Ge. In some examples, each fin 204a-204c may include a total of three to ten pairs of alternating non-channel layers 205 and channel layers 206. Other configurations may also be applicable depending upon specific design requirements.

In the present embodiments, the hard mask layer 207 is also a sacrificial layer configured to facilitate the formation of a dielectric helmet and subsequently be removed from the structure 200. As such, the thickness T1 of the hard mask layer 207 is adjusted based on the desired thickness of the gate isolation feature. In some embodiments, the thickness T1 is greater than a thickness of the non-channel layers 205 and the channel layers 206. The hard mask layer 207 may include any suitable material, such as a semiconductor material, so long as its composition is distinct from that of the gate isolation feature and the channel layer 206 disposed thereunder to allow selective removal by an etching process. In some embodiments, the hard mask layer 207 has a composition similar to or the same as that of the non-channel layers 205 and includes, for example, SiGe.

In the present embodiments, forming the ML includes alternatingly growing the non-channel layers 205 and the channel layers 206 in a series of epitaxy processes. The epitaxy processes may be implemented by chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors containing a suitable material (e.g., Ge for the non-channel layers 205), which interact with the composition of the underlying substrate, e.g., the substrate 202. In some examples, the non-channel layers 205 and the channel layers 206 may be formed into nanosheets, nanowires, or nanorods. A sheet (or wire) release process may then be implemented to remove the non-channel layers 205 to form openings between the channel layers 206, and a metal gate structure is subsequently formed in the openings, thereby providing an NS FET. For embodiments in which the hard mask layer 207 has the same composition as the non-channel layers 205, the hard mask layer 207 may also be grown by a similar epitaxy process as discussed herein.

In the present embodiments, the fins 204a-204c are fabricated from the ML (and the hard mask layer 207 disposed thereover) using a series of photolithography and etching processes. For example, the photolithography process may include forming a photoresist layer overlying the ML, exposing the photoresist layer to a pattern, performing post-exposure bake processes, and developing the exposed photoresist layer to form a patterned masking element (not depicted). The ML is then etched using the patterned masking element as an etch mask, thereby leaving three-dimensional fins 204a-204c protruding from the substrate 202. The etching process may include dry etching, wet etching, reactive ion etching (RIE), other suitable processes, or combinations thereof. The patterned masking element is subsequently removed from the ML using any suitable process, such as ashing and/or resist stripping.

The isolation features 208 may include silicon oxide (SiO and/or $SiO_2$), tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. The isolation features 208 may include shallow trench isolation (STI) features. In one embodiment, the isolation features 208 are formed by filling trenches that separate the fins 204a-204c with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and selectively etched back to form the isolation features 208. The isolation features 208 may include a single-layer structure or a multi-layer structure. As depicted herein, the fins 204a-204c are separated by trenches 203, whose bottom surfaces are defined by the isolation features 208.

At operation 104, referring to FIGS. 1A, 2A, 2B, and 4A-5C, method 100 forms a cladding layer 209 over the fins 204a-204c and the isolation features 208. In the present embodiments, the cladding layer 209 and the non-channel layers 205 are sacrificial layers configured to be replaced with a metal gate structure in a channel region of the fin 204a-204c. In some embodiments, the cladding layer 209 has a composition substantially the same as that of the non-channel layers 205, such that they may be selectively removed by a common etching process. In the present embodiments, the cladding layer 209 includes SiGe. In some embodiments, the cladding layer 209 is deposited epitaxially by a suitable method discussed above with respect to forming the ML. In some embodiments, referring to FIGS. 4A and 4B, the cladding layer 209 is deposited conformally, rather than grown epitaxially, over surfaces of the structure 200 as an amorphous layer, such that the cladding layer 209 is also formed over the isolation features 208.

Figure 5A:
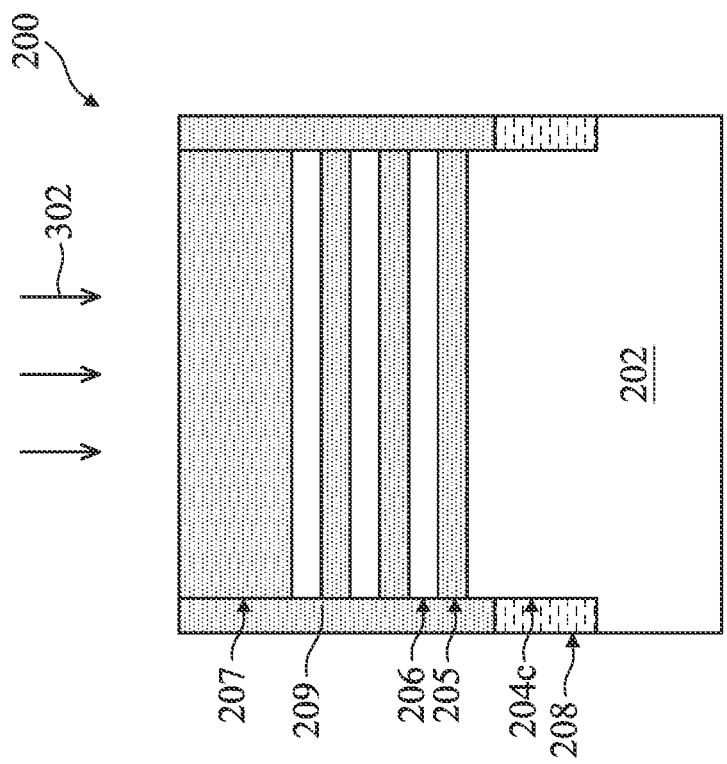
Figure 5B:
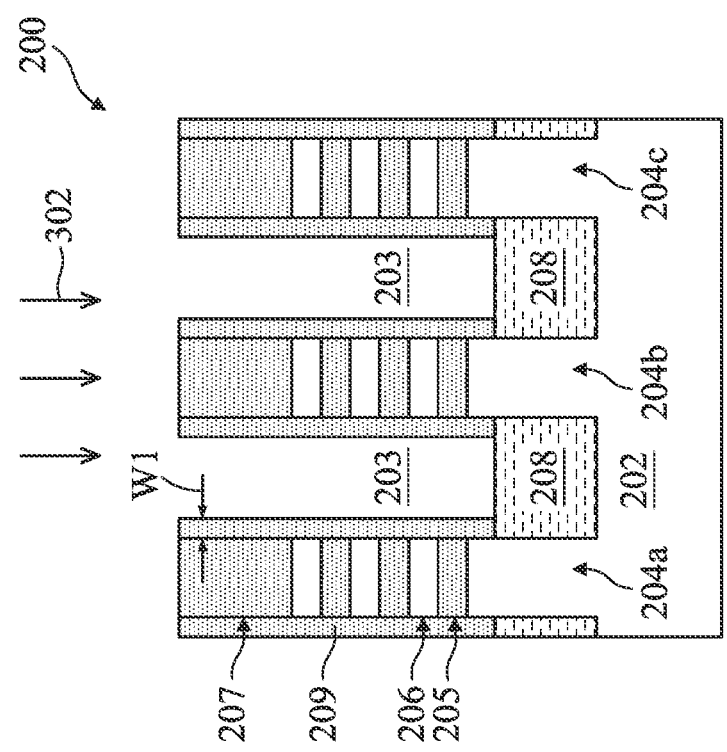
Figure 6A:
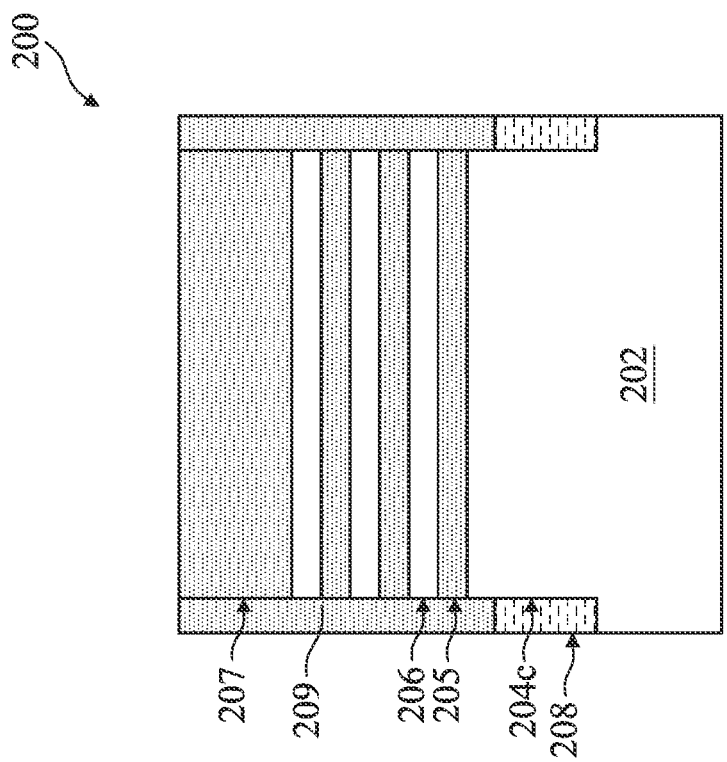
Figure 6B:
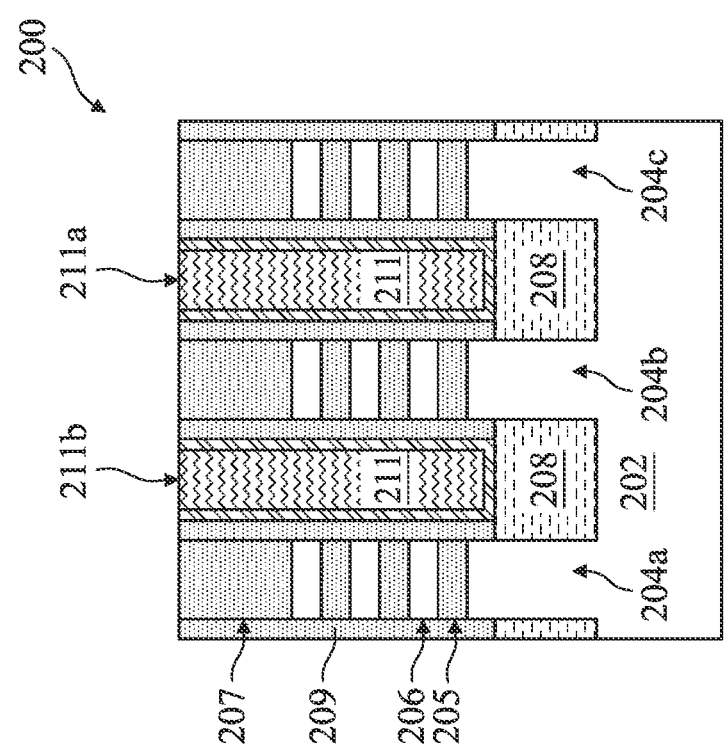
Figure 6C:
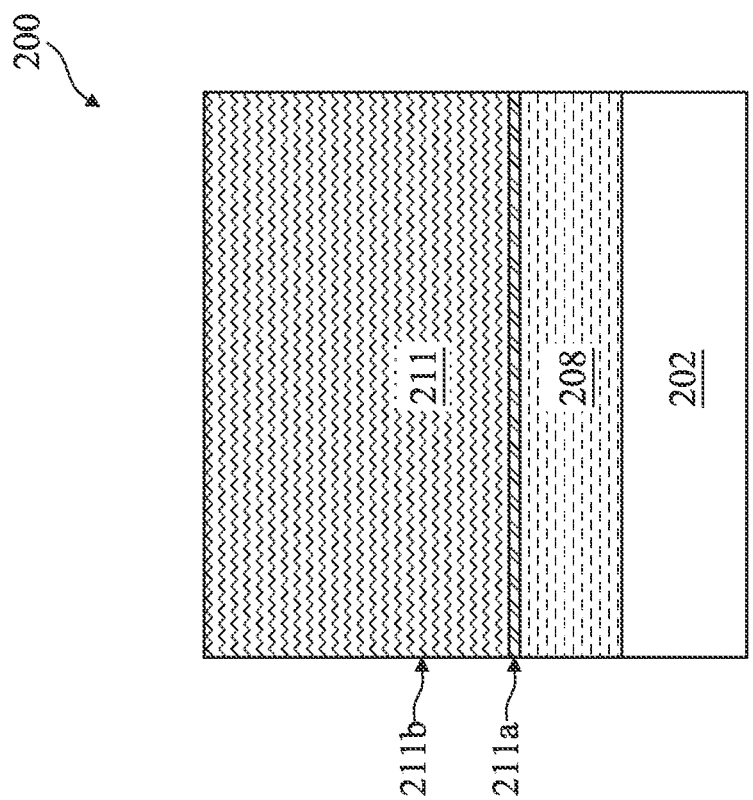

Subsequently, referring to FIGS. 5A-5C, method 100 performs an etching process 302 to selectively remove portions of the cladding layer 209, thereby exposing portions of the isolation features 208 and a top surface of the hard mask layer 207. Accordingly, portions of the cladding layer 209 remain along sidewall surfaces of the fins 204a-204c after performing the etching process 302. The etching process 302 may include a dry etching process, a wet etching process, an RIE process, or combinations thereof. The etching process 302 may be a directional etching process that selectively removes horizontal portions of the cladding layer 209 without removing, or substantially removing, the isolation features 208 or vertical portions of the cladding layer 209. In the present embodiments, the cladding layer 209 is defined by a width W1. In one example, the with W1 may be about 13 nm, though the present embodiments are not limited as such. It is noted that FIGS. 3C, 4C, 5C, 6C, 7C, 8C, 10C, 11C, 12C, 13C, 14C, 15C, 16C, 17C, 18C, and 19C are cross-sectional views of the structure 200 taken along line CC', which is through the trenches 203 between portions of the cladding layer 209, as shown in FIGS. 2A and/or 2B.

At operation 106, referring to FIGS. 1A and 6A-6C, method 100 forms isolation structures 211 over the structure 200, thereby completely filling the trenches 203. The isolation structures 211 is configured to isolate adjacent fins 204a-204c and to provide a substrate over which additional isolation features (e.g., dielectric helmets 214a and 214b discussed in detail below) may be formed before forming dummy gate stacks. The isolation structures 211 may include any suitable material, such as such as SiO and/or $SiO_2$, silicon nitride (SiN), silicon carbide (SiC), oxygen-containing silicon nitride (SiON), oxygen-containing silicon carbide (SiOC), carbon-containing silicon nitride (SiCN), FSG, a low-k dielectric material, other suitable materials, or combinations thereof. In some embodiments, the isolation structures 211 has a composition similar to or the same as that of the isolation features 208. The isolation structures 211 may include a single-layer structure or a multi-layer structure as depicted herein, where the isolation structures 211 include a sub-layer 211b disposed over a sub-layer 211a. The isolation structures 211 (or each sub-layer thereof) may be deposited by any suitable method, such as CVD, FCVD, SOG, other suitable methods, or combinations thereof, and subsequently planarized by one or more CMP processes to expose a top surface of the hard mask layer 207. As depicted herein, the isolation structures 211 are separated from each sidewall of the fins 204a-204c by the cladding layer 209.

Figure 7C:
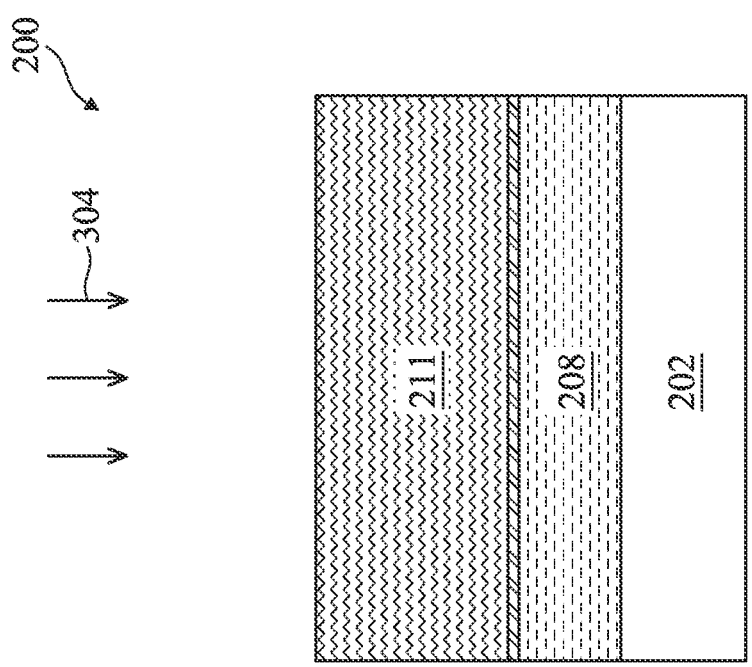
Figure 8B:
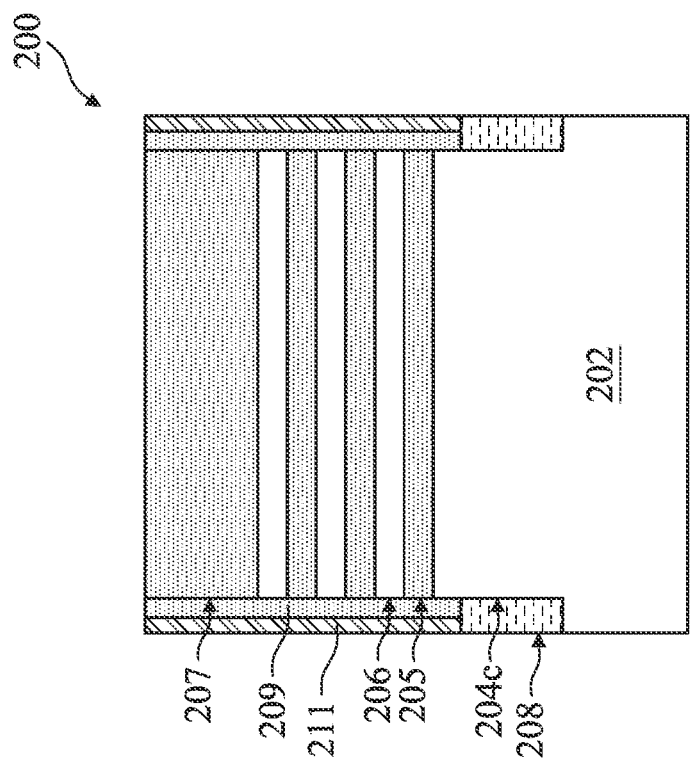
Figure 8A:
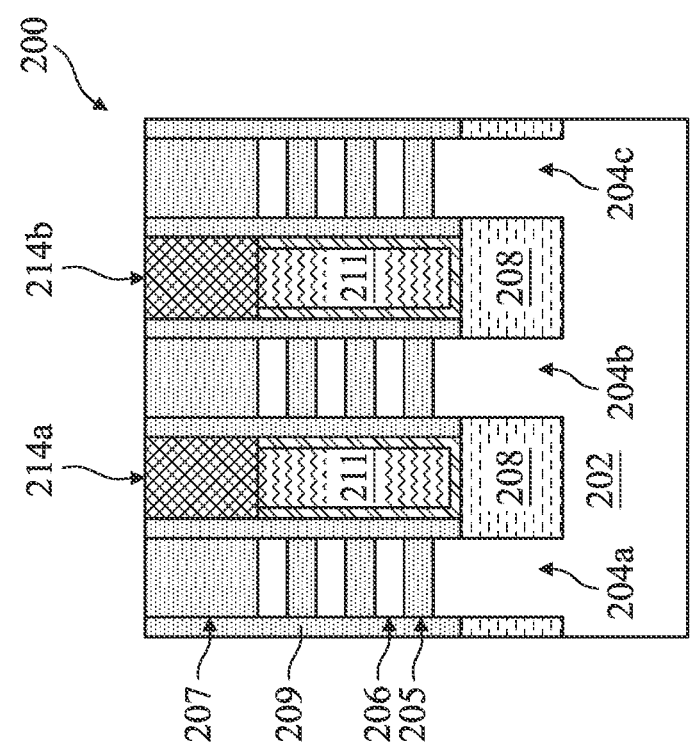
Figure 8C:
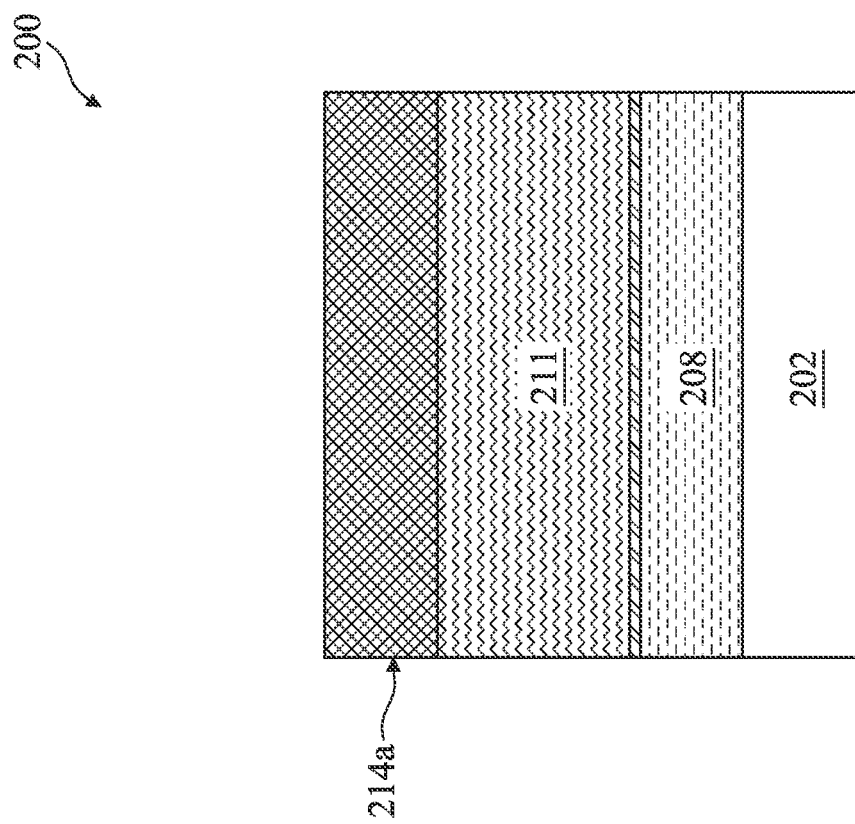

Subsequently, referring to FIGS. 7A-7C, method 100 recesses a top portion of the isolation structures 211 in an etching process 304, such that a top surface of the recessed isolation structures 211 is substantially co-planar with the topmost channel layer 206. In other words, the resulting trench 210a (between the fins 204a and 204b) and trench 210b (between the fins 204b and 204c) formed over the recessed isolation structures 211 each have a depth corresponding to the thickness T1. The etching process 304 may include any suitable process, such as a dry etching process, a wet etching process, an RIE process, other suitable processes, or combinations thereof.

At operation 108, referring to FIGS. 1A and 8A-8C, method 100 forms dielectric helmets 214a and 214b in the trenches 210a and 210b, respectively, thereby filling the space between the fins 204a-204c. In some embodiments, one or both of the dielectric helmets 214a and 214b are configured to provide isolation for a subsequently-formed metal gate structure over the fins 204a-204c. In other words, one or both of the dielectric helmets 214a and 214b are configured to truncate a metal gate structure into multiple portions. If only one of the dielectric helmets 214a and 214b (e.g., the dielectric helmet 214a, or a portion thereof) remains in the structure 200 to provide isolation for the metal gate structure, as is the case in the depicted embodiments, the other one of the dielectric helmets 214a and 214b (e.g., the dielectric helmet 214b) is completely removed (by etching, for example) before forming the metal gate structure. The remaining portion(s) of the dielectric helmet is referred to as a gate isolation feature (or a gate cut feature) that is self-aligned with the underlying isolation structures 211 and between adjacent fins 204a-204c. In the present embodiments, the dielectric helmets 214a and 214b are formed to have the same structure and composition. Furthermore, the dielectric helmets 214a and 214b are oriented lengthwise parallel to the lengthwise direction of the fins 204a-204c and are separated from the sidewalls of the fins 204a-204c by portions of the cladding layer 209.

The dielectric helmets 214a and 214b may each include SiN, SiC, SiON, SiOC, SiCN, $Al_2O_3$, SiO and/or $SiO_2$, a high-k dielectric material (having a k value greater than that of silicon oxide, which is about 3.9), other suitable materials, or combinations thereof. The high-k dielectric material may include oxygen, lanthanum, aluminum, titanium, zirconium, tantalum, other suitable materials, or combinations thereof. For example, the high-k dielectric material may include hafnium oxide ($HfO_2$), lanthanum oxide ($La_2O_3$), other high-k oxide materials, or combinations thereof. In some embodiments, the dielectric helmets 214a and 214b include a high-k dielectric material suitable for protecting the underlying components from being inadvertently damaged (as a hard mask layer, for example) during subsequent operations. In some embodiments, the dielectric helmets 214a and 214b each include a single-layer structure or a multi-layer structure.

Figure 9C:
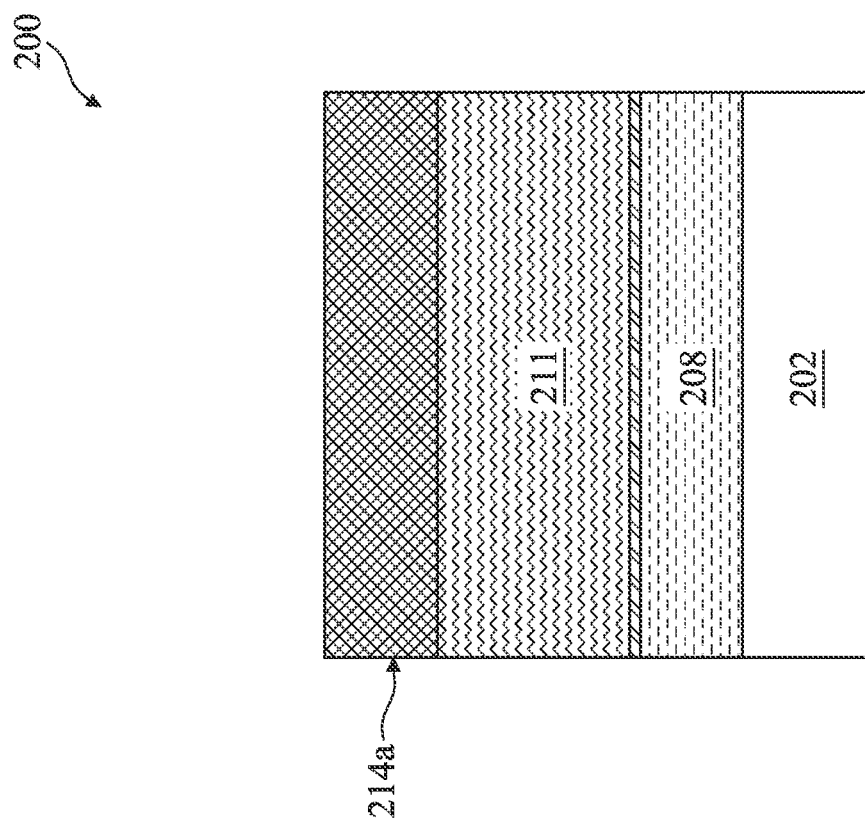

Subsequently, referring to FIGS. 9A-9C, method 100 removes the hard mask layer 207 from the structure 200 in an etching process 306, thereby exposing the topmost channel layer 206 of the ML. As such, the dielectric helmets 214a and 214b protrude from top surfaces of the fins 204a-204c. In the present embodiments, the etching process 306 selectively removes the hard mask layer 207 without removing, or substantially removing, the surrounding components such as the dielectric helmet 214a/214b or the topmost channel layer 206 of the ML.

At operation 110, referring to FIGS. 1A and 10A-10C, method 100 forms dummy (or placeholder) gate stacks 220 over channel regions of the fins 204a-204c. In the present embodiments, one or more of the dummy gate stacks 220 are formed over portions of the dielectric helmets 214a and 214b. Each dummy gate stack 220 may include a dummy gate electrode (not depicted separately) disposed over an optional dummy gate dielectric layer and/or an interfacial layer. In the present embodiments, at least portions of each dummy gate stack 220 are to be replaced with the metal gate structure, which is separated (or cut) by at least a portion of the dielectric helmets 214a and/or 214b.

The dummy gate stacks 220 may be formed by a series of deposition and patterning processes. For example, the dummy gate stacks 220 may be formed by depositing a polysilicon (poly-Si) layer over the fins 204a-204c separated by the dielectric helmets 214a and 214b, and subsequently patterning the poly-Si layer via a series of photolithography and etching processes (e.g., an anisotropic dry etching process). To accommodate the patterning process and protect the dummy gate stacks 220 during subsequent fabrication processes, one or more hard mask layers (not depicted) may be formed over the dummy gate stacks 220.

The structure 200 further includes top gate spacers 222a disposed on sidewalls of the dummy gate stacks 220. The top gate spacers 222a may be a single-layer structure or a multi-layer structure and may include silicon oxide, SiN, SiC, SiON, SiOC, SiCN, air, a low-k dielectric material, a high-k dielectric material (e.g., hafnium oxide ($HfO_2$), lanthanum oxide ($La_2O_3$), etc.), other suitable materials, or combinations thereof. Each spacer layer of the top gate spacers 222a may be formed by first depositing a dielectric layer over the dummy gate stacks 220 via a suitable deposition method (e.g., CVD and/or ALD) and subsequently removing portions of the dielectric layer in an anisotropic (e.g., directional) etching process (e.g., a dry etching process), leaving the top gate spacers 222a on the sidewalls of the dummy gate stacks 220.

At operation 112, still referring to FIGS. 1A and 10A-10C, method 100 forms epitaxial S/D features 224 in portions of the fins 204a-204c adjacent to the dummy gate stacks 220. In the present embodiments, forming the epitaxial S/D features 224 includes first forming S/D recesses (not depicted) in the S/D regions of the fins 204a-204c (i.e., the ML), forming inner gate spacers 222b on sidewalls of the non-channel layers 205 that are exposed in the S/D recesses, and forming epitaxial S/D features 224 over the inner gate spacers 222b in the S/D recesses.

In the present embodiments, method 100 implements an etching process that selectively removes portions of the fins 204a-204c in the S/D regions without removing, or substantially removing, the surrounding components that include the dummy gate stacks 220 and the isolation features 208. In some embodiments, the etching process is a dry etching process employing a suitable etchant capable of removing Si (i.e., the channel layers 206) and SiGe (i.e., the non-channel layers 205) of the ML. In some non-limiting examples, the dry etchant may be a chlorine-containing etchant including $Cl_2$, $SiCl_4$, $BCl_3$, other chlorine-containing gas, or combinations thereof. A cleaning process may subsequently be performed to clean the S/D recesses with a hydrofluoric acid (HF) solution or other suitable solution.

Figure 10B:
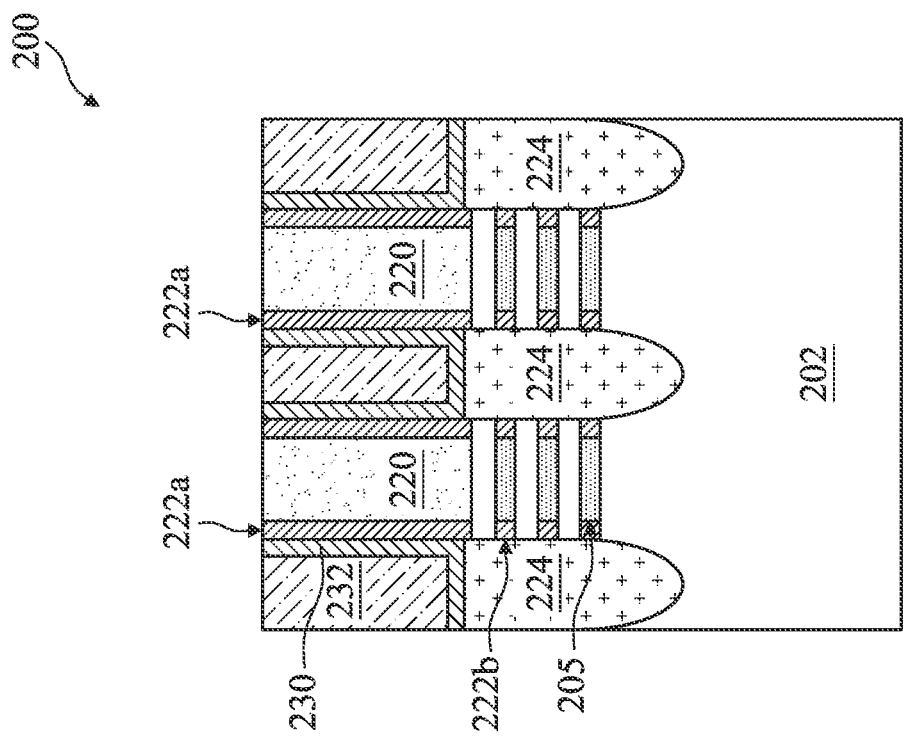

The inner gate spacers 222b may be a single-layer structure or a multi-layer structure and may include silicon oxide, SiN, SiCN, SiOC, SiON, SiOCN, a low-k dielectric material, air, a high-k dielectric material, hafnium oxide ($HfO_2$), lanthanum oxide ($La_2O_3$), other suitable dielectric material, or combination thereof. In some embodiments, the inner gate spacers 222b have a composition different from that of the top gate spacers 222a. Forming the inner gate spacers 222b includes performing a series of etching and deposition processes. For example, forming the inner gate spacers 222b may begin with selectively removing portions of the non-channel layers 205 without removing, or substantially removing, portions of the channel layers 206 to form trenches (not depicted). The non-channel layers 205 may be etched by a dry etching process. Subsequently, one or more dielectric layers are formed in the trenches, followed by one or more etching processes to remove (i.e., etch back) excess dielectric layer(s) deposited on surfaces of the channel layers 206 that are exposed in the S/D recesses, thereby forming the inner gate spacers 222b as depicted in FIG. 10B. The one or more dielectric layers may be deposited by any suitable method, such as ALD, CVD, physical vapor deposition (PVD), other suitable methods, or combinations thereof.

Each of the epitaxial S/D features 224 may be suitable for forming a p-type FET device (i.e., including a p-type epitaxial material) or, alternatively, an n-type FET device (i.e., including an n-type epitaxial material). The p-type epitaxial material may include one or more epitaxial layers of silicon germanium (epi SiGe) each doped with a p-type dopant such as boron, germanium, indium, gallium, other p-type dopants, or combinations thereof. The n-type epitaxial material may include one or more epitaxial layers of silicon (epi Si) or silicon carbon (epi SiC) each doped with an n-type dopant such as arsenic, phosphorus, other n-type dopants, or combinations thereof. In some embodiments, one or more epitaxy growth processes are performed to grow an epitaxial material in each S/D recess and over the inner gate spacers 222b. For example, method 100 may implement an epitaxy growth process similar to that discussed above with respect to forming the ML. In some embodiments, the epitaxial material is doped in-situ by adding a dopant to a source material during the epitaxial growth process. In some embodiments, the epitaxial material is doped by an ion implantation process after performing the deposition process. In some embodiments, an annealing process is subsequently performed to activate the dopants in the epitaxial S/D features 224.

Figure 10A:
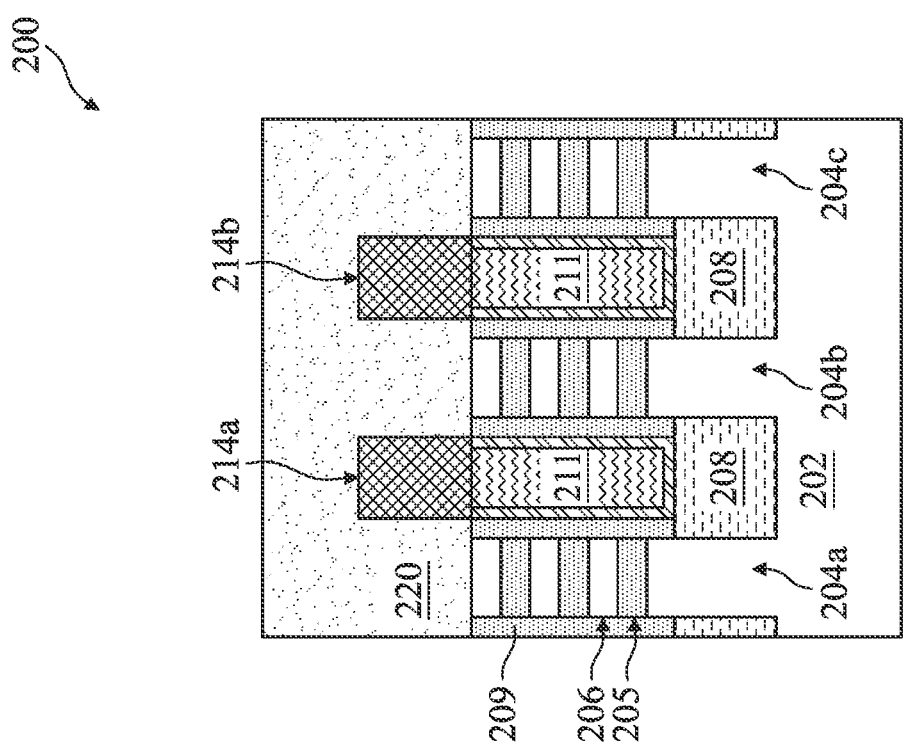
Figure 10C:
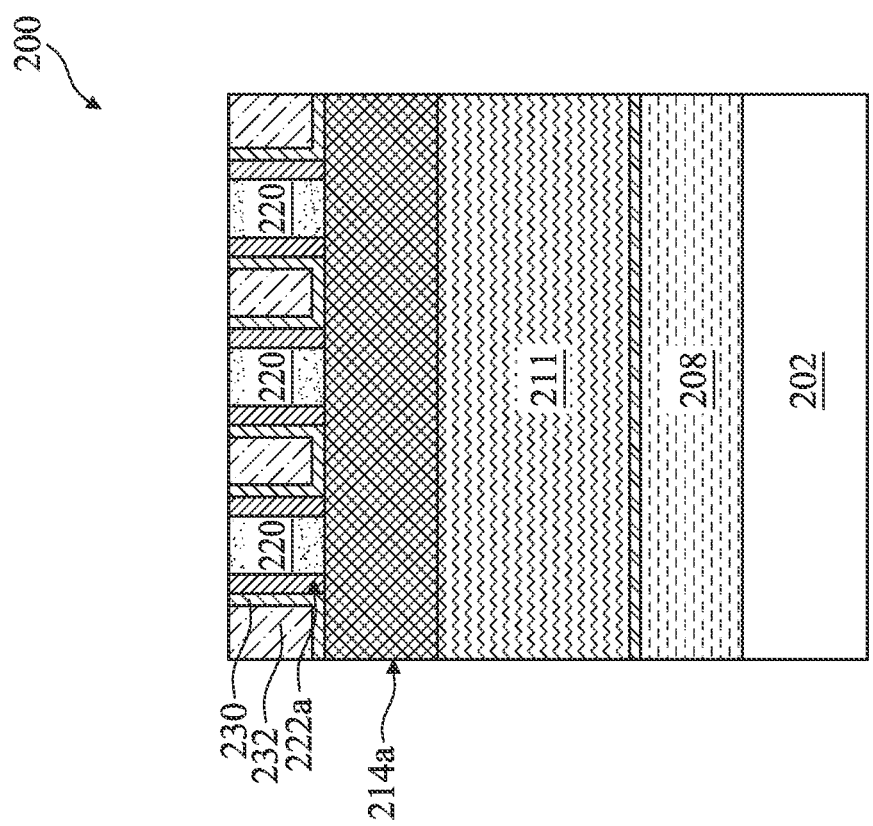

Thereafter, still referring to FIGS. 10A-10C, method 100 forms an etch-stop layer (ESL) 230 over the structure 200 to protect the underlying components, such as the epitaxial S/D features 224, during subsequent fabrication processes. The ESL 230 may include any suitable dielectric material, such as SiN, SiCN, other suitable materials, or combinations thereof, and may be formed by CVD, ALD, PVD, other suitable methods, or combinations thereof. In the present embodiments, the ESL 230 provides etching selectivity with respect to its surrounding dielectric components to ensure protection against inadvertent damage to these components.

Subsequently, method 100 forms an interlayer dielectric (ILD) layer 232 over the ESL 230, thereby filling the space between adjacent dummy gate stacks 220. The ILD layer 232 may include silicon oxide, a low-k dielectric material, TEOS, doped silicon oxide (e.g., BPSG, FSG, PSG, BSG, etc.), other suitable dielectric materials, or combinations thereof, and may be formed by any suitable method, such as CVD, FCVD, SOG, other suitable methods, or combinations thereof. Method 100 subsequently performs one or more CMP process to expose top surfaces of the dummy gate stacks 220.

Figure 11B:
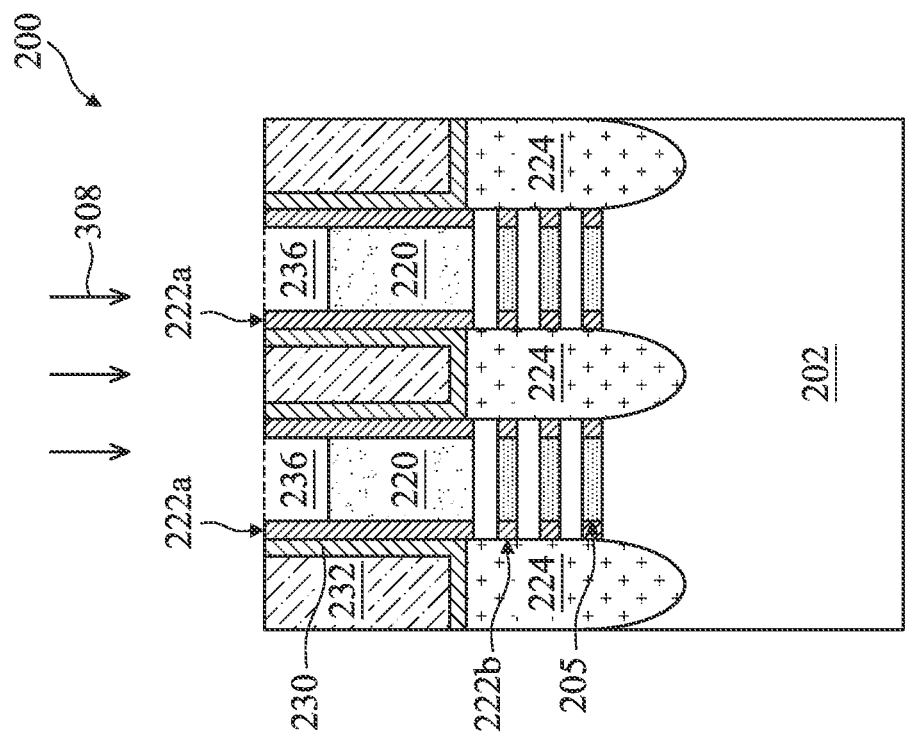
Figure 11A:
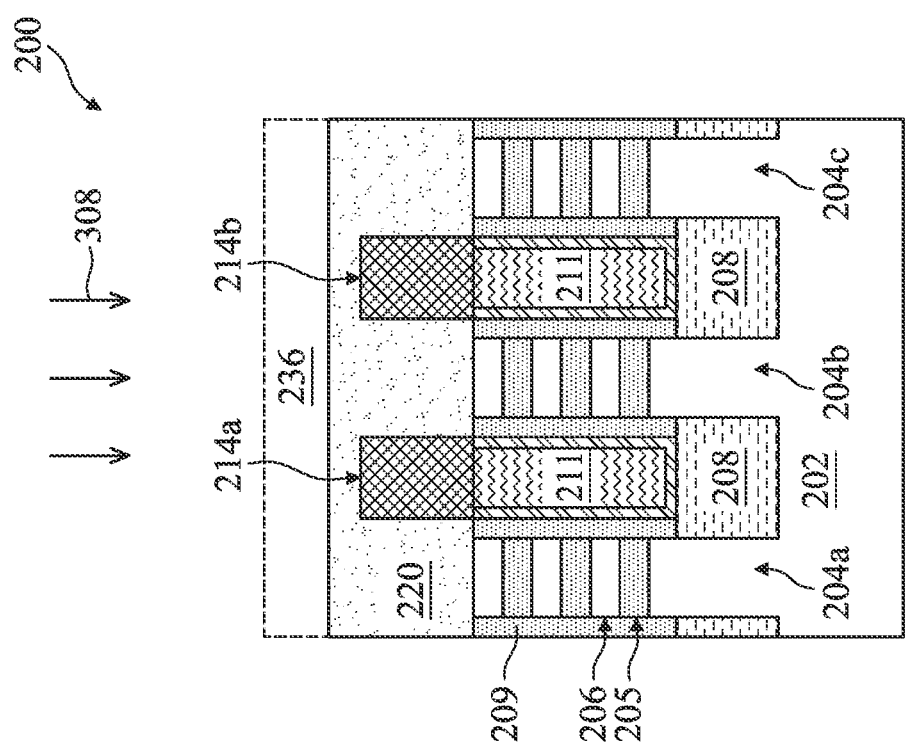
Figure 11C:
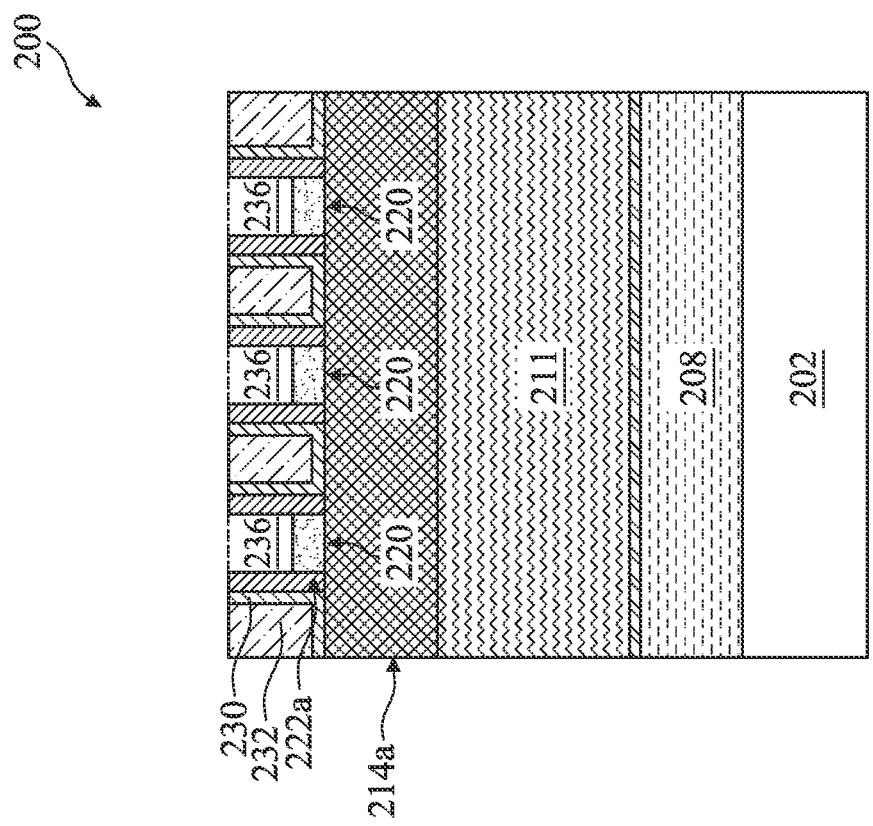

In some embodiments, referring to FIGS. 11A-11C, method 100 subsequently removes portions of the dummy gate stacks 220 in an etching process 308 to form trenches 236 between the top gate spacers 222a. The etching process 308 may include any suitable process, such as a dry etching process, a wet etching process, an RIE, or combinations thereof, configured to selectively remove the dummy gate stacks 220 without removing, or substantially removing, the surrounding components such as the top gate spacers 222a, the ESL 230, and the ILD layer 232. In some embodiments, the etching process 308 includes implementing a combination of a dry etching process and a wet etching process utilizing suitable etchants. The resulting height of the recessed dummy gate stacks 220 may be controlled by adjusting the duration of the etching process 308. In the present embodiments, the etching process 308 reduces the thickness of the portion of the dummy gate stack 220 that is disposed over the dielectric helmets 214a and 214b, thereby assisting in the subsequent removal (by etching) of the dielectric helmet 214b with respect to the dielectric helmet 214a.

Figure 12B:
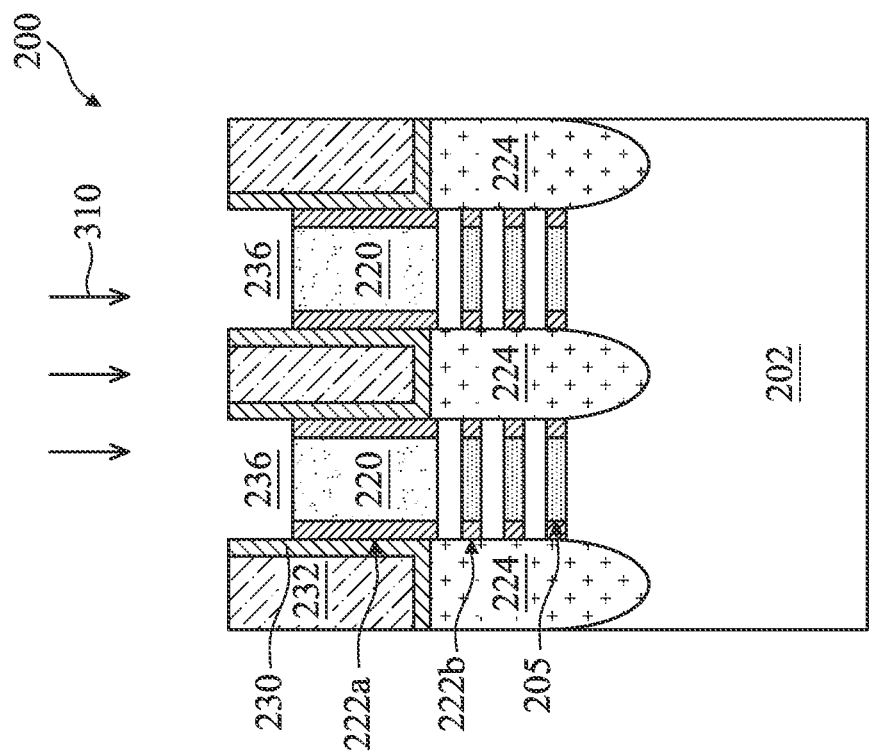
Figure 12A:
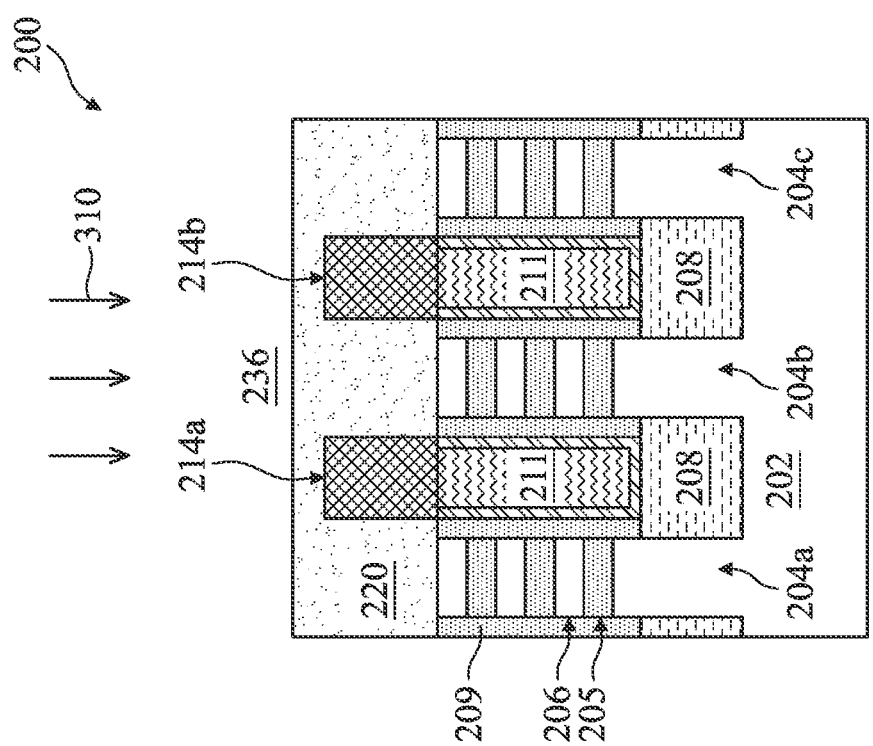
Figure 12C:
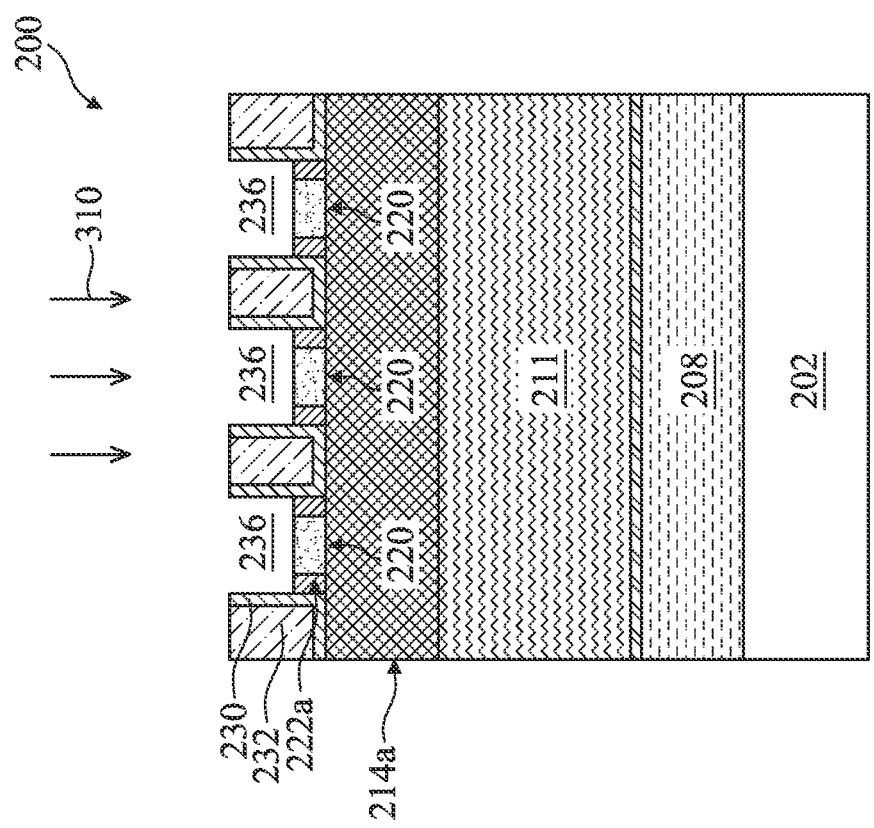

In some embodiments, as depicted in FIGS. 12A-12C, method 100 further implements an etching process 310 to selectively remove portions of the top gate spacers 222a without removing, or substantially removing, the surrounding components including portions of the dummy gate stacks 220, the ESL 230, and the ILD layer 232, such that the recessed dummy gate stacks 220 and the recessed top gate spacers 222a have substantially the same height. In other words, the etching process 310 widens the trenches 236 between adjacent sidewalls of the ESL 230. In the present embodiments, the etching process 310 includes any suitable process, such as a dry etching process, a wet etching process, an RIE, or combinations thereof, and implements an etchant different from that of the etching process 308 to achieve different etching selectivity. Similar to recessing the dummy gate stacks 220, the resulting height of the recessed top gate spacers 222a may be controlled by adjusting the duration of the etching process 310. In some embodiments, method 100 omits the etching of the dummy gate stacks 220 and the top gate spacers 222a after forming the ILD layer 232 and directly proceeds to operation 114.

Thereafter, referring to FIGS. 1A and 13A-13E, method 100 at operation 114 forms a patterned masking element 240 over a portion of the dummy gate stack 220 that is engaged with the dielectric helmet 214a between the fins 204a and 204b.

In the present embodiments, portion 214a' of the dielectric helmet 214a disposed under the patterned masking element 240 remains in the structure 200 as a gate isolation feature for the subsequently-formed metal gate structure, and a portion 215 of the dielectric helmet 214a exposed by the patterned masking element 240 (as well as the entirety of the dielectric helmet 214b in the depicted embodiments) is removed in a subsequent operation. It is noted that while the entirety of the dielectric helmet 214b is exposed by the patterned masking element 240, the present disclosure also contemplates embodiments in which the dielectric helmet 214b is to remain, partially or entirely, as a portion of the structure 200 by forming another patterned masking element thereover. It is noted that subsequent FIGS. 13D, 14C, 15C, 16C, 17C, 18C, 19C, and 20C are cross-sectional views of the semiconductor structure taken along line DD', which is through the portion 214a' as shown in FIG. 13C, and FIGS. 13E, 14D, 15D, 16D, 17D, 18D, 19D, and 20D are cross-sectional views of the semiconductor structure taken along line EE', which is through the portion 215 as shown in FIG. 13C.

Figure 13B:
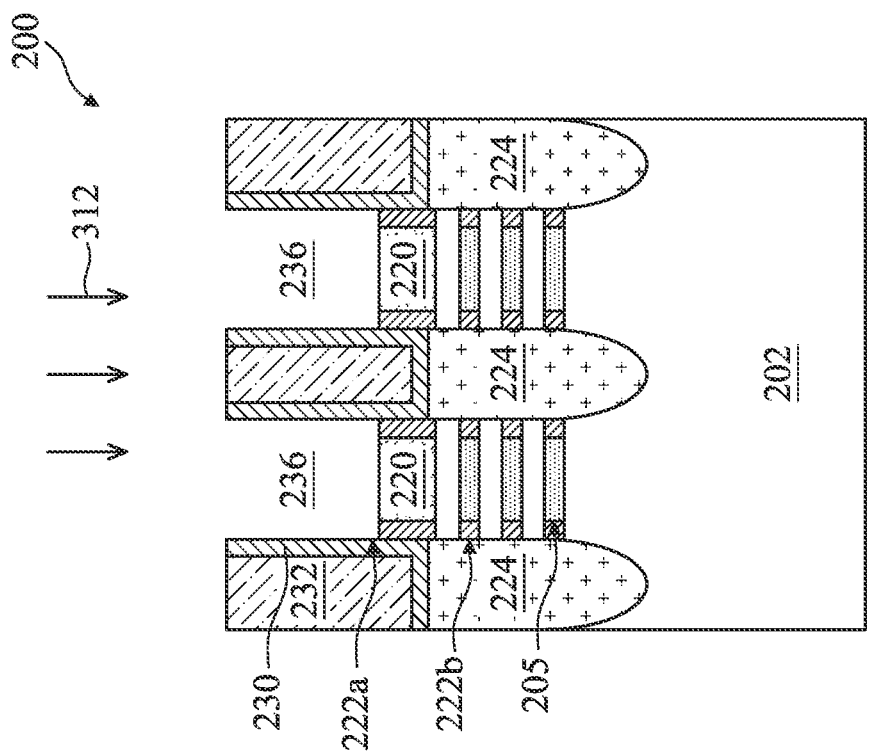
Figure 13A:
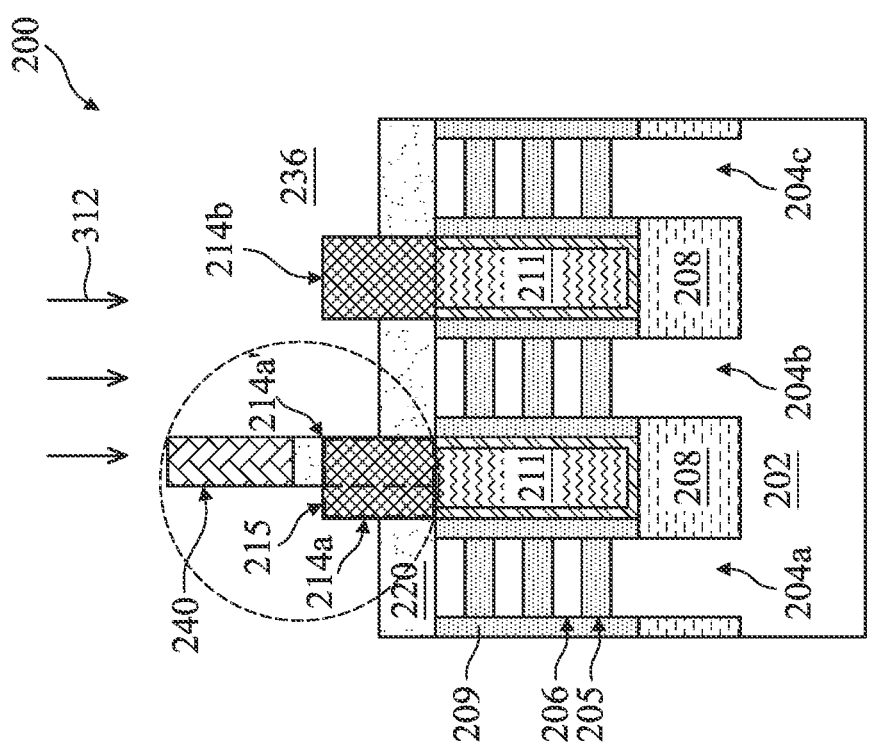
Figures 1, 13A:
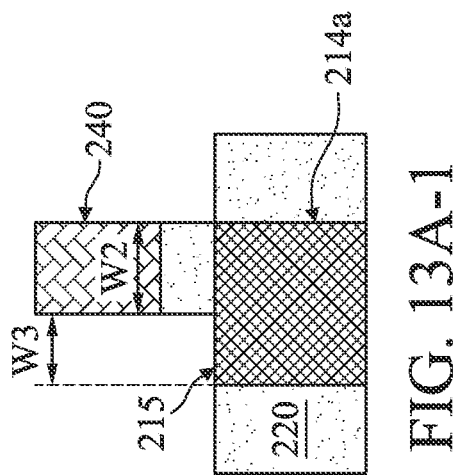
Figures 2, 13A:
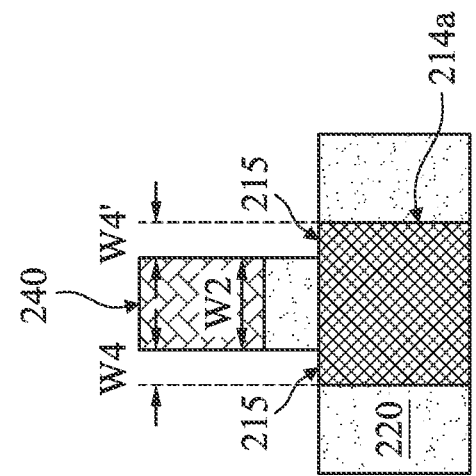
Figure 13C:
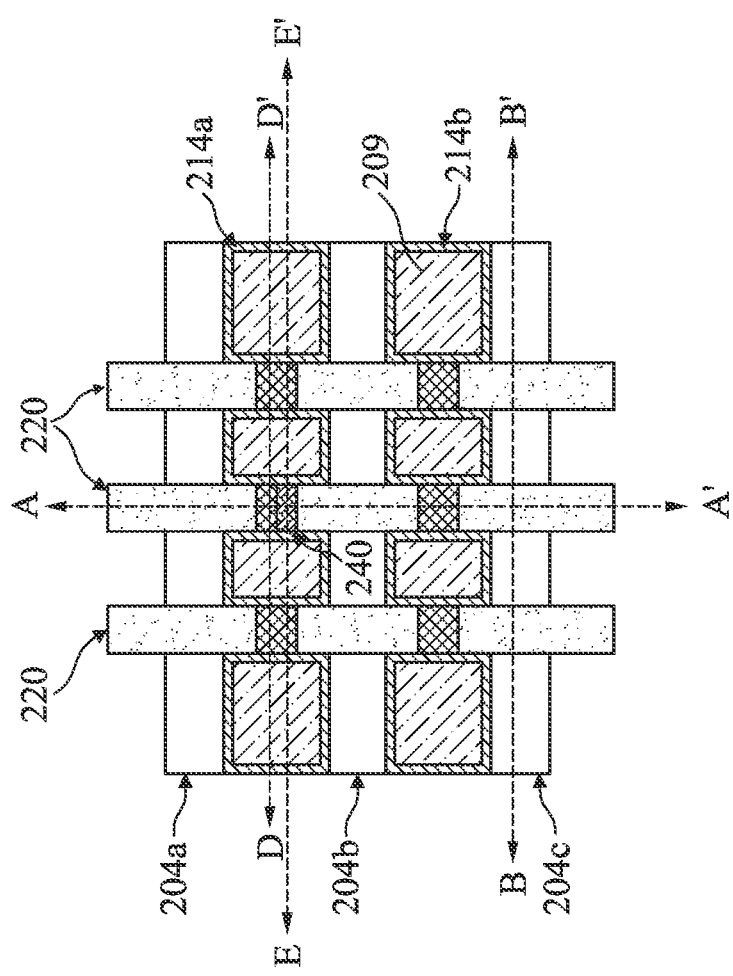
FIG. 13C is a planar top view of the semiconductor structure as shown in FIG. 14A and/or 14B according to various embodiments of the present disclosure.
Figure 13E:
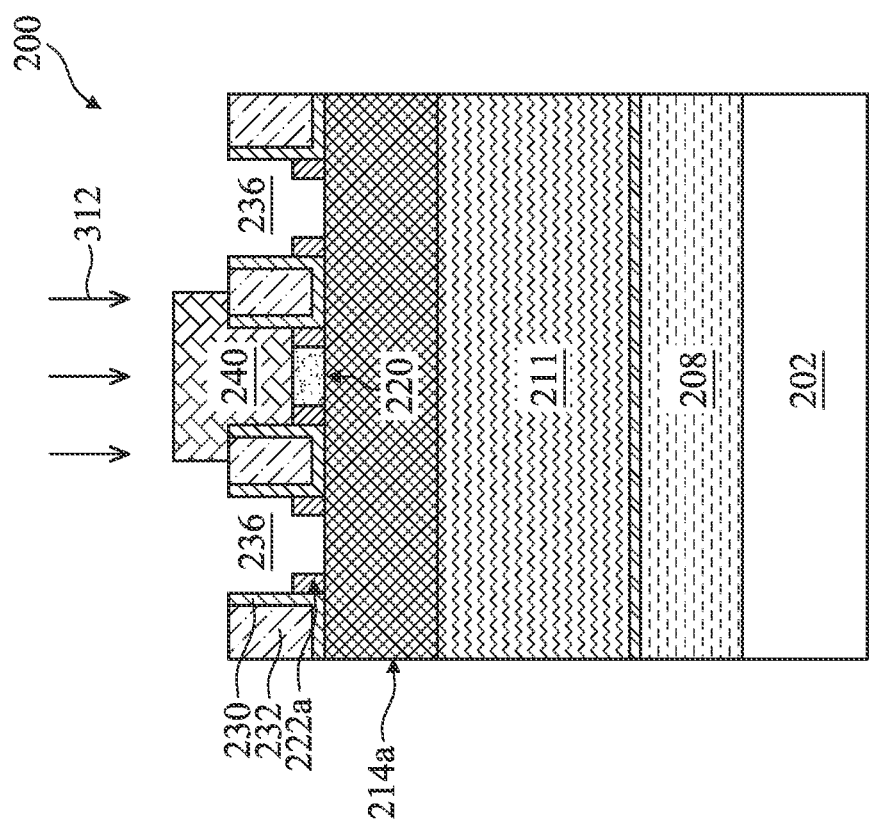
FIGS. 13E, 14D, 15D, 16D, 17D, 18D, 19D, and 20D are cross-sectional views of the semiconductor structure taken along line EE' as shown in FIG. 13C and corresponding to FIGS. 13A, 14A, 15A, 16A, 17A, 18A, 19A, and 20A, respectively, during intermediate stages of the method shown in FIGS. 1A and/or 1B according to various embodiments of the present disclosure.
Figure 13D:
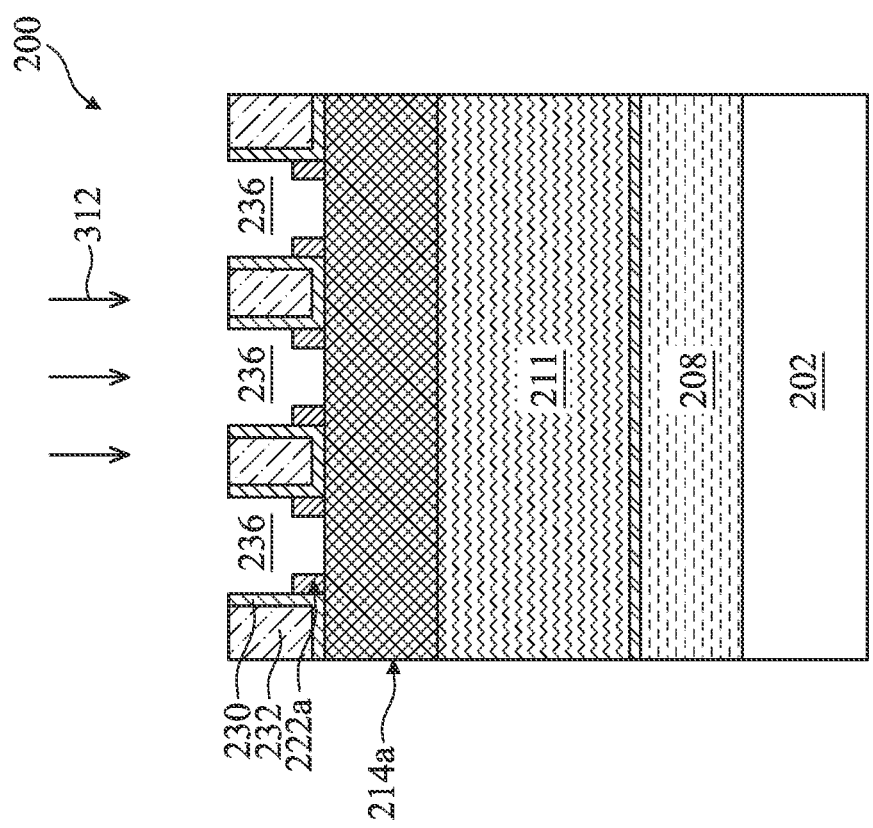
FIGS. 13D, 14C, 15C, 16C, 17C, 18C, 19C, and 20C are cross-sectional views of the semiconductor structure taken along line DD' as shown in FIG. 13C and corresponding to FIGS. 13A, 14A, 15A, 16A, 17A, 18A, 19A, and 20A, respectively, during intermediate stages of the method shown in FIGS. 1A and/or 1B according to various embodiments of the present disclosure.
Figure 14B:
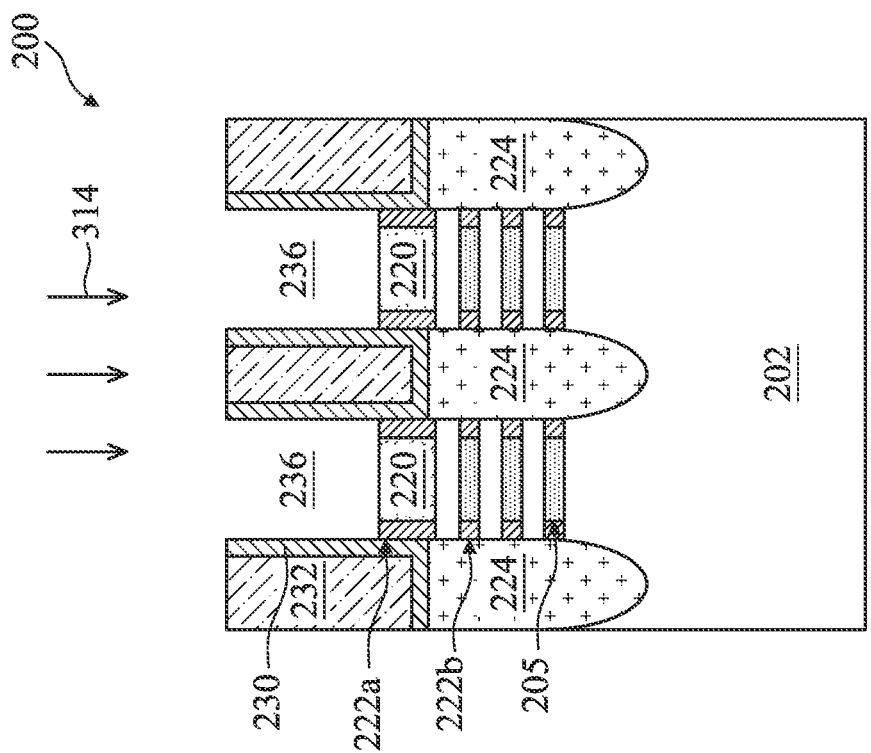
Figure 14A:
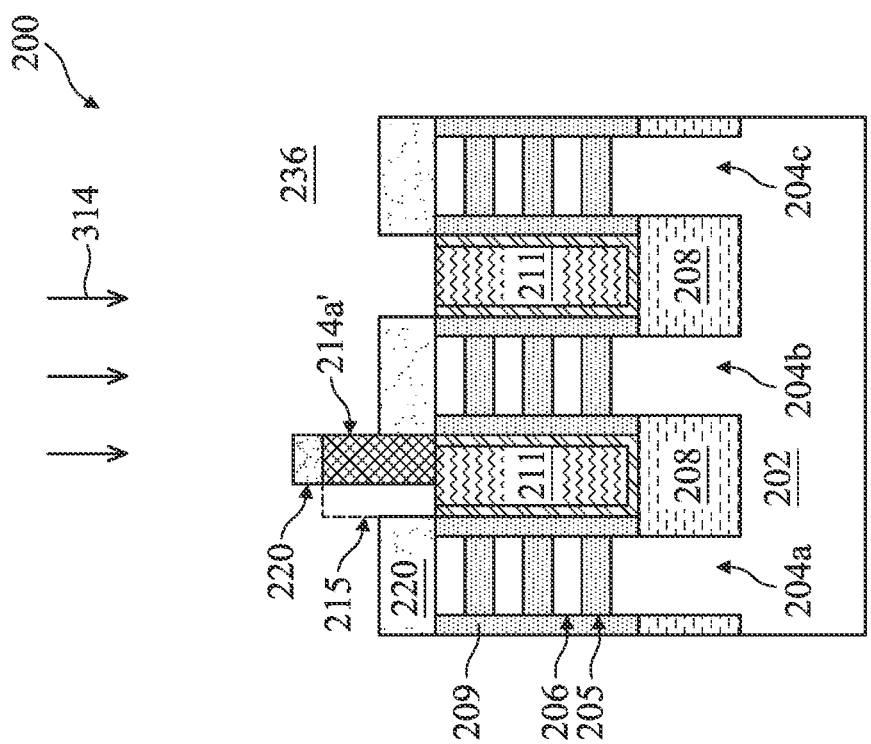
Figure 14D:
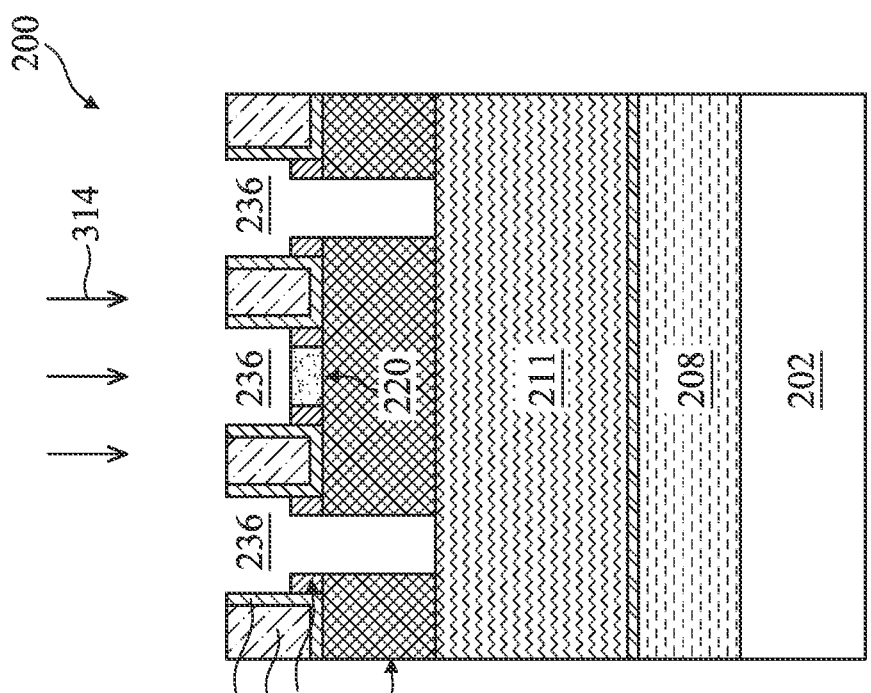
Figure 14C:
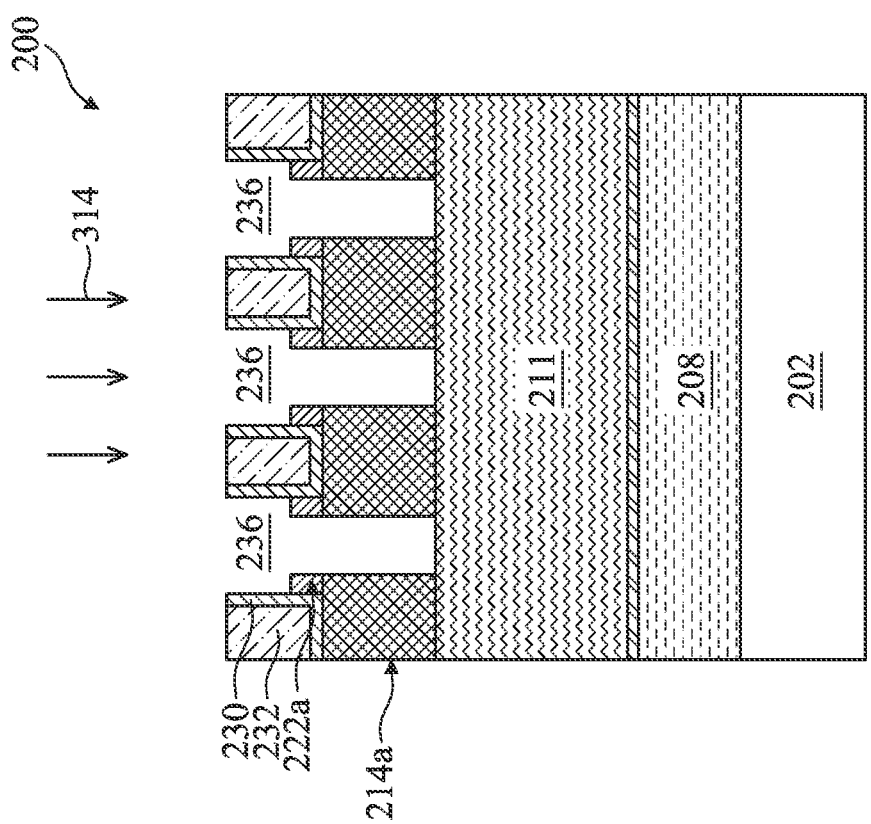
Figure 15B:
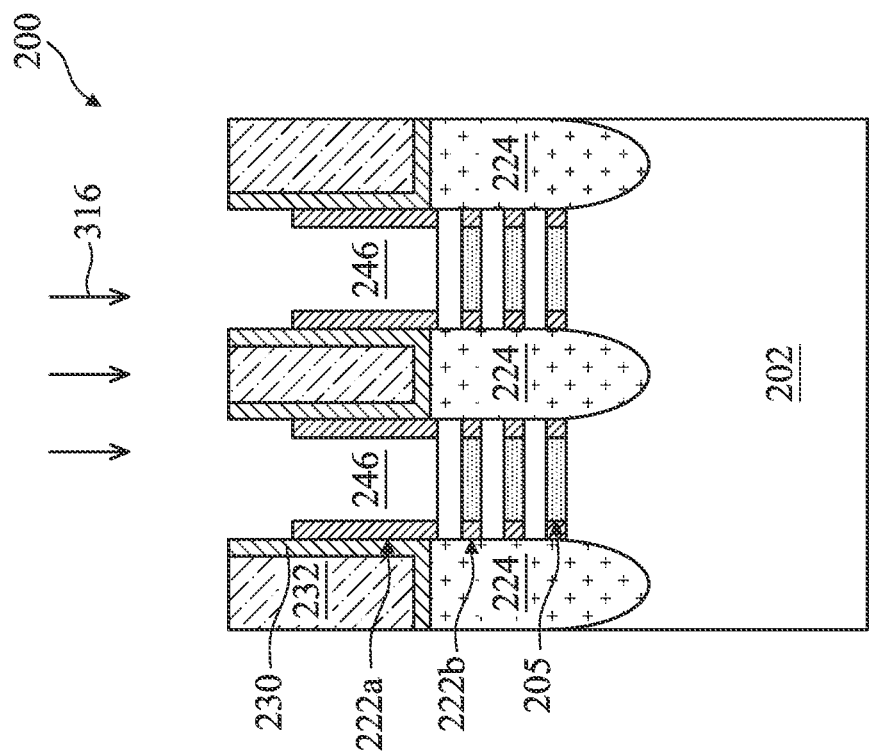
Figure 15A:
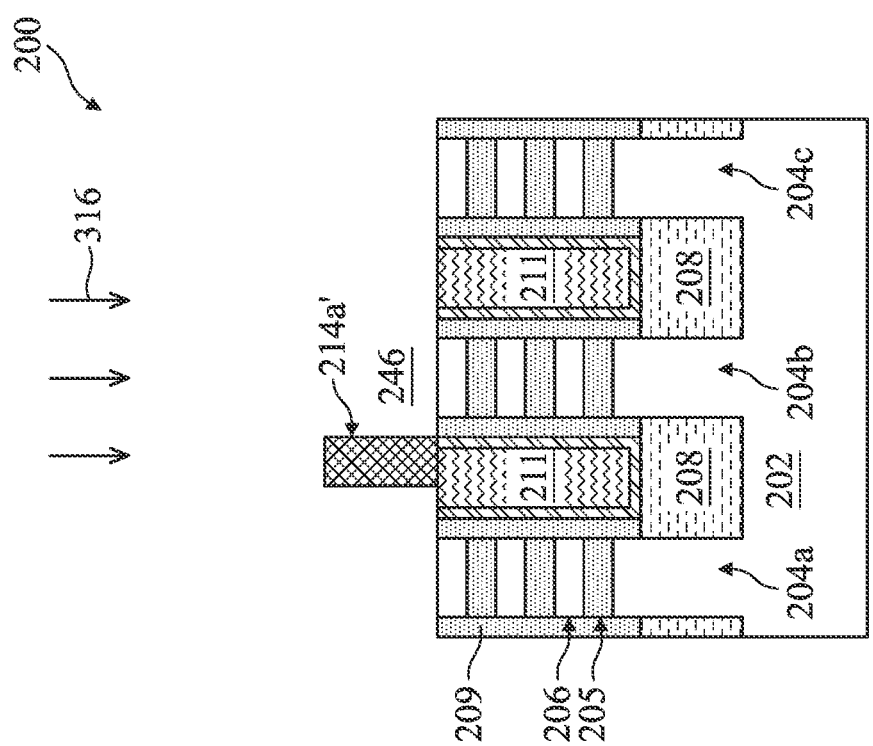
Figure 15D:
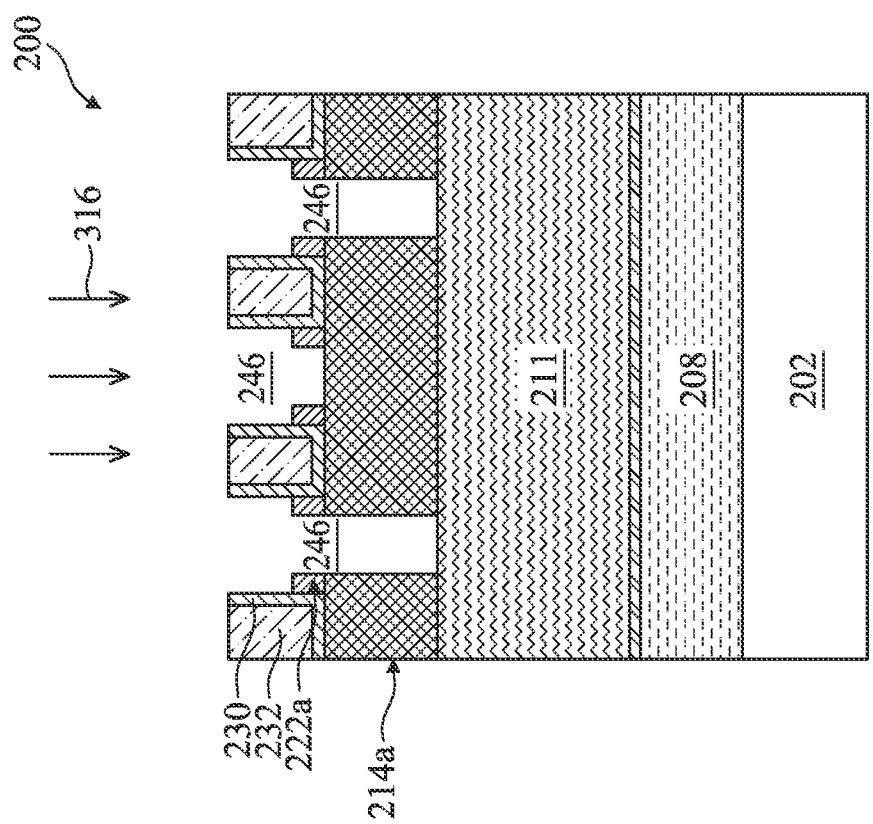
Figure 15C:
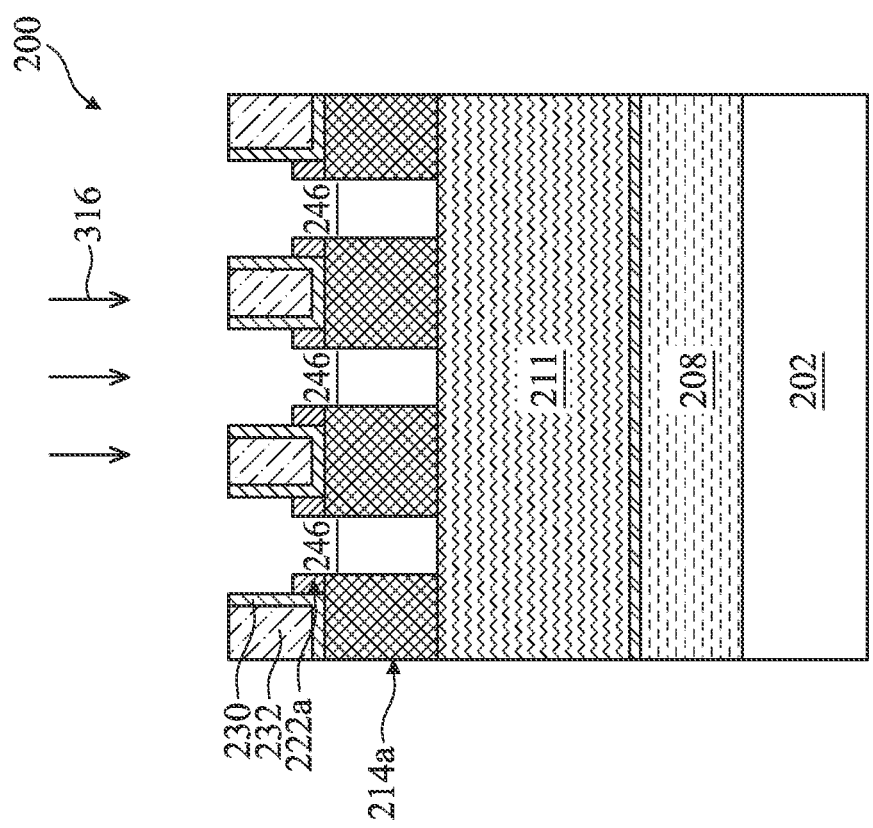
Figure 16B:
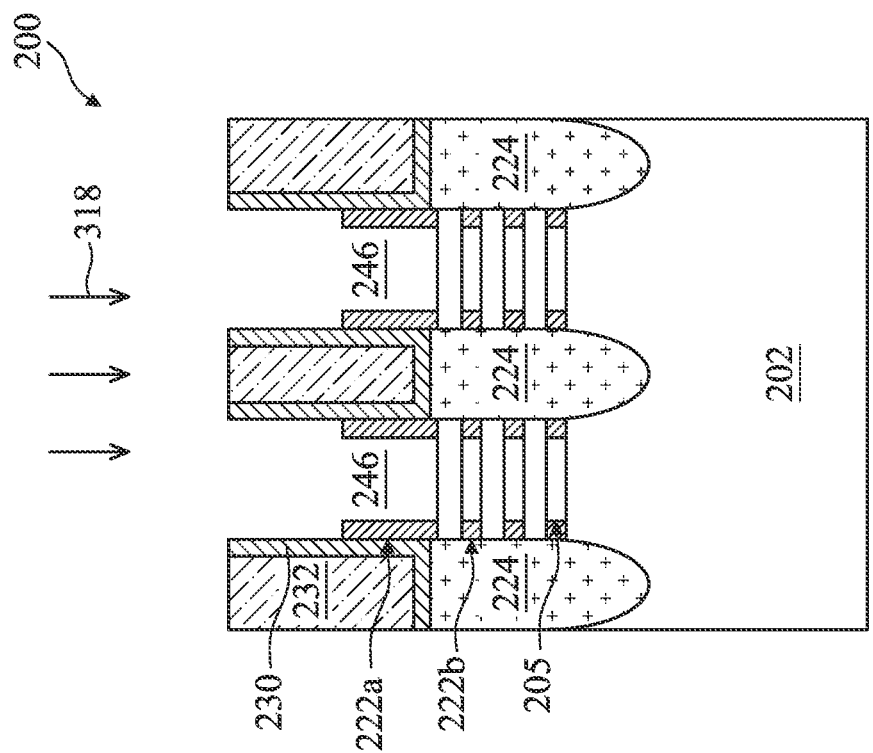
Figure 16A:
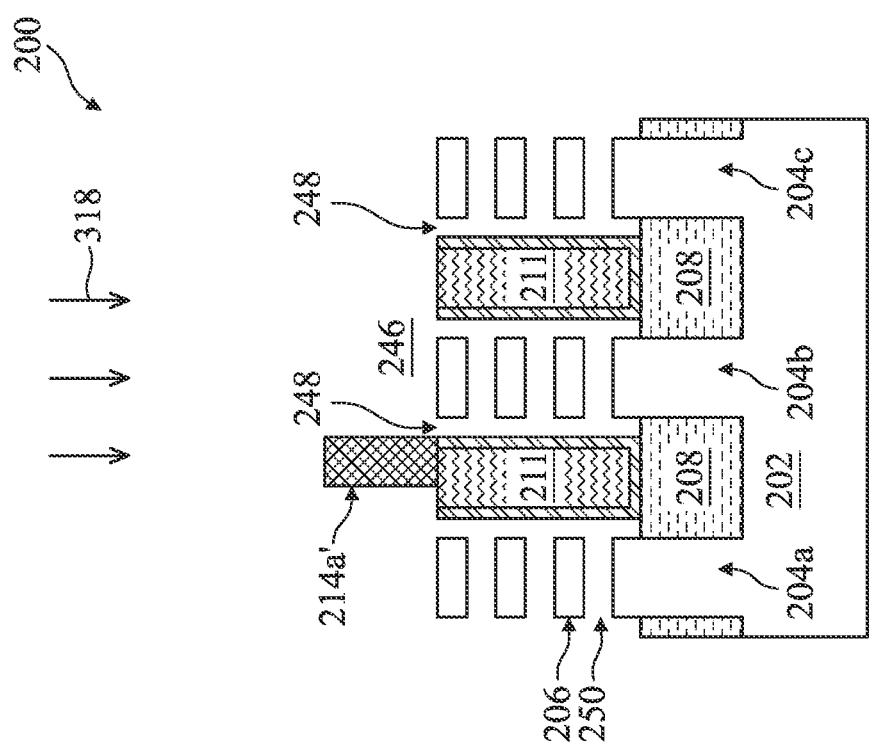
Figure 16C:
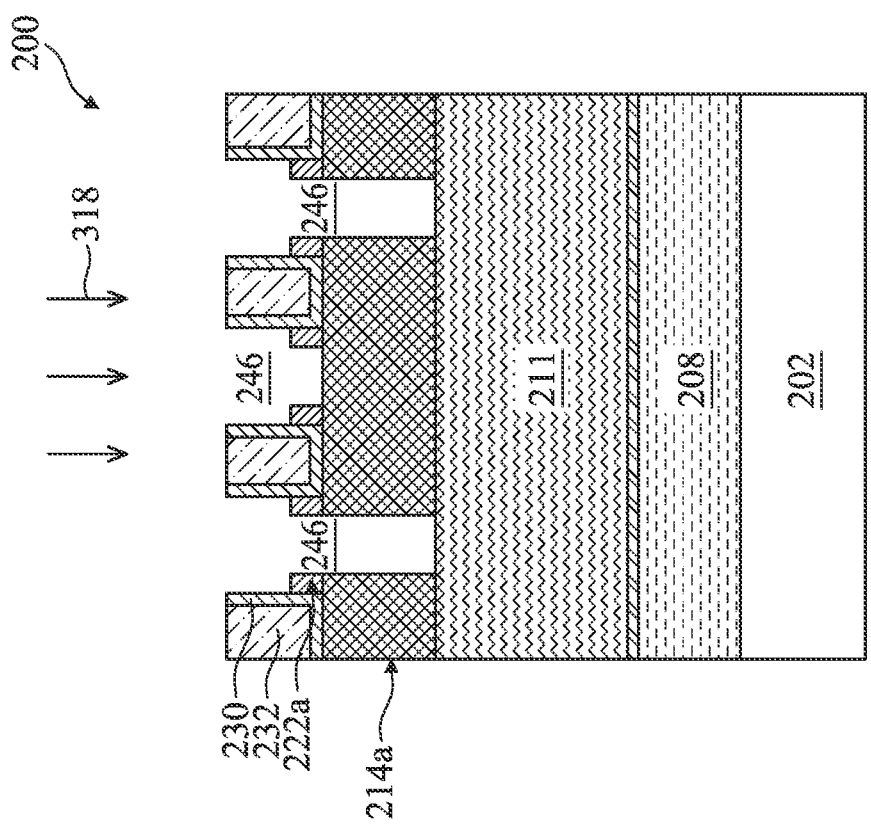
Figure 16D:
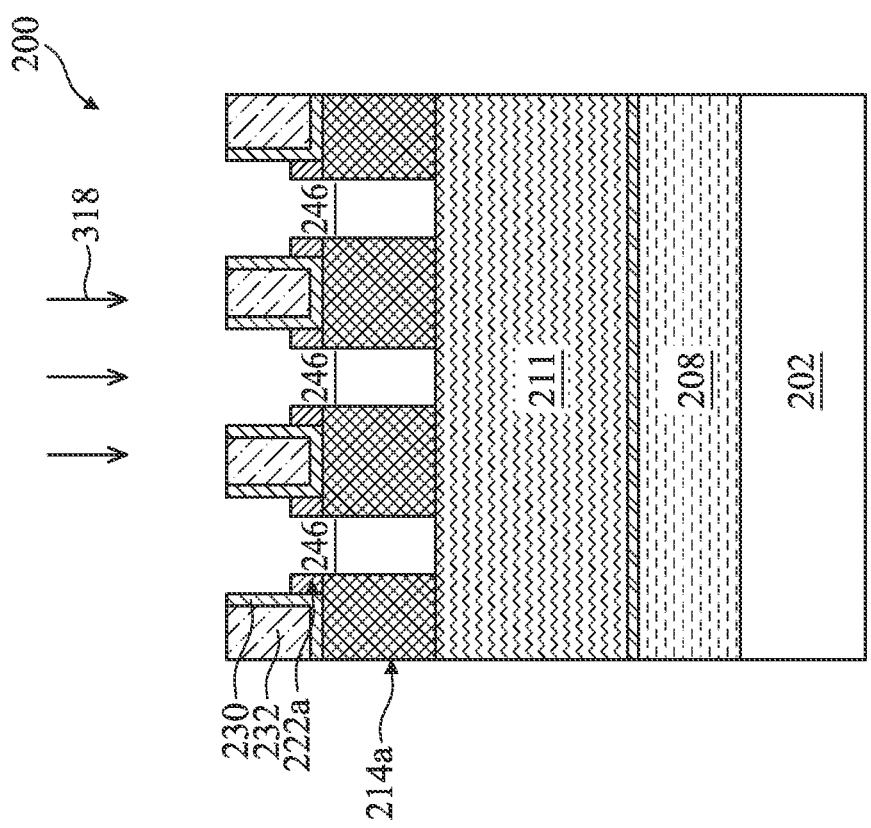
Figure 17B:
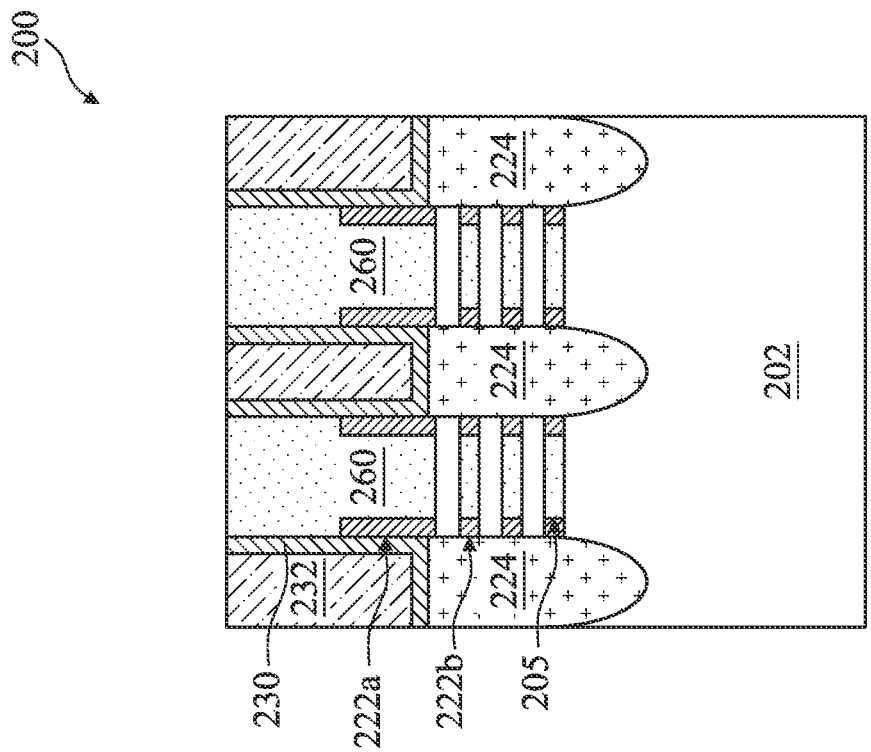
Figure 17A:
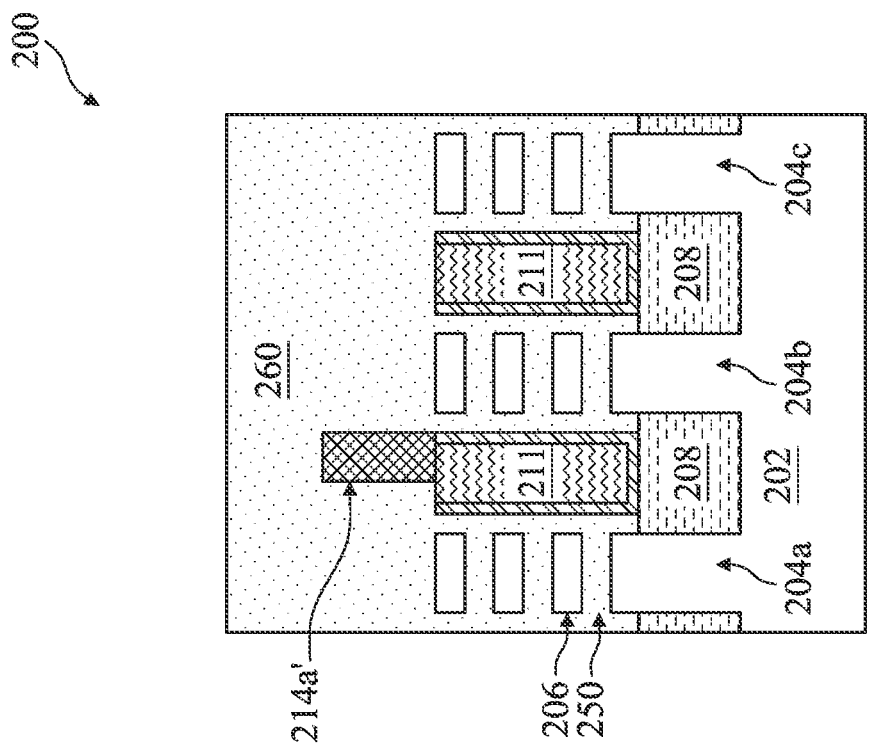
Figure 17D:
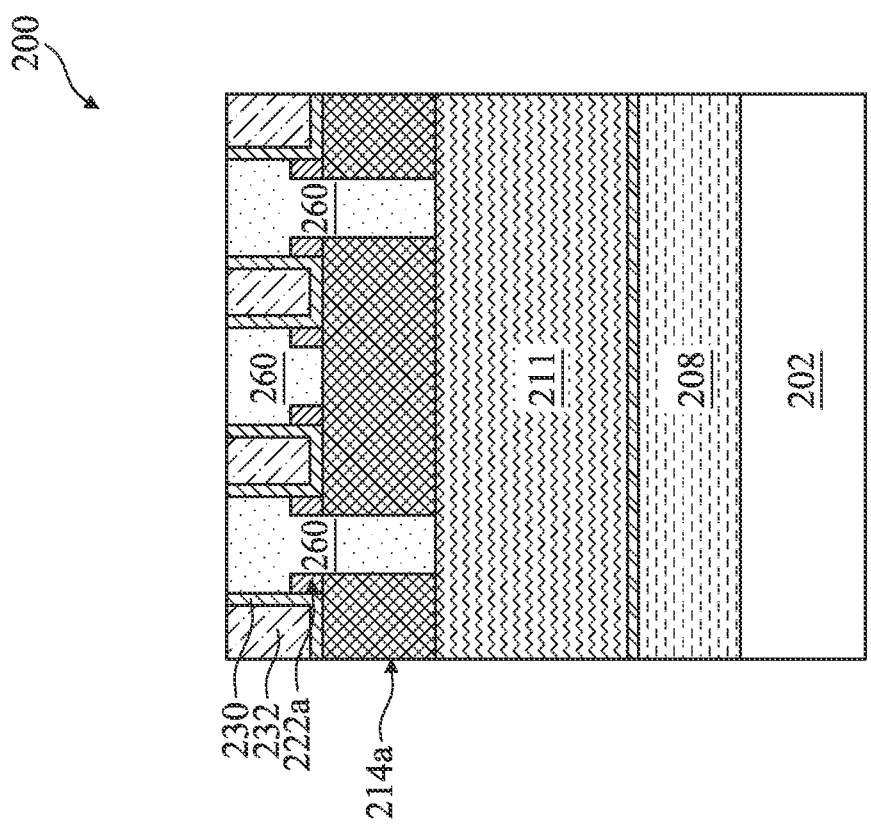
Figure 17C:
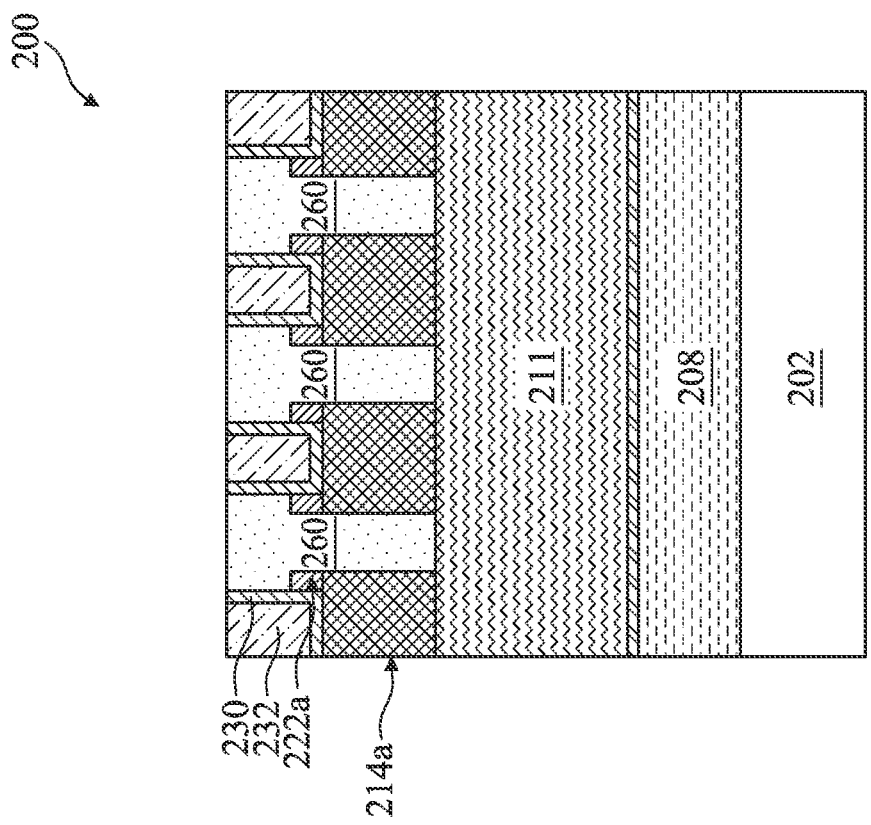
Figure 18B:
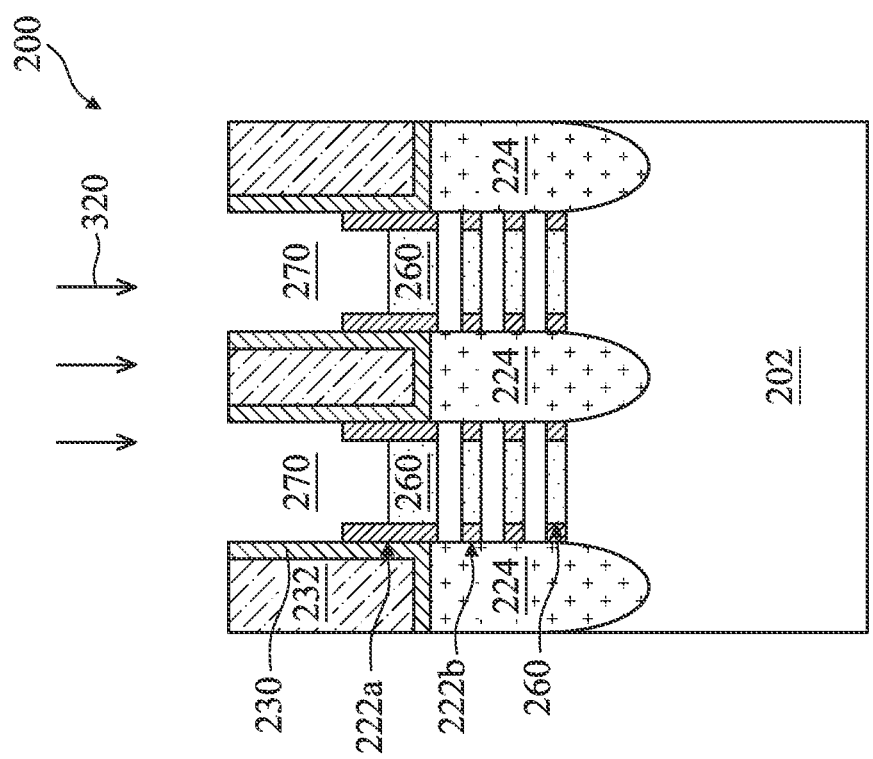
Figure 18A:
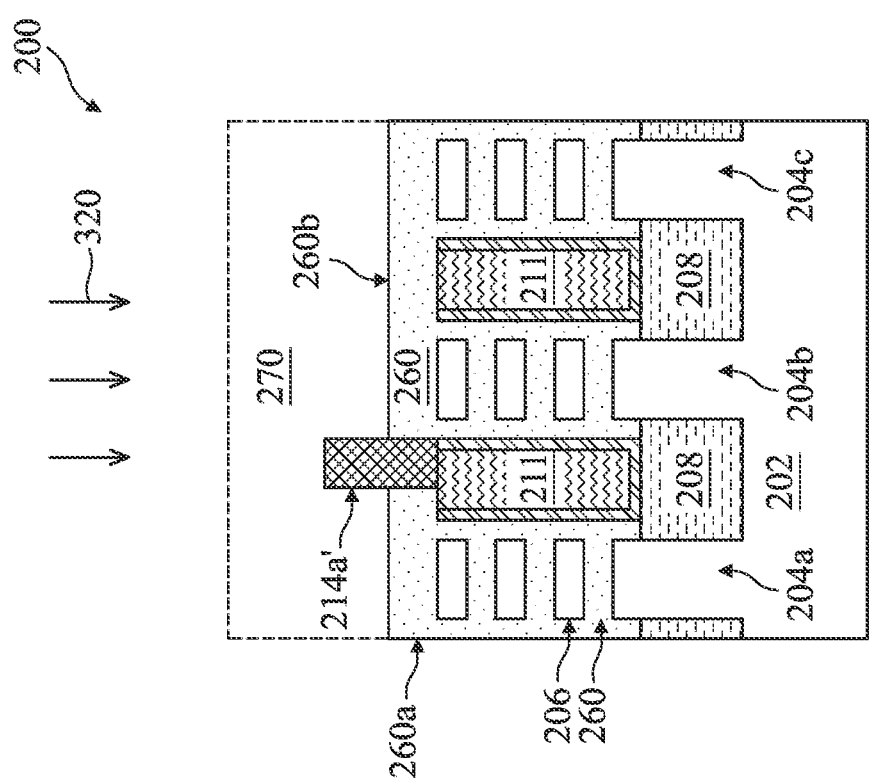
Figure 18C:
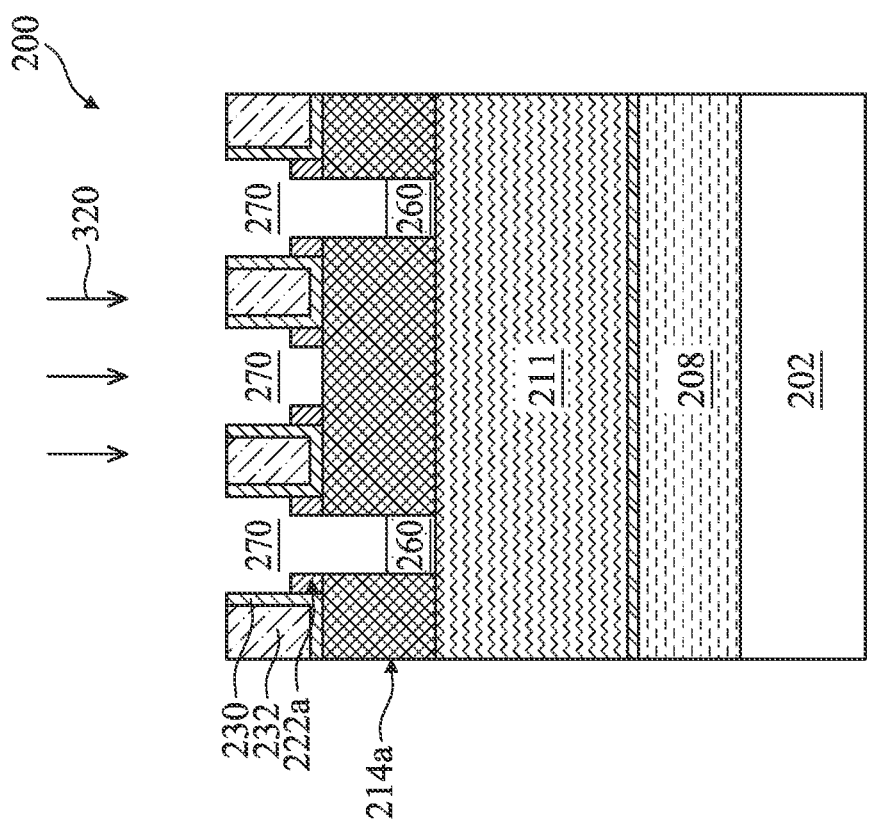
Figure 18D:
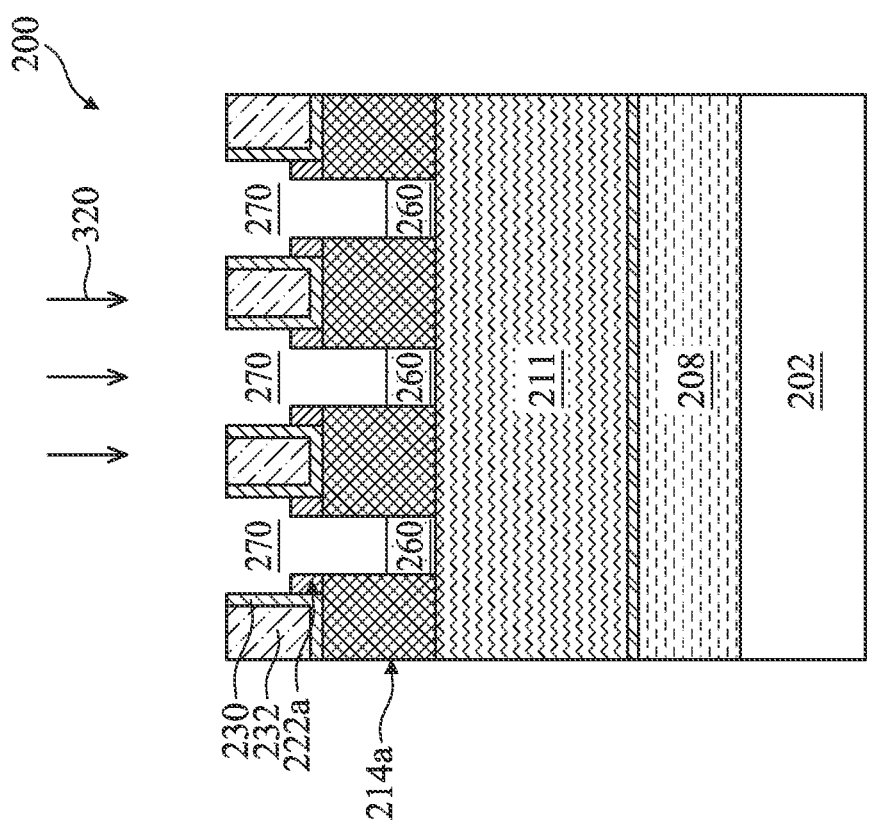
Figure 19B:
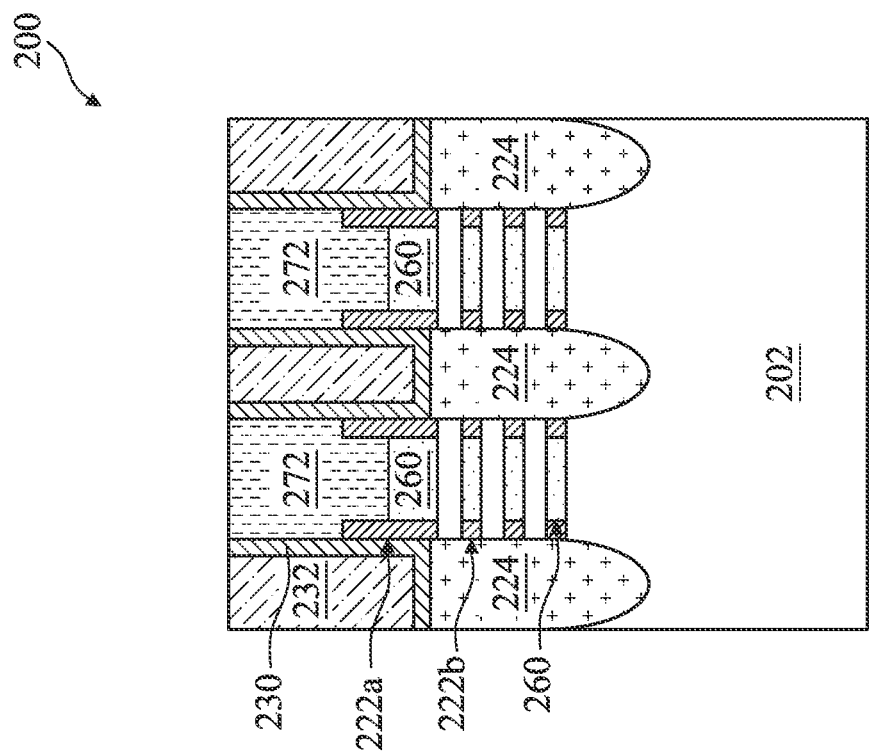
Figure 19A:
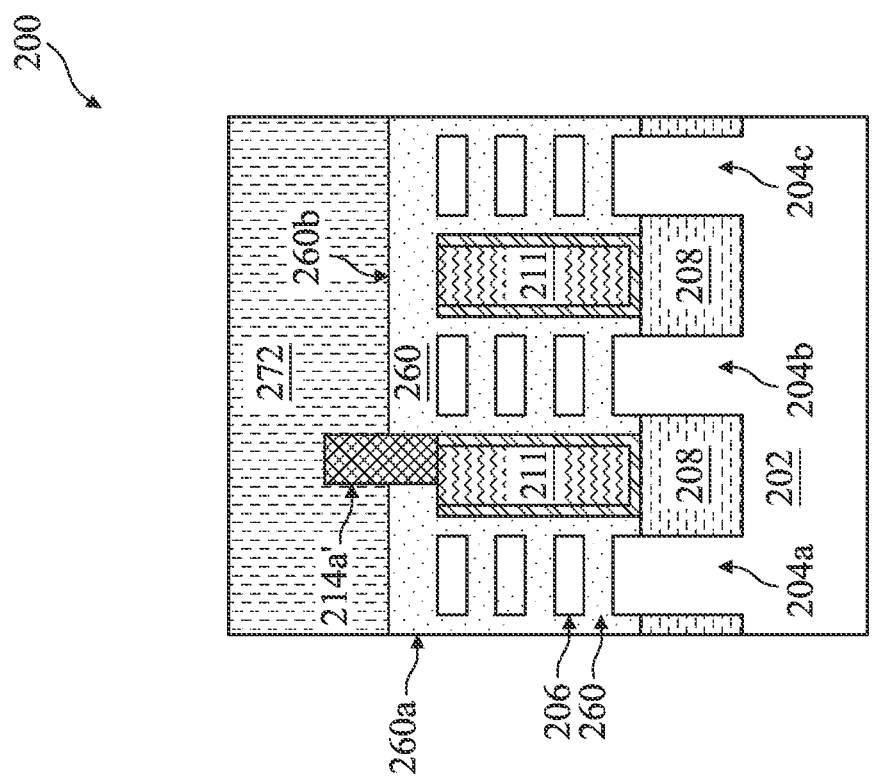
Figure 19D:
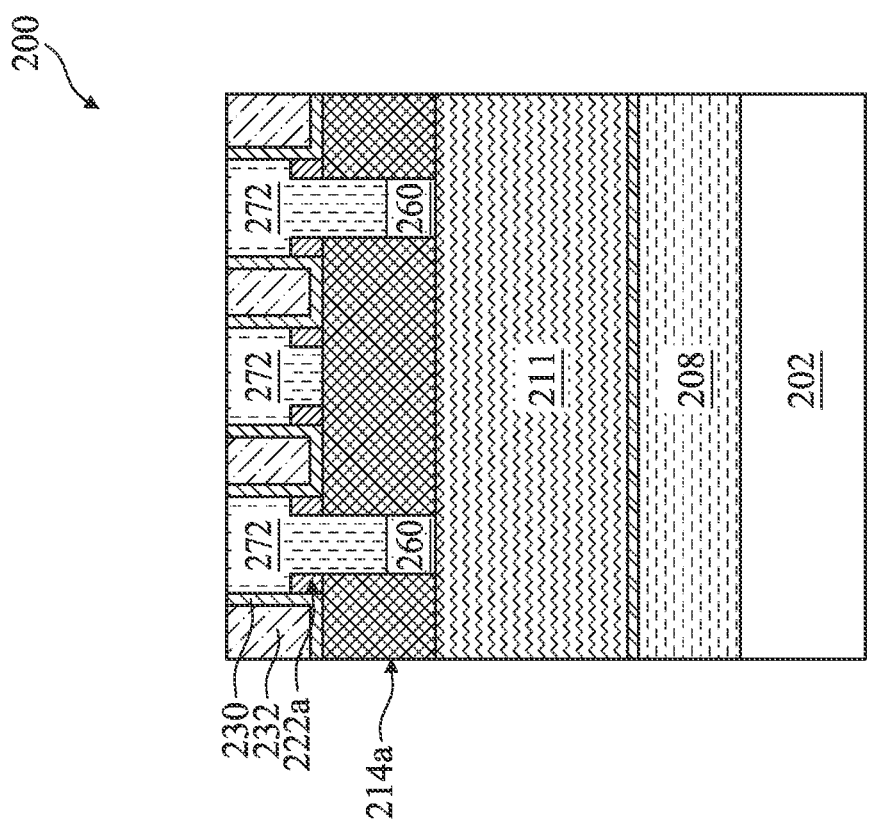
Figure 19C:
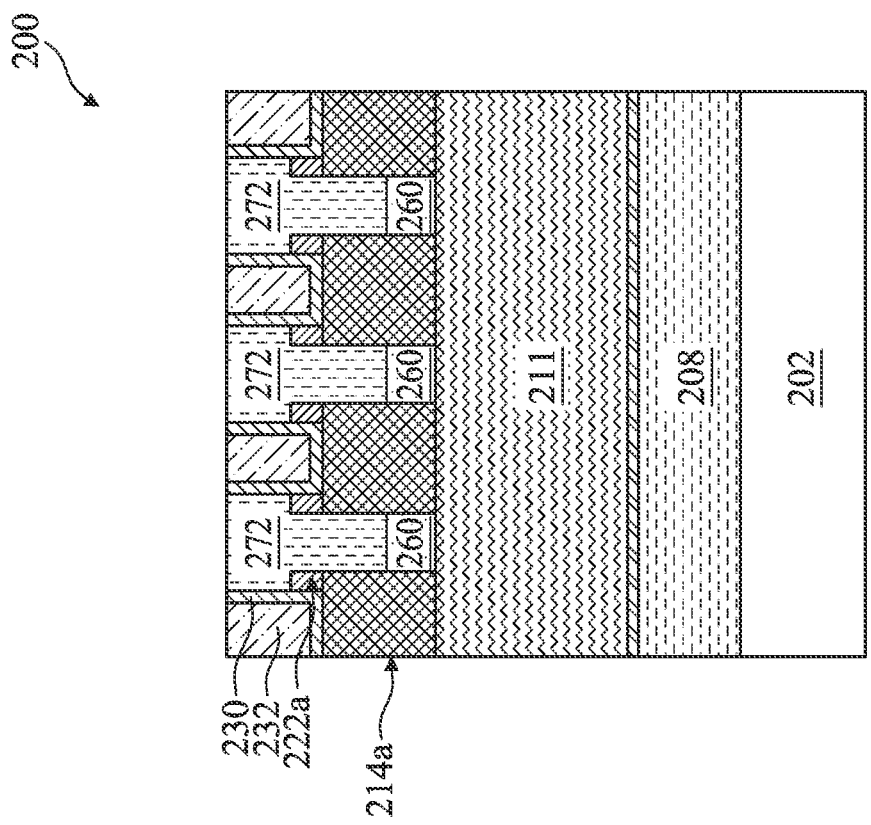

Details of the patterned masking element 240 (i.e., the portion of the structure 200 enclosed in dashed circle) are discussed in reference to FIGS. 13A-1 and 13A-2. Collectively referring to FIGS. 13A-1 and 13A-2, the patterned masking element 240, which is defined by a width W2, includes at least a photoresist layer (not depicted separately) configured to be patterned by a series of photolithography and etching processes discussed in detail above with respect to patterning the fins 204a-204c. In other words, the width W2 defines a width of the gate isolation feature, i.e., the portion 214a' (hereafter referred to as gate isolation feature 214a'), remaining in the structure 200 after patterning the dielectric helmet 214a. In some embodiments, referring to FIG. 13A-1, the patterned masking element 240 is configured to substantially align with one of the sidewalls of the dielectric helmet 214a (a one-sided configuration), such that the exposed portion 215 of the dielectric helmet 214a is defined by a width W3. In some embodiments, referring to FIG. 13A-2, the patterned masking element 240 is configured to cover a center portion of the dielectric helmet 214a, such that portions 215 of the dielectric helmet 214a on both sides of the patterned masking element 214a are exposed (a two-sided configuration), the exposed portions 215 being defined by a width W4 and a width W4'. In some embodiments, the widths W4 and W4' are substantially the same (i.e., within +/−1 nm). In some embodiments, the widths W4 and W4' are different in values.

In some embodiments, as discussed in detail below, each of the widths W3, W4, and W4' denotes a minimum separation distance between a subsequently-formed gate contact (e.g., gate contact 280) and the gate isolation feature 214a'. The present embodiments do not limit the widths W3, W4, and W4' to any specific values, so long as they are all at or above a threshold value determined by the limitations of the subsequent etching processes (i.e., operations 116 and/or 118). In an example embodiment, the widths W3, W4, and W4' are all at least about 5 nm to about 9 nm. Specific values of the widths W3, W4, and W4' may further be determined based on the separation distance (spacing) between two adjacent fins 204a-204c and positions of the gate contacts as discussed in detail below.

At operation 116, still referring to FIGS. 1B and 13A-13E, method 100 removes portions of the dummy gate stack 220 in an etching process 312 to expose the dielectric helmet 214b and the portion 215 of the dielectric helmet 214a not covered by the patterned masking element 240. In the present embodiments, the etching process 312 includes any suitable process, such as a dry etching process, a wet etching process, an RIE, or combinations thereof, configured to selectively remove the dummy gate stacks 220 without removing, or substantially removing, the surrounding components such as the top gate spacers 222a, the ESL 230, and the ILD layer 232. In some embodiments, the etching process 312 implements an etchant similar to that of the etching process 308. In the present embodiments, the etching process 312 is configured to only expose top portions of the dielectric helmets 214a and 214b and thus needs not to completely remove the exposed portions of the dummy gate stack 220. In some embodiments, the extent of such removal is controlled by adjusting the duration of the etching process 312. After implementing the etching process 312, the patterned masking element 240 is removed from the structure 200 by any suitable method, such as resist stripping and/or plasma ashing.

At operation 118, referring to FIGS. 14A-14D, method 100 removes the exposed portion 215 of the dielectric helmet 214a and the dielectric helmet 214b in its entirety in an etching process 314, such that the gate isolation feature 214a' remains in the structure 200. In this regard, the etching process 314 deepens the trenches 236 to expose the isolation structures 211. In the present embodiments, the etching process 314 is configured to selectively remove the exposed portions of the dielectric helmets 214a and 214b without removing, or substantially removing, the surrounding components such as the dummy gate stacks 220, the isolation structures 211, the top gate spacers 222a, the ESL 230, and the ILD layer 232. Accordingly, the remaining portions of the dummy gate stacks 220 protect the gate isolation feature 214a' from being recessed by the etching process 314. The etching process 314 may include any suitable process, such as a dry etching process, a wet etching process, an RIE, or combinations thereof.

At operation 120, referring to FIGS. 1B and 15A-15D, method 100 removes the remaining portions of the dummy gate stacks 220 from the structure 200 in an etching process 316 to form gate trenches 246. In the present embodiments, the etching process 316 selectively removes the dummy gate stacks 220 without removing, or substantially removing, the surrounding components such as the channel layers 206, the gate isolation feature 214a', the isolation structures 211, the top gate spacers 222a, the ESL 230, and the ILD layer 232. The etching process 316 may include any suitable process, such as a dry etching process, a wet etching process, an RIE, or combinations thereof. In some embodiments, the etching process 316 implements an etchant similar to that of the etching process 308.

At operation 122, referring to FIGS. 1B and 16A-16D, method 100 removes the non-channel layers 205 from the ML to form openings 250 between the channel layers 206 in a sheet formation, or sheet release, process 318. In some embodiments, the sheet formation process 318 first removes the cladding layer 209, which has a composition similar to or the same as that of the non-channel layers 205, to form trenches 248 along the sidewalls of the fins 204a-204c, and subsequently removes the non-channel layers 205 to form the openings 250. In some embodiments, the cladding layer 209 and the non-channel layers 205 are removed together. The sheet formation process 318 is configured to selectively removes the non-channel layers 205 and the cladding layer 209 without removing, or substantially removing, the channel layers 206 or any other surrounding components of the structure 200. In this regard, the openings 248 are interleaved with the channel layers 206. In some embodiments, the sheet formation process 318 is implemented in a series of etching and trimming processes.

At operation 124, referring to FIGS. 1B and 17A-17D, method 100 forms a metal gate structure 260 in the gate trenches 246, the trenches 248, and the openings 250, such that the metal gate structure 260 contacts the sidewalls of the fins 204a-204c and wraps around (or interleaved with) each channel layer 206. In the present embodiments, the metal gate structure 260 engages with the gate isolation feature 214a'.

In the present embodiments, the metal gate structure 260 includes a gate dielectric layer (not depicted separately) and a metal gate electrode (not depicted separately) over the gate dielectric layer. The gate dielectric layer may include a high-k dielectric material, such as $HfO_2$, $La_2O_3$, other suitable materials, or combinations thereof. The metal gate electrode includes at least one work function metal layer and a bulk conductive layer disposed thereover. The work function metal layer may be a p-type or an n-type work function metal layer. Example work function metals include TiN, TaN, WN, $ZrSi_2$, $MoSi_2$, $TaSi_2$, $NiSi_2$, Ti, TaAl, TaAlC, TiAlN, TaC, TaCN, TaSiN, Mn, Zr, other suitable work function metals, or combinations thereof. The bulk conductive layer may include Cu, W, Al, Co, Ru, other suitable materials, or combinations thereof. The metal gate structure 260 may further include other material layers (not depicted), such as an interfacial layer disposed on surfaces of the channel layers 206, a capping layer, a barrier layer, other suitable layers, or combinations thereof. Various layers of the metal gate structure 260 may be formed by various methods, including ALD, CVD, PVD, plating, other suitable methods, or combinations thereof. After forming the bulk conductive layer, one or more CMP processes are performed to remove excessive material formed on top surface of the ILD layer 232, thereby planarizing the structure 200.

At operation 126, referring to FIGS. 1B and 18A-18D, method 100 recesses the metal gate structure 260 in an etching process 320, thereby exposing the gate isolation feature 214a' in a trench 270. In the present embodiments, the etching process 320 selectively removes the top portion of the metal gate structure 260, including at least portions of the gate dielectric layer and the metal gate electrode, without removing, or substantially removing, the gate isolation feature 214a' or other dielectric components nearby such as the top gate spacers 222a, the ESL 230, and the ILD layer 232. The etching process 320 may be implemented by any suitable method, including a dry etching process, a wet etching process, RIE, other suitable methods, or combinations thereof, utilizing one or more etchant configured to etch components of the metal gate structure 260.

In the present embodiments, the etching process 320 is controlled to recess the metal gate structure 260 such that a top surface of the recessed metal gate structure 260 is below a top surface of the gate isolation feature 214a'. In other words, the gate isolation feature 214a' protrudes from the top surface of the recessed metal gate structure 260, thereby separating the metal gate structure 260 into two portions, 260a and 260b. In the present embodiments, the etching process 320 is controlled such that the trench 270 does not fully expose sidewalls of the gate isolation feature 214a'. In some embodiments, the amount of the metal gate structure 260 removed is controlled by tuning one or more parameters, such as etching duration, of the etching process 320, where a longer etching duration increases the depth of the trench 270. Furthermore, in some embodiments, performing the etching process 320 results in the top surface of the metal gate structure 260 to be lower than a top surface of the top gate spacers 222a.

Subsequently, referring to FIGS. 19A-19D, method 100 deposits a dielectric layer 272 over the structure 200, thereby filling the trench 270. In the present embodiments, the dielectric layer 272 is configured to provide self-alignment capability and etching selectivity during subsequent fabrication processes including, for example, patterning the ILD layer 232 to form S/D contact openings over the epitaxial S/D features 224. Accordingly, in the present embodiments, the dielectric layer 272 has a composition different from that of the ILD layer 232. In some embodiments, the dielectric layer 272 includes SiN, SiCN, SiOC, SiON, SiOCN, other suitable materials, or combinations thereof. The dielectric layer 272 may be deposited by any suitable method, such as ALD, CVD, PVD, other suitable methods, or combinations thereof. Subsequently, method 100 removes portions of the dielectric layer 272 formed over the ILD layer 232 in one or more CMP process, thereby planarizing the top surface of the structure 200.

At operation 128, referring to FIGS. 1B and 20A-20D, method 100 forms a gate contact 280 over a portion of the metal gate structure 260, where the gate contact 280 is configured to connect the metal gate structure 260 with one or more subsequently-formed interconnect structure (e.g., a conductive line). In some embodiments, though not depicted, the gate contact 280 includes a bulk conductive layer disposed over a barrier layer, where the bulk conductive layer may include Cu, W, Al, Co, Ru, other suitable materials, or combinations thereof and the barrier layer may include Ti, Ta, TiN, TaN, WN, other suitable materials, or combinations thereof. In some embodiments, the gate contact 280 includes additional material layer(s), such as a seed layer. In some embodiments, the barrier layer is omitted from the gate contact 280. Method 100 may form the gate contact 280 by first forming a patterned masking element (not depicted) over the structure 200 to expose a portion of the dielectric layer 272, subsequently etching the dielectric layer 272 using the patterned masking element as an etch mask to expose a portion of the metal gate structure 260 in a contact opening, forming the material layers of the gate contact 280 in the contact opening, and performing one or more CMP process to planarize the top surface of the structure 200. The various material layers of the gate contact 280 may be formed by methods including, for example, CVD, PVD, ALD, plating, other suitable methods, or combinations thereof.

Figure 21A:
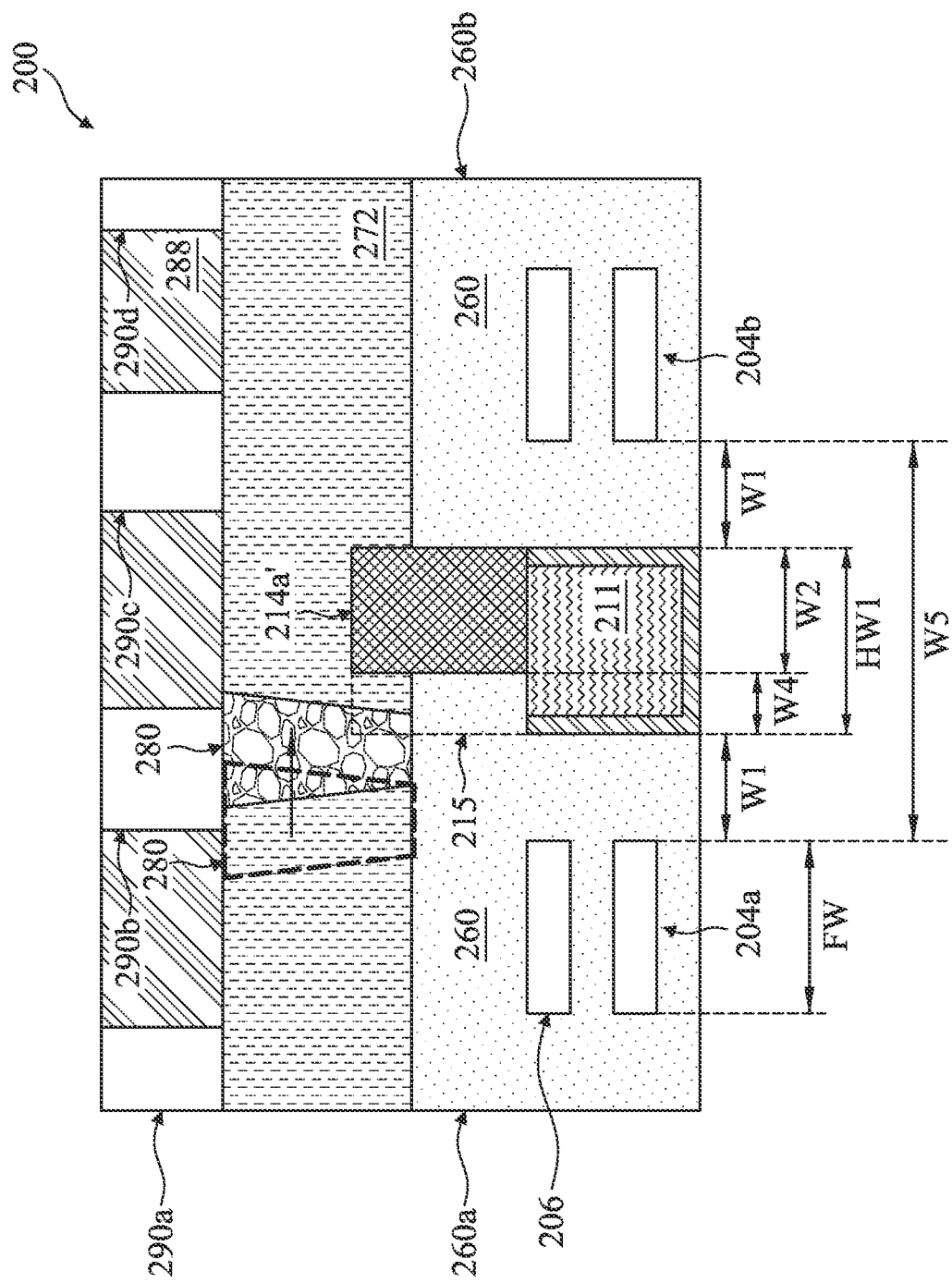
Figure 21B:
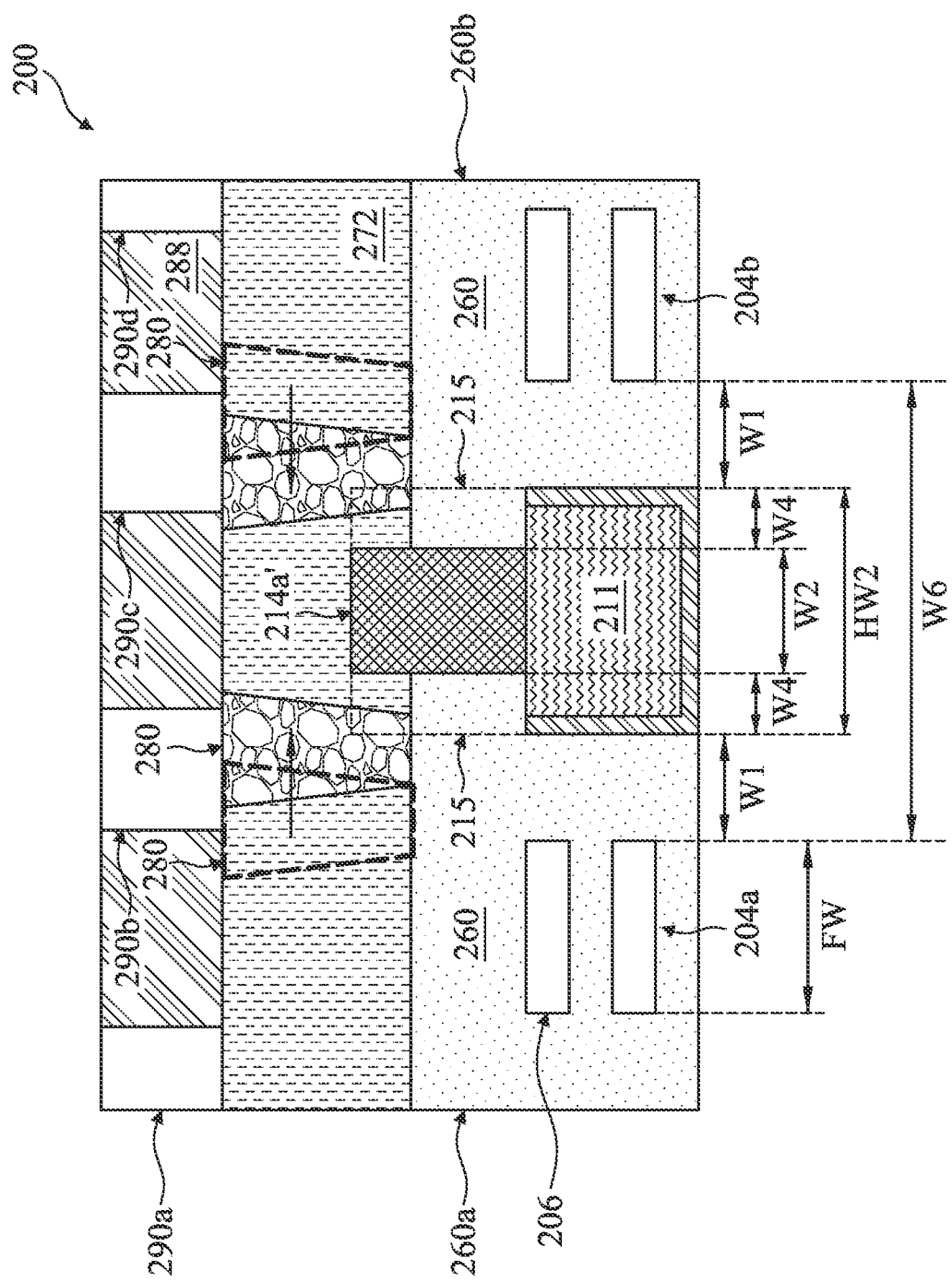

Thereafter, method 100 forms one or more conductive lines 290 (e.g., conductive lines 290a, 290b, 290c, 290d, etc., as depicted in FIGS. 21A and 21B) over the dielectric layer 282 to electrically connect the gate contact 280 with additional interconnect features. The conductive line 290 may include a bulk conductive layer (not depicted) disposed over an optional barrier layer (not depicted), where the bulk conductive layer and the barrier layer have compositions similar to those discussed above with respect to the gate contact 280. Forming the conductive lines 290 may include forming an ILD layer 288 similar to the ILD layer 232 over the dielectric layer 272, patterning the ILD layer 288 to form trenches, filling the trenches with various material layers of the conductive lines 290, and performing one or more CMP process to planarize the top surface of the structure 200. The various material layers of the conductive lines 290 may be formed by methods including, for example, CVD, PVD, ALD, plating, other suitable methods, or combinations thereof.

Figure 20B:
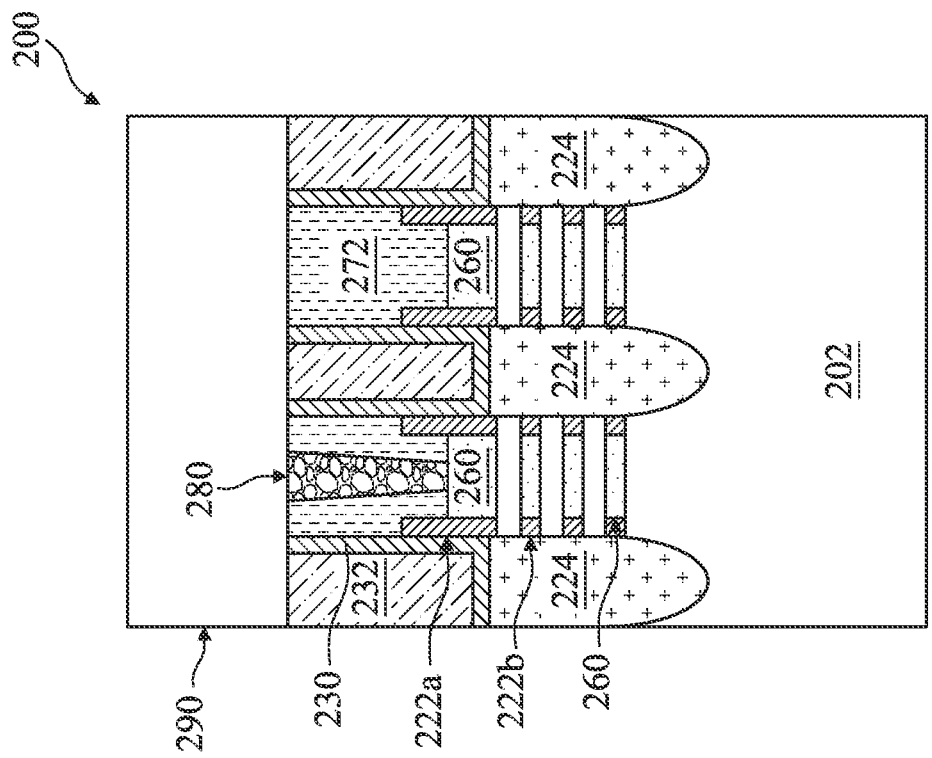
Figure 20A:
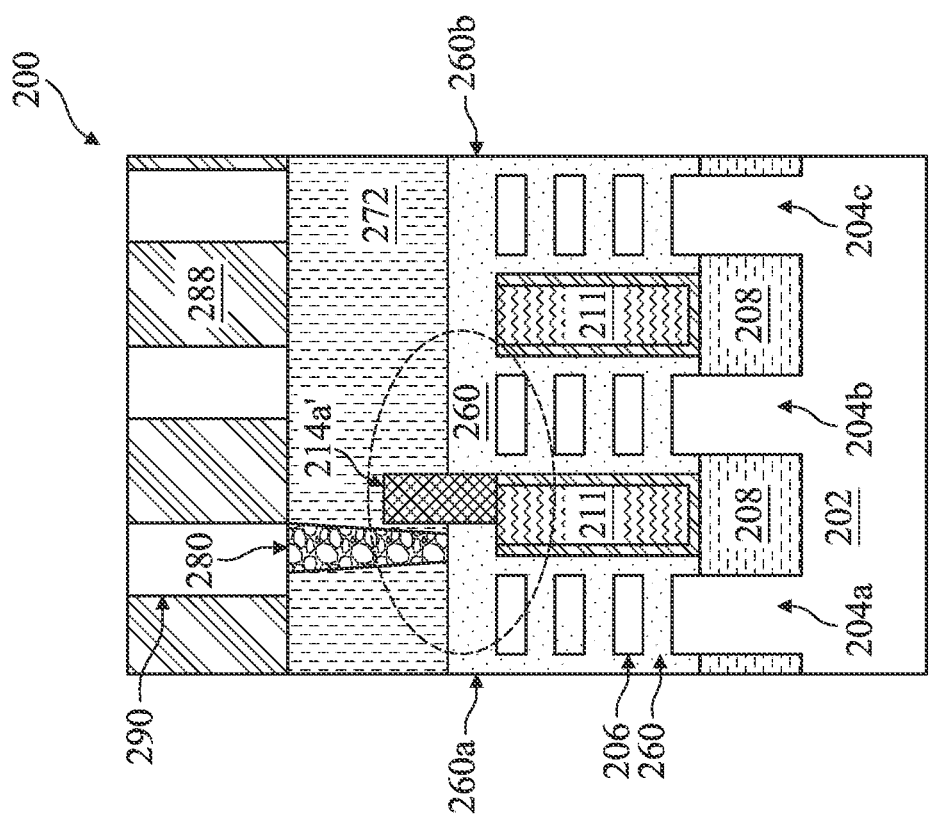
Figure 20D:
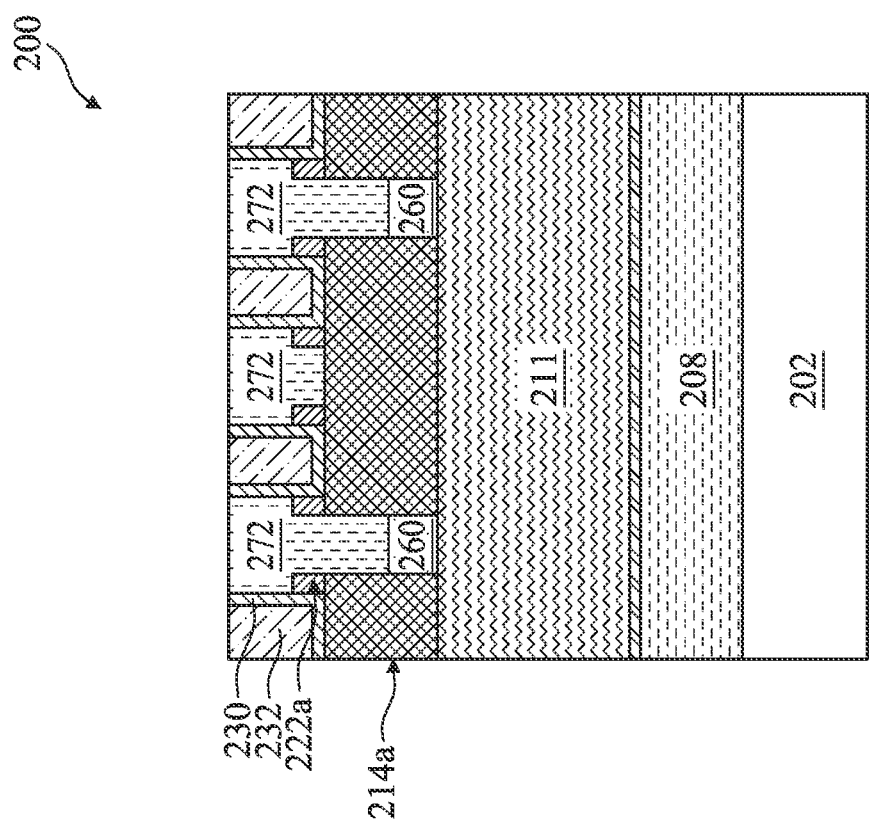
Figure 20C:
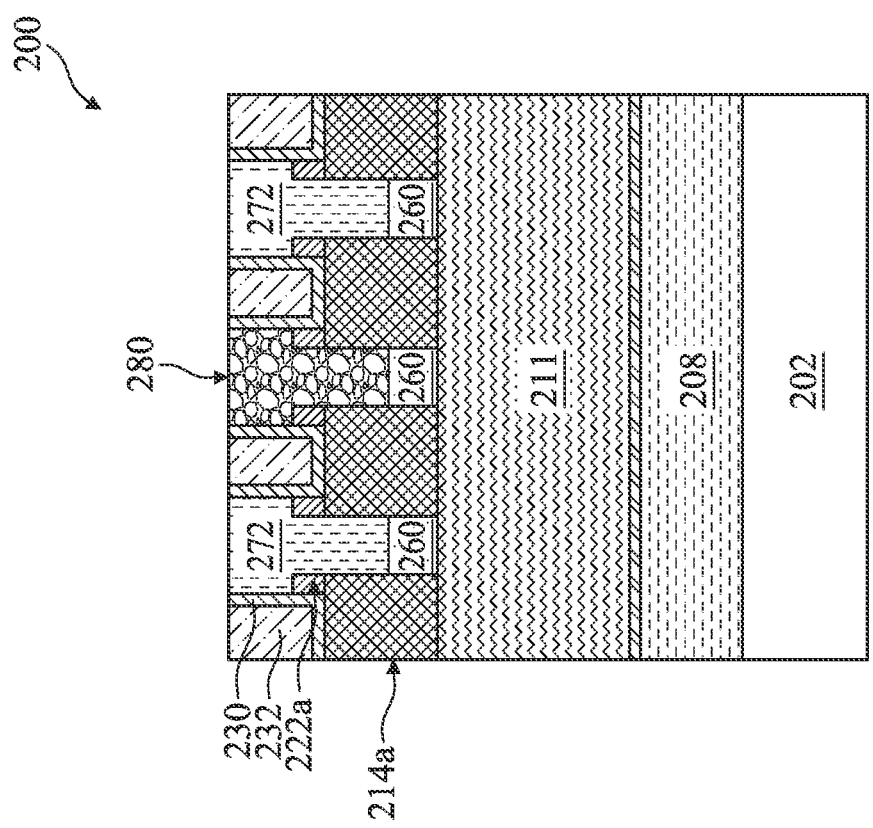

Referring to FIG. 21A, which depicts an enlarged view of a portion of FIG. 20A that corresponds to the embodiment of FIG. 13A-1, the portion of the metal gate structure 260 disposed between the sidewall of the fins 204a-204c and the isolation structures 211 (i.e., the portion that replaces the cladding layer 209) is defined by the width W1, which is the width of the cladding layer, the gate isolation feature 214a' is defined by a width W2, the removed portion 215 of the dielectric helmet 214a is defined by the width W3, and the isolation structures 211 is defined by a width HW1, which is a sum of the widths W2 and W3. Accordingly, a fin spacing W5 between sidewalls of two adjacent fins 204a-204c is defined as 2*W1+HW1. In some embodiments, the width W3 is less than the width W2. In some examples, the width W1 is approximately the same (e.g., +/−1 nm) as the width W2, which may each be at least about 13 nm. In some embodiments, referring to FIG. 21B, which depicts an arrangement alternative to that shown in FIG. 21A and corresponding to the embodiment of FIG. 13A-2, the portion 215 is removed from each side of the gate isolation feature 214a', such that a width HW2 of the isolation structures 211 is defined as W4+W4'+W2, resulting in a fin spacing W6. The fin spacings W5 and W6 may be the same or different. For a given fin spacing (i.e., W5 being the same as W6), the width W3 may be greater than each of the widths W4 and W4'. In some embodiments, the widths W3, W4, and W4' may be the same in magnitude. In some embodiments, the widths W3, W4, and W4' are each at least about 5 nm to about 9 nm. In further examples, the width HW may be about 27 nm to about 124 nm and the fin spacing W5 and W6 may each be about 53 nm to about 150 nm.

Generally, the gate contact 280 is formed over a region of the metal gate structure 260 to provide electrical contact between the metal gate structure 260 and a subsequently-formed conductive line (e.g., the M0 metallization layer), which may be formed over the structure 200 at a position according to the desired routing layout of a cell (e.g., a standard logic cell). Accordingly, direct contact between the gate contact 280 and the gate isolation feature 214a' may inadvertently increase the resistance of the structure 200 and compromise the device performance as a result. In this regard, depending on the size (e.g., height) of the cell and the width FW of each fin, there may not be enough clearance to form the gate contact 280 at a location corresponding to the conductive line without making direct contact with the gate isolation feature 214a', which leads to insufficient routing options for the cell. In the present embodiments, referring still to FIGS. 21A and 21B, the removed portion 215 of the dielectric helmet 214 enlarges the landing area of the gate contact 280 over the metal gate structure 260 by an amount corresponding to the width W3, W4, or W4', resulting in additional clearance for forming gate contacts at locations that are otherwise forbidden due to the layout of the conductive lines designated by specific design rules. For example, the arrows in FIGS. 21A and 21B indicate that the landing area of the gate contact 280 can be extended toward the gate isolation feature 214a' from one side (FIG. 21A) or from both sides (FIG. 21B), where the dashed profile indicates the allowed landing position of the gate contact 280 should the dielectric helmet 214 remain intact. In other words, the patterning of the dielectric helmet 214a allows the gate contact 280 to be formed at a position closer to the gate isolation feature 214a' than to a sidewall of the fin 204a (or 204b). In some embodiments, the enlargement of landing area for the gate contact 280 also provides processing margins for inadvertent overlay errors that are associated with forming the gate contact 280.

Figure 22A:
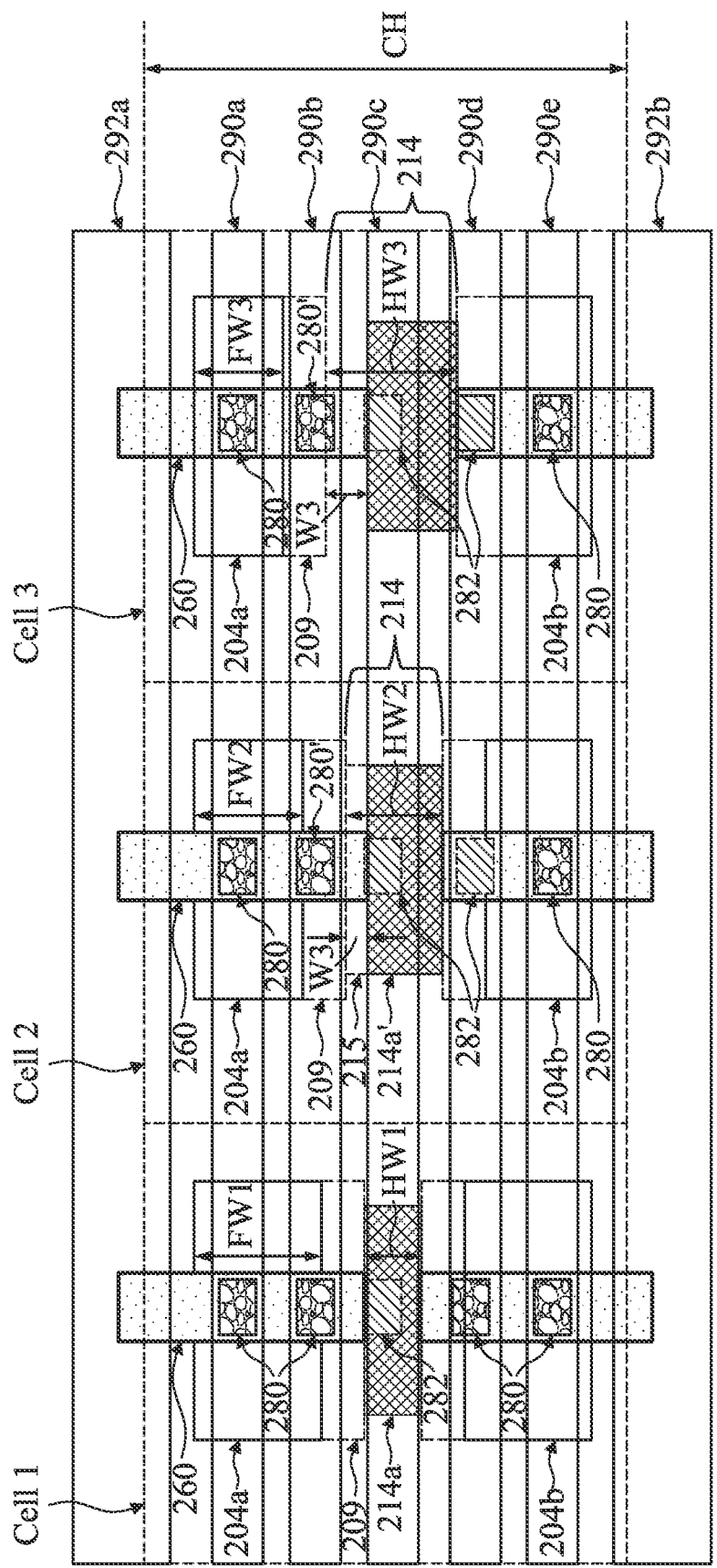

FIG. 22A depicts Cell 1, Cell 2, and Cell 3, respectively, formed as portions of the structure 200 in a planar top view, where the cells have the same cell height CH. It is noted that the cells in the depicted embodiments are not necessarily formed adjacent to each other and may be intended to perform different functions. In the depicted embodiments, Cells 1-3 include fins having different fin widths, where FW1 of Cell 1 is greater than FW2 of Cell 2, which is greater than FW3 of Cell 3, resulting in the dielectric helmet 214 of the different cells to have different widths, where HW1 of Cell 1 is less than HW2 of Cell 2, which is less than HW3 of Cell 3.

For a given cell layout of the structure 200 as depicted in FIG. 22A, gate contacts 280 are placed in allowable positions that provide routings for one or more of M0 conductive lines 290a, 290b, 290c, 290d, and 290e (i.e., conductive lines formed in the M0 metallization layer). In the depicted embodiments, conductive lines 292a and 292b may serve as additional conductive lines (e.g., power voltage supply $CV_{DD}$ or $CV_{SS}$) in subsequent metallization layers (e.g., the M1 metallization layer). The structure 200 further includes placeholder gate contacts 282 disposed in a forbidden position that does not provide routing for any of the M0 conductive lines 290a-290e. The placeholder gate contacts 282 would not be physically present in the structure 200 but are only depicted for illustration purposes. A "forbidden position" may either indicate that the gate contact would directly contact the gate isolation feature 214a' (or the dielectric helmet 214, whichever is present) or that the cell layout does not provide sufficient clearance for a photolithography patterning process to form such gate contact. By removing the portion 215 of the dielectric helmet 214 to form the gate isolation feature 214a' in each of Cells 2 and 3, additional gate contacts 280' can be accommodated in an allowable position to provide routing for at least one additional M0 conductive line 290a-290e. In this regard, Cells 2 and 3 each provide routings for three out of five of the M0 conductive lines 290a-290e, which is more than what would be allowable (see the number of the gate contacts 280 in Cells 2 and 3) if the dielectric helmet 214 remains intact (i.e., not partially removed to form the gate isolation features 214a').

In an example embodiment, for a CH of 130 nm and a width W1 of 13 nm, the fin width FW1 may be 39 nm, the fin width FW2 may be 32 nm, and the fin width FW3 may be 26 nm. Consequently, the width HW1 may be 13 nm, the width HW2 may be 27 nm, and the width HW3 may be 39 nm. In order to accommodate the placements of the gate contacts 280', the width W3 for Cell 2 is configured to be about 5 nm to about 9 nm and the width W3 for Cell 3 is configured to be 13 nm. In some examples, the cell height CH may be greater than 130 nm, such as 156 nm or 169 nm.

In some embodiments, the fin width FW is determined based on the intended function of the device. For example, an increased FW results in devices having higher speed and the corresponding cell is considered a high-performance cell (HPC), while a decreased FW results in devices having less power consumption and less leakage current. In the present embodiments, for a given CH and layout of the M0 conductive lines, decreasing FW enlarges the fin spacing and the width HW of the dielectric helmet 214. Thus, removing a portion of the dielectric helmet 214 to form the gate isolation feature 214a' allows placements of additional gate contacts 280' in positions that are otherwise forbidden due to the increased area occupied by the dielectric helmet 214. Accordingly, the magnitude of the widths W3 and W4 (and/or W4') and the position(s) of the gate contact(s) 280' depend upon factors including the cell height, the fin widths, and the layout of the conductive lines.

Figure 22B:
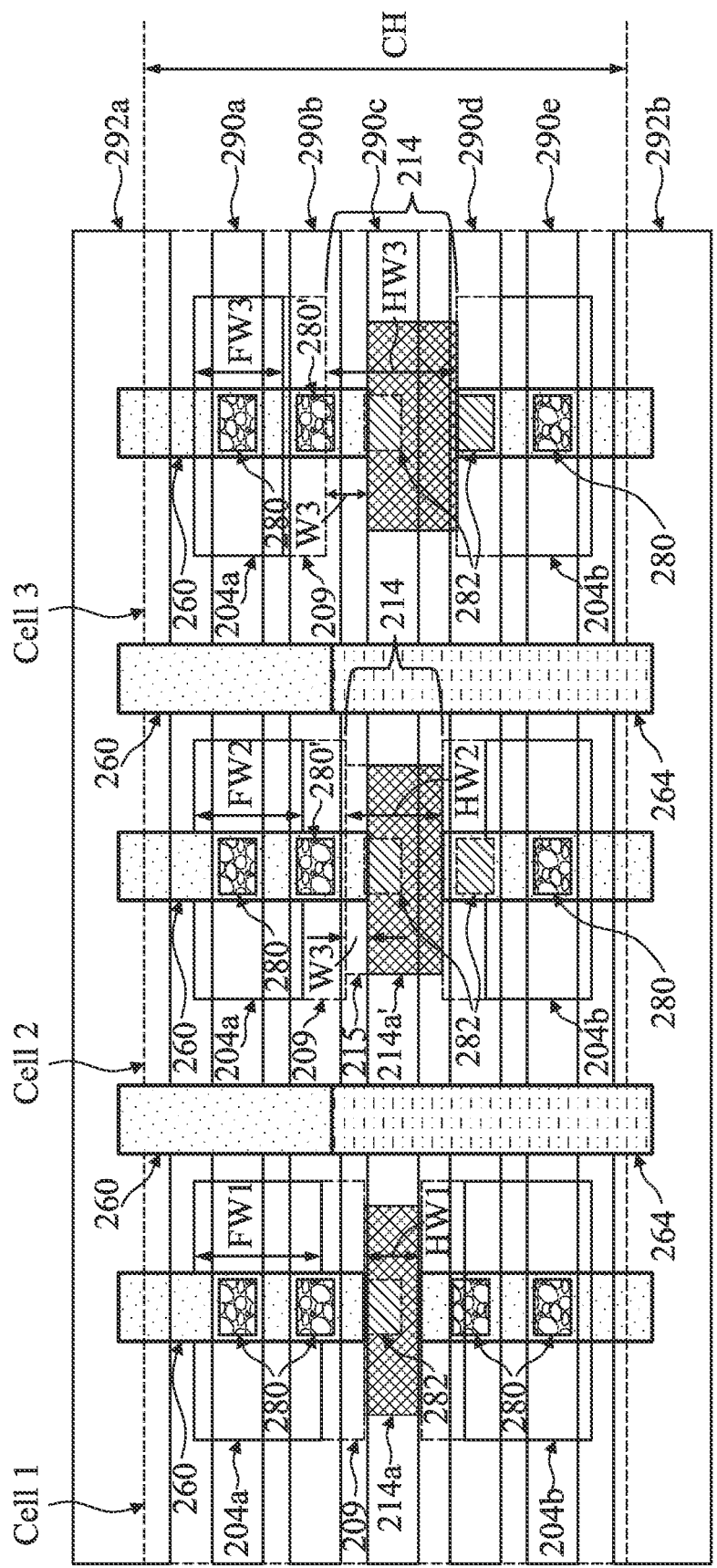

FIG. 22B illustrates an alternative embodiment similar to what is depicted in FIG. 22A. One difference in FIG. 22B is that cut polysilicon on oxide definition edge (CPODE) structures 264 are formed between Cell 1 and Cell 2, as well as between Cell 2 and Cell 3 to improve isolation between cells. In one embodiment, a CPODE structure 264 is formed by first removing a portion of the dummy gate stack 220 disposed between the adjacent cells to form a gate trench, filling the gate trench by a dielectric material (e.g., SiN), and replacing the remaining portion of the dummy gate stack 220 with the metal gate structure 260. Accordingly, in the illustrated embodiment, the CPODE structures 264 extend lengthwise along the metal gate structures 260 and the respective centerlines are aligned. As shown in the top view of FIG. 22B, the CPODE structures 264 are sandwiched between adjacent dielectric helmets 214 (or 214a') but not in direct contact.

FIG. 22B-I is a cross-sectional view of the semiconductor structure taken along line I-I, as shown in FIG. 22B. In the illustrated embodiment, the forming of the gate trench for filling the CPODE structures 264 also includes removing the channel layers 205 and the cladding layer 209 between adjacent isolation structures 211 in an etching process. The etching process may also remove a portion of the substrate 202 between the isolation features 208, such that the gate trench may extend to a position below the bottom surface of the isolation features 208. After the gate trench is filled with the dielectric material in forming the CPODE structure 264, a bottom portion of the CPODE structure 264 may be directly under the isolation features 208, and a top portion of the CPODE structure 264 may be directly above the isolation structures 211. Notably, in the cross-sectional view along line I-I, there is no dielectric helmets 214 (or 214a') above the isolation structures 211. By avoiding direct contacts between the dielectric helmets 214 (or 214a') and the CPODE structures 264, the impact of cut polysilicon jog can be mitigated.

Figure 23A:
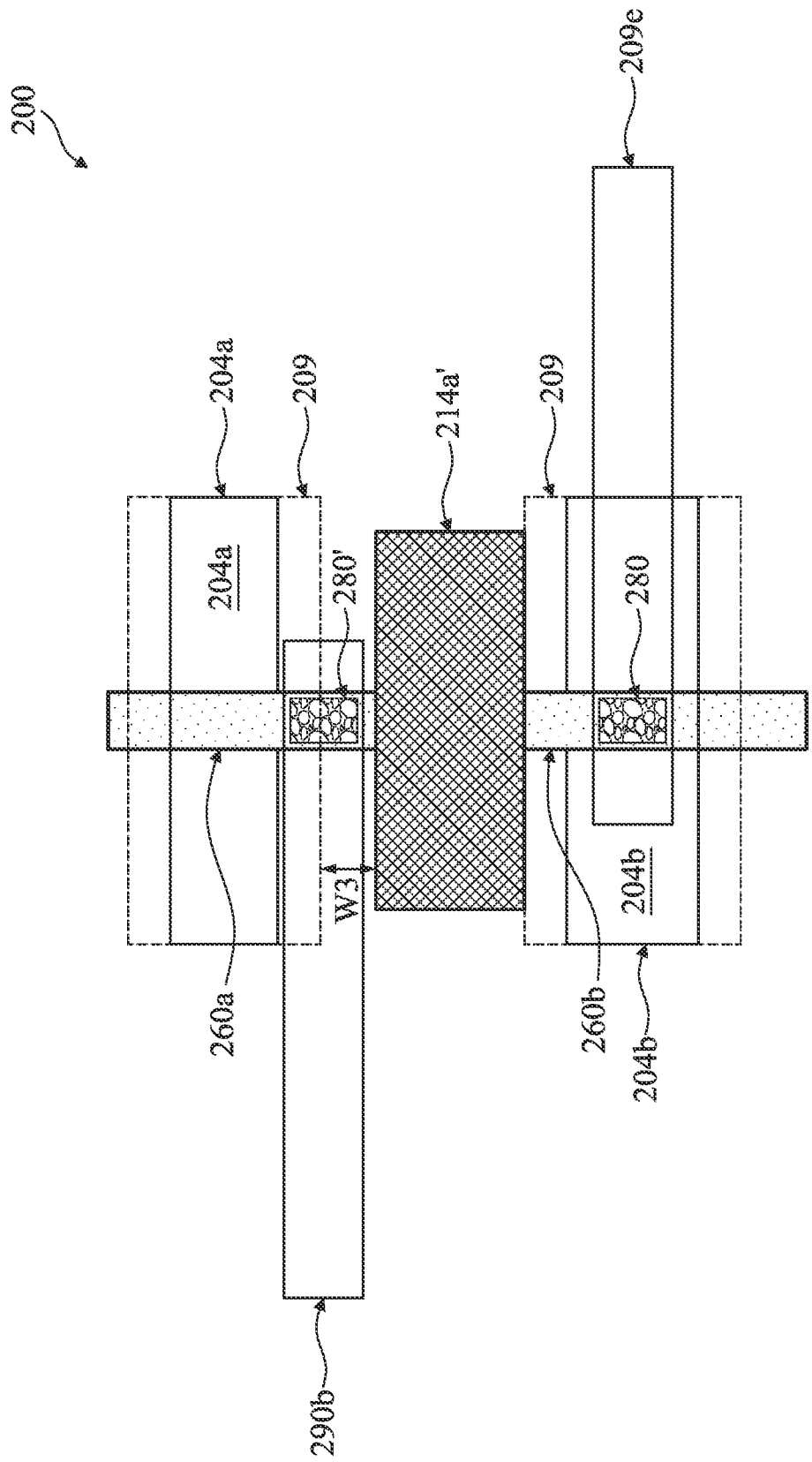
Figure 23B:
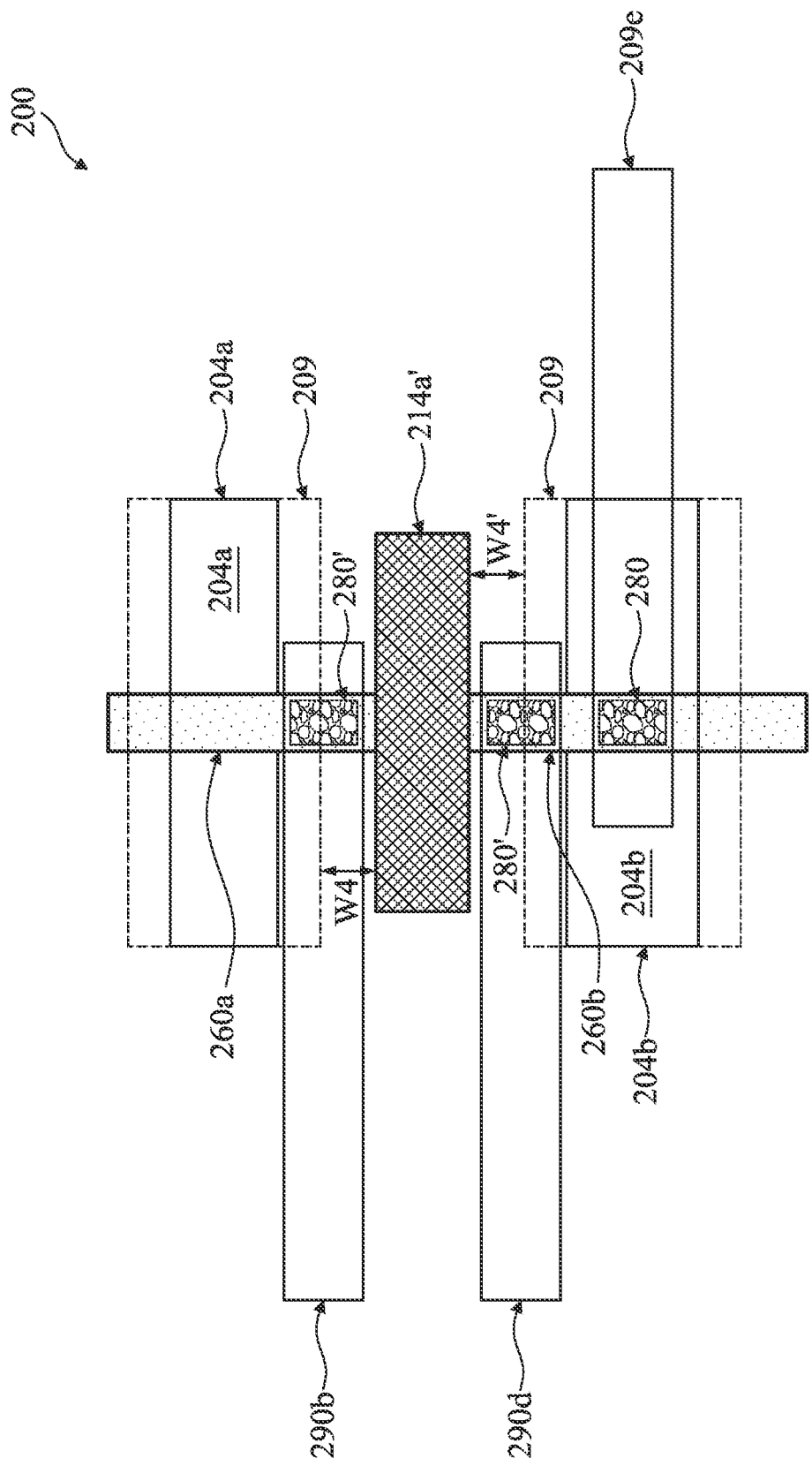

FIG. 23A is an enlarged view of a portion of Cell 2 (or Cell 3) as depicted in FIG. 22 that details the placement of the gate contacts 280 and 280' with respect to the M0 conductive lines 290b and 290e. The gate isolation feature 214a' separates the metal gate structure 260 into the portions 260a and 260b, which engage with the fins 204a and 204b, respectively, to form transistors in the cell. The transistors may be of the same conductivity type, such as either n-type or p-type, or different conductivity types, such as a combination of n-type and p-type, depending on the specific design requirement. In some embodiments, the transistors are logic devices, such as inverters, AOI, AND, NAD, OR, NOR, or OAI.

FIG. 23B is similar to FIG. 23A except that FIG. 23B depicts a two-sided removal (patterning) of the dielectric helmet 214, where FIG. 23A (as well as Cells 2 and 3 of FIG. 22) depicts a one-sided removal of the dielectric helmet 214. The two-sided removal as shown in FIG. 23B enlarges the separation distance between the gate isolation feature 214a' and the adjacent fins, providing landing area for an additional gate contact 280' that is otherwise forbidden in the structure 200 shown in FIG. 23A. In the present embodiments, each of the widths W4 and W4' needs not to be the same as the width W3, so long as the widths W3, W4, W4' each meet a minimum clearance that allows the placement of the gate contact 280' in proximity to the gate isolation feature 214a'. In some examples, the widths W3, W4, and W4' are each at least about 5 nm to about 9 nm.

Thereafter, method 100 at operation 130 performs additional fabrication processes to the structure 200, such as forming a multi-layer interconnect (MLI) structure (not depicted) thereover. The MLI may include various interconnect features, such as vias and additional conductive lines, disposed in dielectric layers, such as ESLs and ILD layers. In some embodiments, the vias are vertical interconnect features configured to interconnect a device-level contact, such as an S/D contact (not depicted) or the gate contact 280a, with a conductive line or interconnect different conductive lines, which are horizontal interconnect features. The ESLs and the ILD layers of the MLI may have substantially same compositions as those discussed above with respect to the ESL 230 and the ILD layer 232, respectively. The vias and the conductive lines may each include any suitable conductive material, such as Co, W, Ru, Cu, Al, Ti, Ni, Au, Pt, Pd, a metal silicide, other suitable conductive materials, or combinations thereof, and be formed by a series of patterning and deposition processes. Additionally, each via and conductive line may additionally include a barrier layer that comprises TiN and/or TaN.

Although not intended to be limiting, one or more embodiments of the present disclosure provide many benefits to a semiconductor device and the formation thereof. For example, the present disclosure provides a gate isolation feature, and methods of forming the same, disposed between two active device regions (e.g., fins). In the present embodiments, the gate isolation feature is formed by patterning a dielectric helmet disposed between two adjacent fins, such that after performing a gate replacement process to form a metal gate structure, the landing area over which a gate contact can be positioned over the metal gate structure increases. Furthermore, for a given cell layout where various interconnect conductive lines are placed according to specific design rules, increasing the available landing area allows additional gate contacts to be formed at otherwise forbidden positions due their proximity to the gate isolation features, thereby providing additional routing options for the interconnect conductive lines. In addition, the patterning of the dielectric helmet may be tailored to various cell sizes and fin widths to further improve routing options for devices of different functions (e.g., HPCs and low-leakage devices). Embodiments of the disclosed methods can be readily integrated into existing processes and technologies for manufacturing NS FETs and/or other suitable devices.

Figure 24:
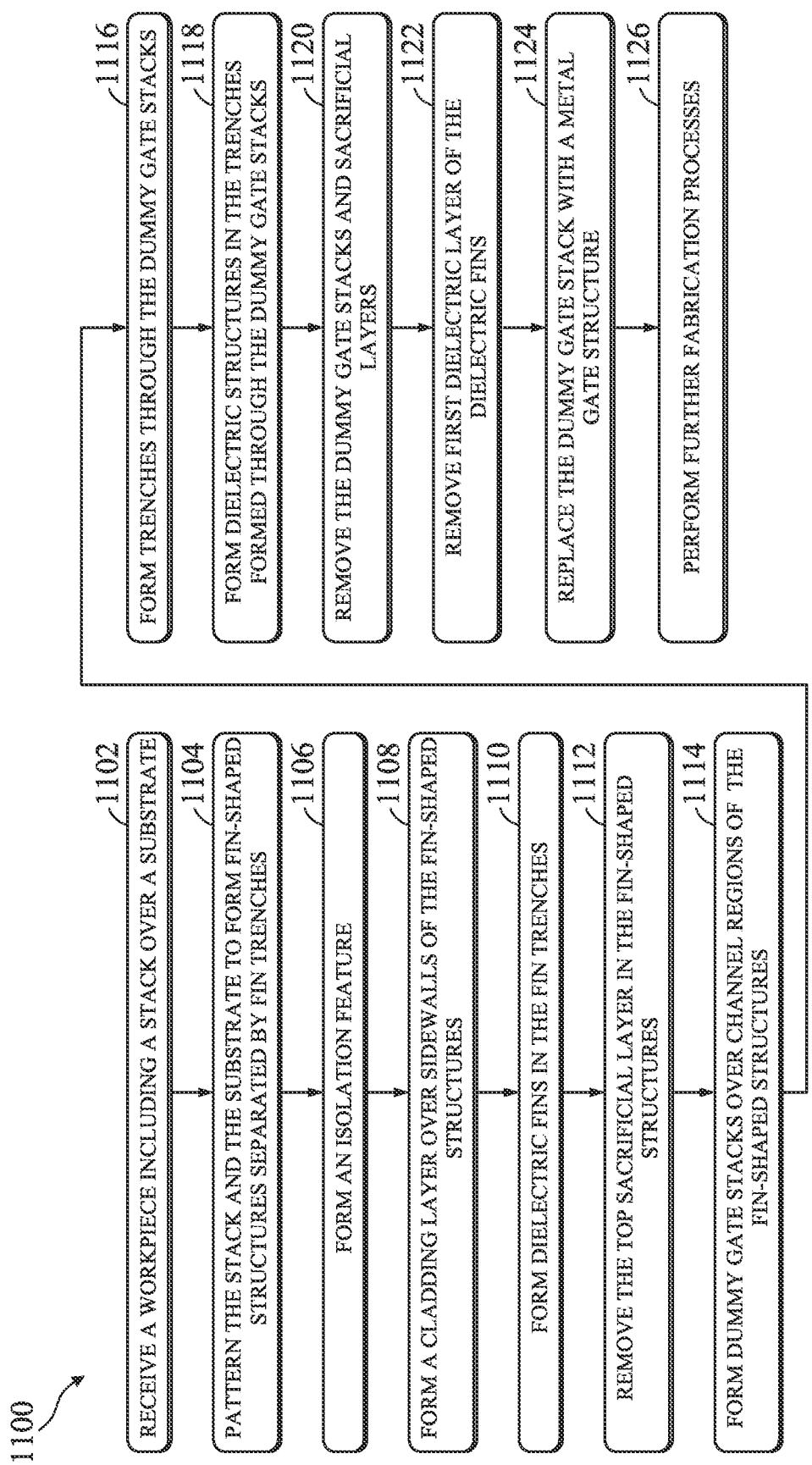
FIG. 24 illustrates a flow chart of a method for forming a semiconductor device with gate isolation structures formed from a backside of the semiconductor device, according to one or more aspects of the present disclosure.
Figures 25A, 25B:
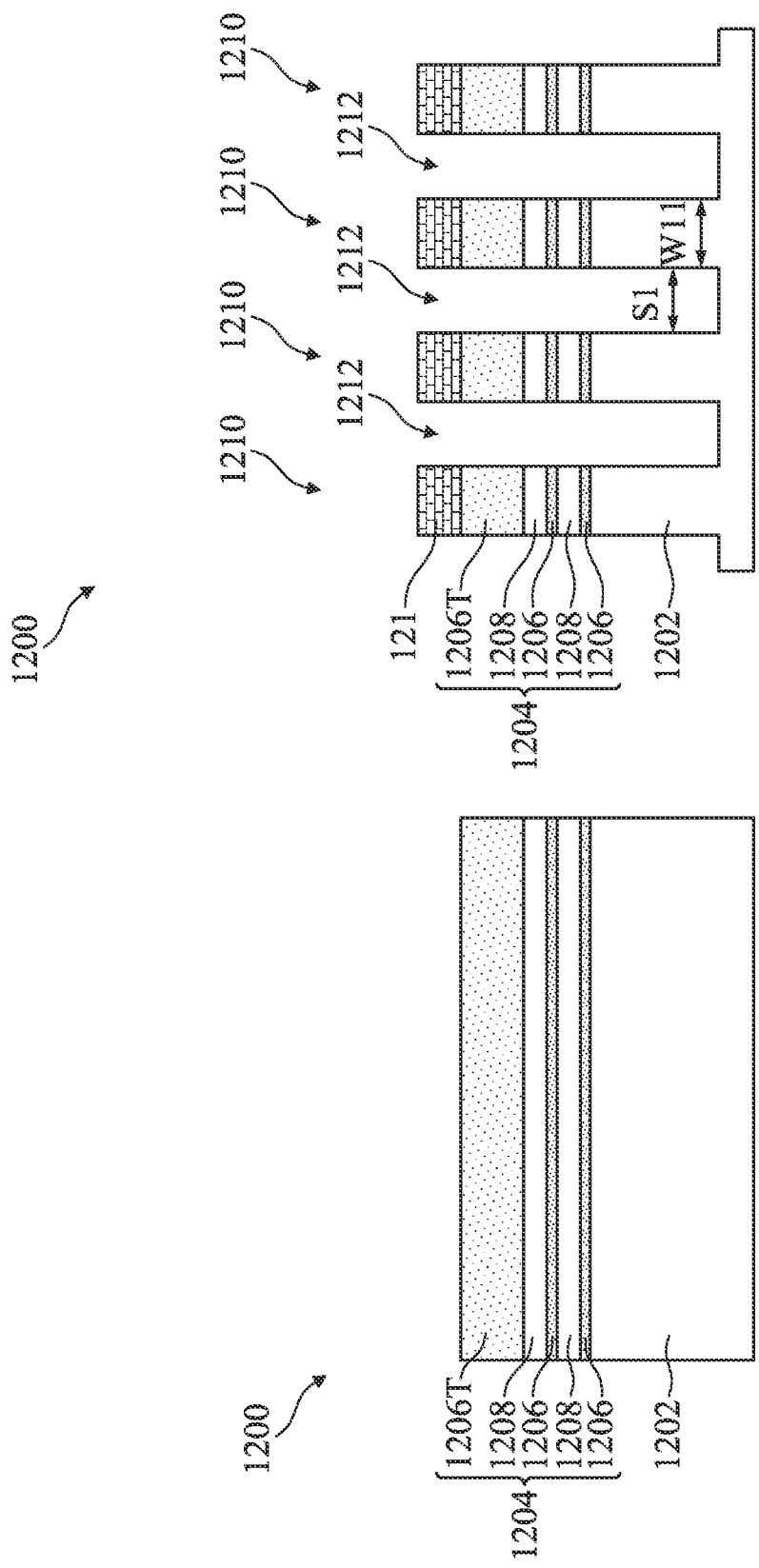
Figures 25E, 25F:
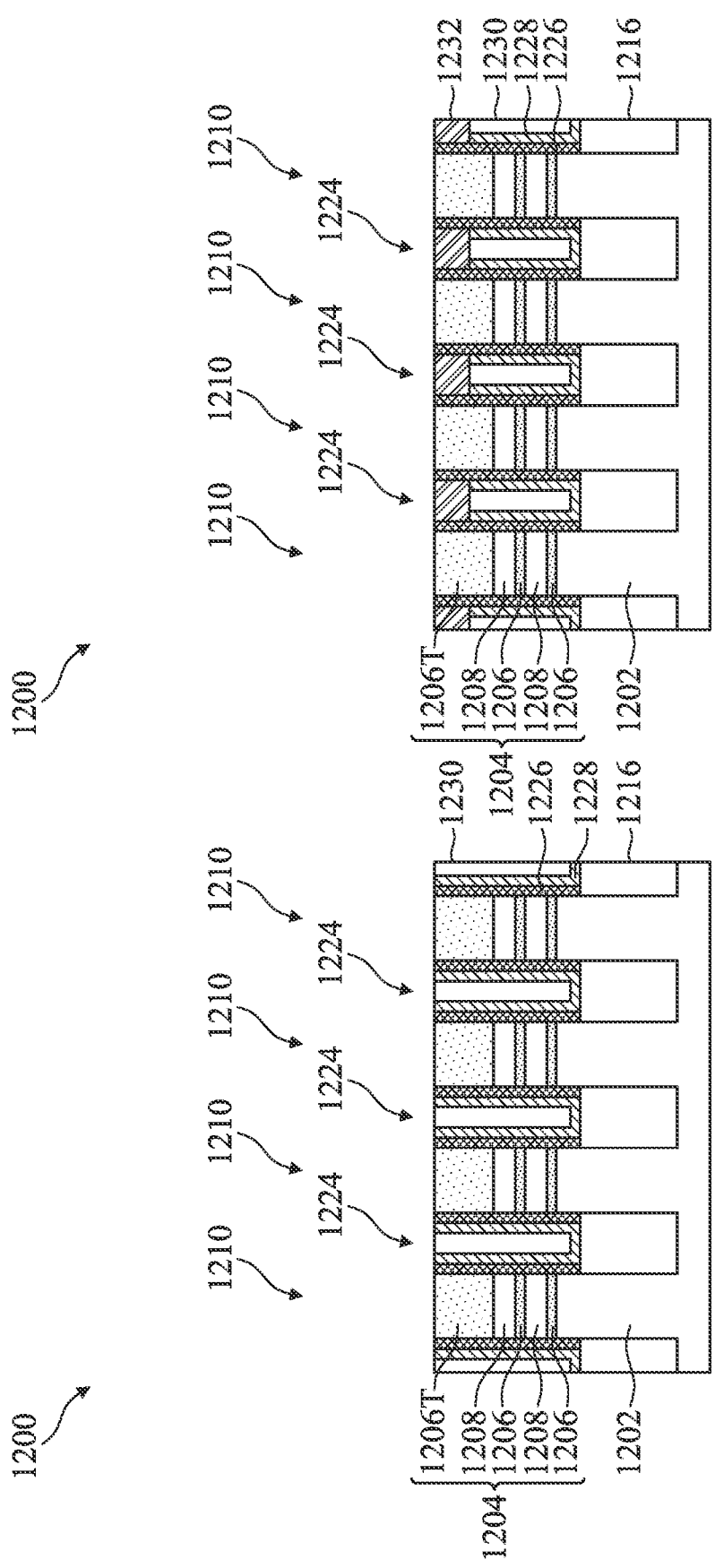
Figures 25G, 25H:
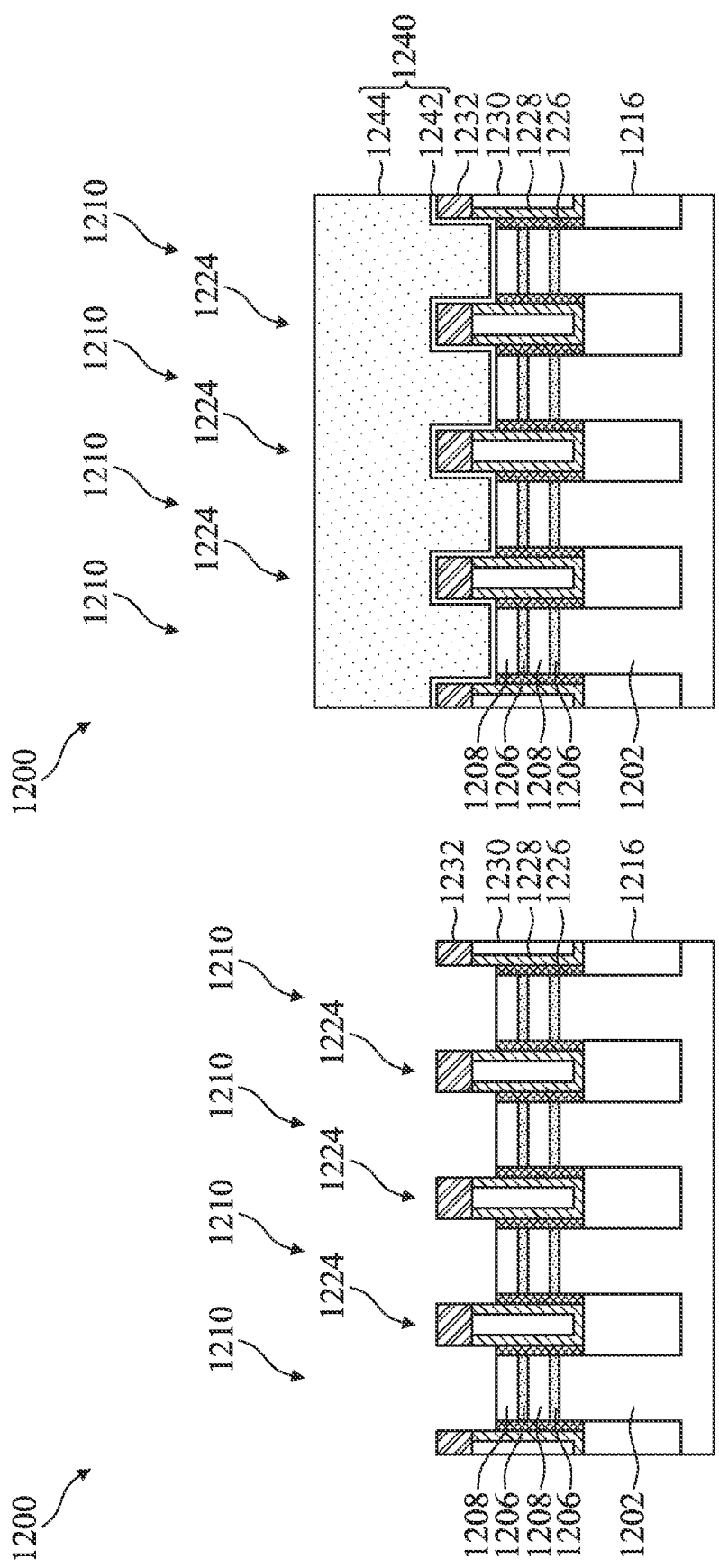
Figures 25K, 25L:
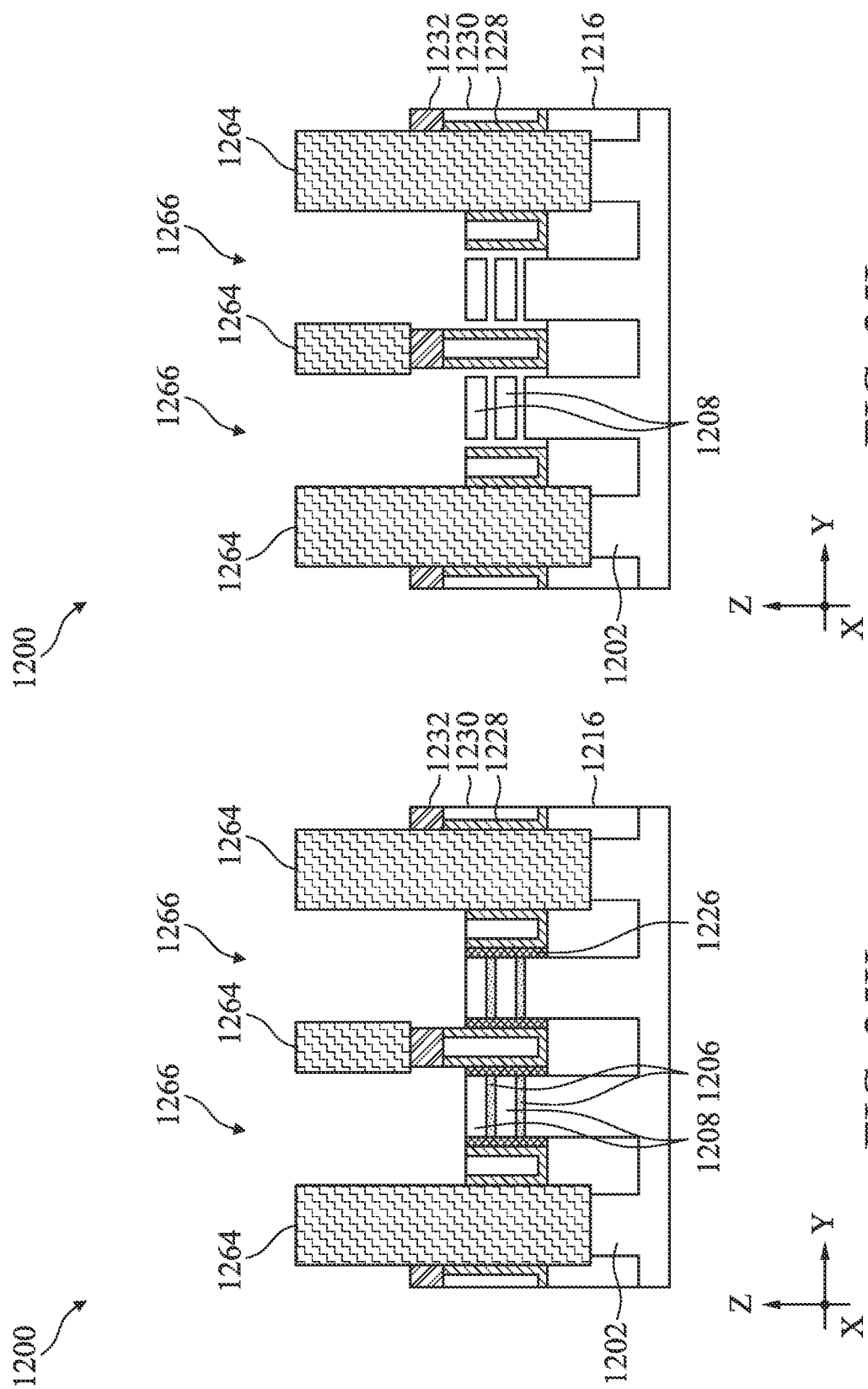
Figures 25O, 25P:
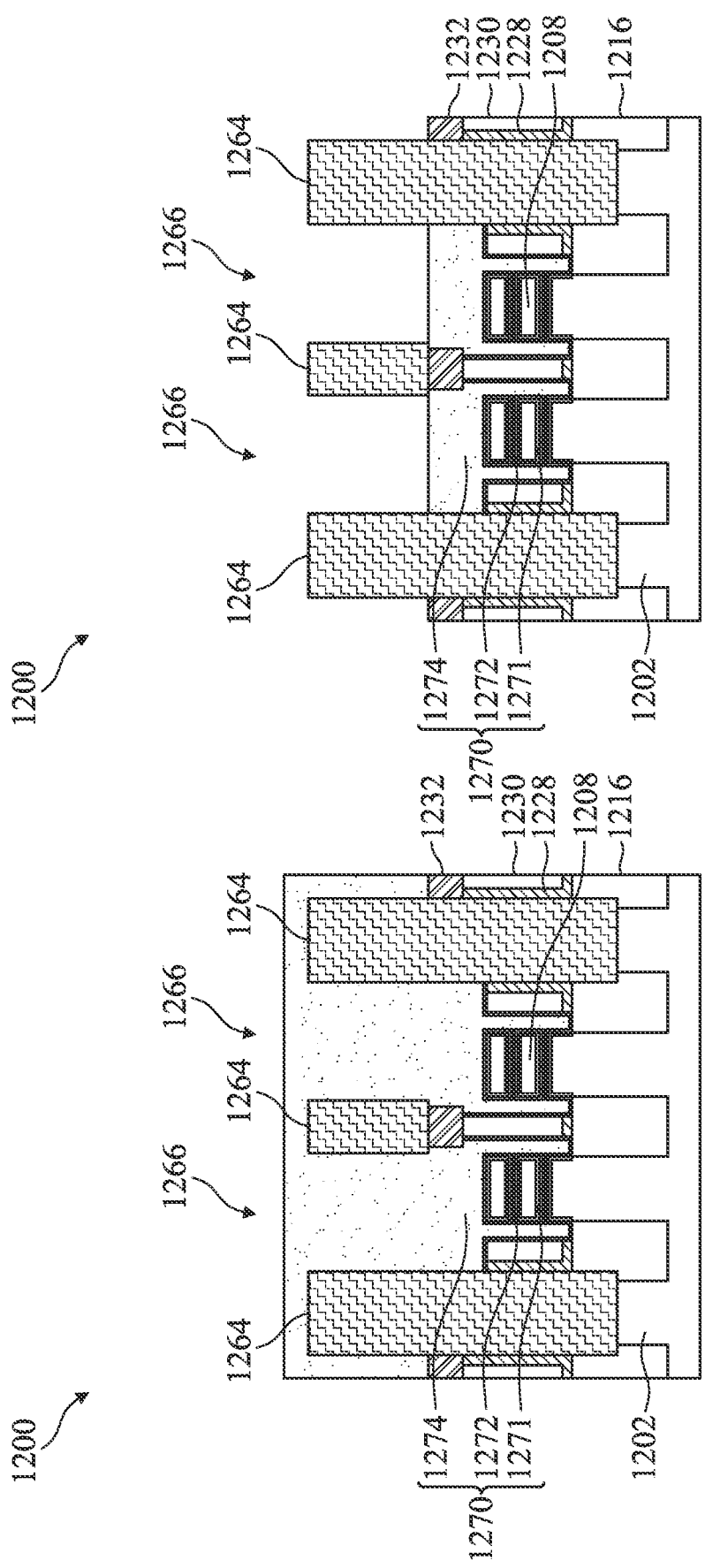
Figure 26:
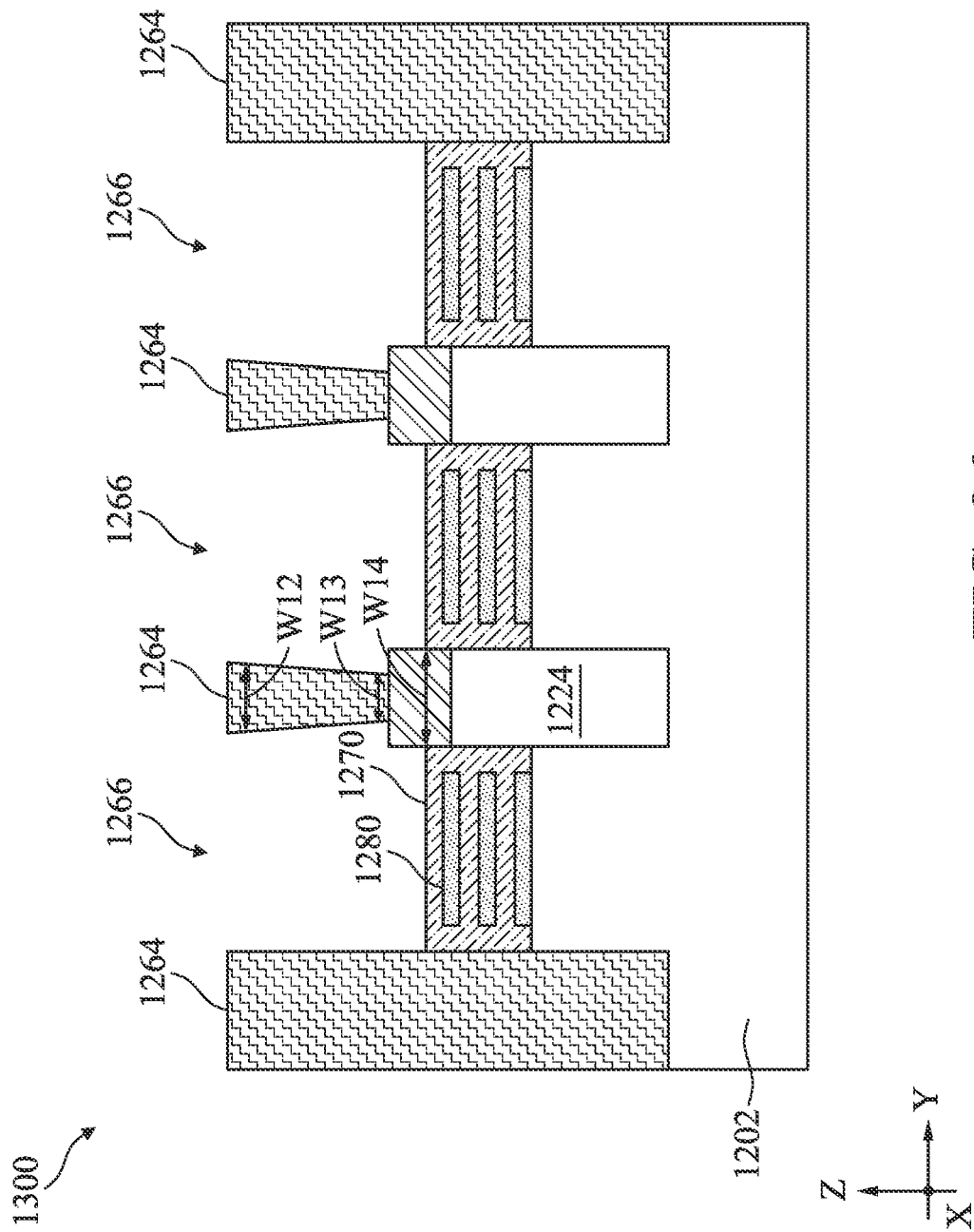
FIG. 26 is a cross-sectional view in a channel region of a workpiece of an exemplary device formed according to the methods of FIG. 24, according to one or more aspects of the present disclosure.

Additional embodiments of the present disclosure are described with respect to FIGS. 24-26. The separation of embodiments is not intended to be limiting but to provide an illustration of additional aspects of the present disclosure. As such, these embodiments may be implemented concurrently with, or separately from, the embodiments discussed above and may provide additional benefits as will be described further below.

FIG. 24 illustrates a flowchart of a method 1100 of forming a semiconductor device. The method 1100 is merely an example and is not intended to limit the present disclosure to what is explicitly illustrated in the method 1100. Additional steps may be provided before, during and after the method 1100, and some steps described can be replaced, eliminated, or moved around for additional embodiments of the method. Not all steps are described herein in detail for reasons of simplicity. The method 1100 is described below in conjunction with FIGS. 2A-2O, which illustrate fragmentary cross-sectional views of a workpiece 1200 at different stages of fabrication according to embodiments of the method 1100. Because a semiconductor device will be formed from the workpiece 1200, the workpiece 1200 may be referred to as a semiconductor device 1200 or a device 1200 as the context requires. Throughout FIGS. 2A-2O, the X direction, the Y direction, and the Z direction are perpendicular to one another and are used consistently. Additionally, throughout the present disclosure, like reference numerals are used to denote like features.

Referring to FIG. 25A, the method 1100 includes a block 1102 where a workpiece 1200 is received. The workpiece 1200 includes a substrate 1202 and a stack 1204 disposed on the substrate 1202. In one embodiment, the substrate 1202 may be a silicon (Si) substrate. In some other embodiments, the substrate 1202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 1202 may include multiple n-type well regions and multiple p-type well regions. A p-type well region may be doped with a p-type dopant (i.e., boron (B)). An n-type well region may be doped with an n-type dopant (i.e., phosphorus (P) or arsenic (As)).

In some embodiments represented in FIG. 25A, the stack 1204 may include alternating channel layers 1208 and sacrificial layers 1206 over the substrate 1202, and a top sacrificial layer 1206T over the sacrificial layers 1206 and the channel layers 1208. The top sacrificial layer 1206T, the sacrificial layers 1206, and the channel layers 1208 may be deposited using an epitaxial process. Example epitaxial process may include vapor-phase epitaxy (VPE), ultra-high vacuum CVD (UHV-CVD)), molecular beam epitaxy (MBE), and/or other suitable processes. The channel layers 1208 and the sacrificial layers 1206 may have different semiconductor compositions. In some implementations, the channel layers 1208 are formed of silicon (Si) and sacrificial layers 1206 are formed of silicon germanium (SiGe). The additional germanium (Ge) content in the sacrificial layers 1206 allow selective removal or recess of the sacrificial layers 1206 without substantial damages to the channel layers 1208. The sacrificial layers 1206 and the channel layers 1208 are disposed alternatingly such that the sacrificial layers 1206 interleave the channel layers 1208. FIG. 25A illustrates that two (2) layers of the sacrificial layers 1206 and two (2) layers of the channel layers 1208 are alternately and vertically arranged, which is for illustrative purposes only and not intended to be limiting beyond what is specifically recited in the claims. The number of layers depends on the desired number of channel members 1208 for the semiconductor device 1200. In some embodiments, the number of the channel layers 1208 is between 1 and 6.

Like the sacrificial layers 1206, the top sacrificial layer 1206T may be formed of silicon germanium (SiGe). In some instances, compositions of the sacrificial layers 1206 and the top sacrificial layer 1206T are substantially the same. In some instances, the top sacrificial layer 1206T may be the same thickness as the sacrificial layers 1206. In some other instances, the top sacrificial layer 1206T may be thicker than the sacrificial layers 1206 and functions to protect the stack 1204 from damages during fabrication processes. In some instances, a thickness of the top sacrificial layer 1206T may be between about 20 nm and about 40 nm while a thickness of a sacrificial layer 1206 may be between about 4 nm and about 15 nm.

Referring to FIG. 25B, the method 1100 includes a block 1104 where the stack 1204 is patterned to form fin-shaped structures 1210 separated by fin trenches 1212. To pattern the stack 1204, a hard mask layer 1214 is deposited over the top sacrificial layer 1206T. The hard mask layer 1214 is then patterned to serve as an etch mask to pattern the top sacrificial layer 1206T, the interleaved sacrificial layers 1206 and channel layers 1208, and a top portion of the substrate 1202. In some embodiments, the hard mask layer 1214 may be deposited using CVD, plasma-enhanced CVD (PECVD, atomic layer deposition (ALD), plasma-enhanced ALD (PEALD), or a suitable deposition method. The hard mask layer 1214 may be a single layer or a multi-layer. When the hard mask layer 1214 is a multi-layer, the hard mask layer 1214 may include a pad oxide and a pad nitride layer. In an alternative embodiment, the hard mask layer 1214 may include silicon (Si). The fin-shaped structures 1210 may be patterned using suitable processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the hard mask layer 1214 and then the patterned hard mask layer 1214 may be used as an etch mask to etch the stack 1204 to form fin-shaped structures 1210. The etching process can include dry etching, wet etching, reactive ion etching (RIE), and/or other suitable processes.

As shown in FIG. 25B, the fin-shaped structures 1210 extend lengthwise along the X direction and extend vertically along the Z direction from the substrate 1202. Along the Y direction, the fin-shaped structures 1210 are separated by fin trenches 1212. Each of the fin trenches 1212 may define the same or different spacings between adjacent fin-shaped structures 1210. The fin trenches 1212 define a spacing S1. In some instances, the spacing S1 is about 22 nm to about 30 nm. The fin-shaped structure 1210 has a width W11. In some instances, the width W11 is about 2 nm to about 55 nm. In some examples, the fin-shaped structures 1210 may be short channel devices where W11 is about 2 nm to about 5 nm. In some other examples, the fin-shaped structures 1210 may be long channel devices where W11 is about 45 nm to about 55 nm. In some embodiments of the present disclosure, workpiece 1200 may include both short channel devices and long channel devices.

Referring to FIG. 25C, the method 1100 includes a block 1106 where an isolation feature 1216 is formed in the fin trenches 1212. The isolation feature 1216 may be referred to as a shallow trench isolation (STI) feature 1216. In an example process to form the isolation feature 1216, a dielectric material is deposited over the workpiece 1200, filling the fin trenches 1212 with the dielectric material. In some embodiments, the dielectric material may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In various examples, at block 1106, the dielectric material may be deposited by flowable CVD (FCVD), spin-on coating, and/or other suitable process. The deposited dielectric material is then thinned and planarized, for example by a chemical mechanical polishing (CMP) process, until the hard mask layer 1214 is exposed. After the planarization, the deposited dielectric material is recessed in an etching-back process until the top portions of the fin-shaped structures 1210, particularly the sacrificial layers 1206 and the channel layers 1208, rise above the isolation feature 1216. The hard mask layer 1214 may also be removed in the etching-back process. In the illustrated embodiment, a top portion of the substrate 1202 may also rise above the isolation feature 1216, as shown in FIG. 25C. At this point, a bottom portion of the fin-shaped structures 1210 are surrounded by the isolation features 1216. The isolation feature 1216 reduces the depths of the fin trenches 1212.

Referring to FIG. 25D, the method 1100 includes a block 1108 where a cladding layer 1226 is deposited on sidewalls of the fin-shaped structures 1210. In some embodiments, the cladding layer 1226 may have a composition similar to that of the sacrificial layers 1206 or the top sacrificial layer 1206T. In one example, the cladding layer 1226 may be formed of silicon germanium (SiGe). Their common composition allows selective and simultaneous removal of the sacrificial layers 1206 and the cladding layer 1226 in a subsequent etching process. In some embodiments, the cladding layer 1226 may be conformally and epitaxially grown as a blanket layer on the workpiece 1200 using vapor phase epitaxy (VPE) or molecular beam epitaxy (MBE). Depending on the extent of the selective growth of the cladding layer 1226, an etching-back process may be performed to expose the isolation feature 1216.

Referring to FIGS. 2E and 2F, the method 1100 includes a block 1110 where dielectric fins 1224 are formed in the fin trenches 1212. An example process to form the dielectric fin 1224 includes conformally depositing a first dielectric layer 1228 and subsequently depositing a second dielectric layer 1230 into the fin trenches 1212. The second dielectric layer 1230 is surrounded by the first dielectric layer 1228. The first dielectric layer 1228 may be conformally deposited using CVD, ALD, or a suitable method. The first dielectric layer 1228 lines the sidewalls and the bottom surfaces of the fin trenches 1212. The second dielectric layer 1230 is then deposited over the first dielectric layer 1228 using CVD, high density plasma CVD (HDPCVD), and/or other suitable process. In some instances, a dielectric constant of the second dielectric layer 1230 is smaller than that of the first dielectric layer 1228. The first dielectric layer 1228 may include silicon, silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, or a suitable dielectric material. In one embodiment, the first dielectric layer 1228 includes aluminum oxide. The second dielectric layer 1230 may include silicon oxide, silicon carbide, silicon oxynitride, silicon oxycarbonitride, or a suitable dielectric material. In one embodiment, the second dielectric layer 1230 includes silicon oxide.

Operations at the block 1110 may etch back the dielectric layers 1228 and 1230 to expose again a top portion of the fin trenches 1212. The etch back process may include a dry etching process that uses oxygen, nitrogen, a fluorine-containing gas (e.g., CF4, SF6, CH2F2, CHF3, and/or C2F6), a chlorine-containing gas (e.g., Cl2, CHCl3, CCl4, and/or BCl3), a bromine-containing gas (e.g., HBr and/or CHBr3), an iodine-containing gas, other suitable gases and/or plasmas, and/or combinations thereof. Subsequently, a third dielectric layer 1232 is deposited above the dielectric layers 1228 and 1230 using CVD, high density plasma CVD (HDPCVD), and/or other suitable process. The third dielectric layer 1232 includes a high-K dielectric material (e.g., k>7) and is also referred to as the high-K dielectric layer 1232. In some embodiments, the high-K dielectric layer 1232 may include hafnium oxide (HfO2), zirconium oxide (ZrO2), hafnium aluminum oxide (HfAlOx), hafnium silicate (HfSiOx), aluminum oxide (Al2O3), or other suitable high-K dielectric material. After the deposition of the dielectric layer 1232, the workpiece 1200 is planarized using a chemical mechanical polishing (CMP) process to expose the top sacrificial layer 1206T. As shown in FIG. 25F, upon conclusion of the CMP process, the dielectric layers 1228, 1230, and 1232 collectively define the dielectric fins 1224 in the fin trenches 1212.

Referring to FIG. 25G, the method 1100 includes a block 1112 where the top sacrificial layers 1206T in the fin-shaped structures 1210 are removed. At the block 1112, the workpiece 1200 is etched to selectively remove the top sacrificial layer 1206T and a portion of the cladding layer 1226 to expose the topmost channel layer 1208, without substantially damaging the dielectric fins 1224. In some instances, because the top sacrificial layer 1206T and the cladding layer 1226 are formed of silicon germanium (SiGe), the etching process at the block 1112 may be selective to silicon germanium (SiGe). For example, the cladding layer 1226 and the top sacrificial layer 1206T may be etched using a selective wet etching process that includes ammonium hydroxide (NH4OH), hydrogen fluoride (HF), hydrogen peroxide (H2O2), or a combination thereof. After the removal of the top sacrificial layer 1206T and a portion of the cladding layer 1226, the dielectric fins 1224, particularly the third dielectric layer 1232, rise above the topmost channel layer 1208.

Referring to FIG. 25H, the method 1100 includes a block 1114 where dummy gate stacks 1240 are formed over the channel regions of the fin-shaped structures 1210. In some embodiments, a gate replacement process (or gate-last process) is adopted where the dummy gate stacks 1240 serve as a placeholder for functional gate structures. Other processes and configuration are possible. In the illustrated embodiment, the dummy gate stack 1240 includes a dummy dielectric layer 1242 and a dummy electrode 1244 disposed over the dummy dielectric layer 1242. The regions of the fin-shaped structures 1210 underlying the dummy gate stacks 1240 may be referred to as channel regions. Each of the channel regions in a fin-shaped structure 1210 is sandwiched between two source/drain regions for source/drain formation. In an example process, the dummy dielectric layer 1242 is blanketly deposited over the workpiece 1200 by CVD. A material layer for the dummy electrode 1244 is then blanketly deposited over the dummy dielectric layer 1242. The dummy dielectric layer 1242 and the material layer for the dummy electrode 1244 are then patterned using photolithography processes to form the dummy gate stacks 1240. In some embodiments, the dummy dielectric layer 1242 may include silicon oxide and the dummy electrode 1244 may include polycrystalline silicon (polysilicon).

Referring to FIG. 25I, the method 1100 includes a block 1116 where portion of the dummy gate stack 1240 and selected fin-shaped structures 1210 are selectively removed. A cut poly (CPO) process may be used to remove the portions of the dummy gate stack 1240. The CPO process may include forming a patterned mask over the dummy gate stack 1240 having openings to expose the regions to be removed during the CPO process. The CPO process may be a selective wet etching process, a selective dry etching process, or a combination thereof. In the depicted embodiment, the selective etching process is an anisotropic etching that selectively removes the dummy dielectric layer 1242 and the dummy electrode 1244 along the Z direction without substantially etching the dummy dielectric layer 1242 and the dummy electrode 1244 along the Y direction and without substantially etching the third dielectric layer 1232 along either the Z direction or along the Y direction. The CPO process results in trenches 1262 being formed over selected fin-shaped structures 1210 and trench 1263 being formed over selected dielectric fins 1224. After performing the CPO process, a top portion of the selected fin-shaped structures 1210 is exposed in trenches 1262 and a top portion of the dielectric fin, including third dielectric layer 1232, is exposed in trench 1263. In the depicted embodiment, trenches 1262 are formed over the outer fin-shaped structures 1210 and trench 1263 is formed over the center dielectric fin 1224. This is for illustrative purposes and is not intended to be limiting. As illustrated, trench 1263 has a same width as the top dielectric layer 1232 of the selected dielectric fin 1224. However, in some embodiments, trench 1263 may have a smaller width than the top dielectric layer 1232. In some embodiments, a top portion of trench 1263 may have a larger width than a bottom portion of trench 1263, as illustrated in FIG. 1256. That is, due to the etching process, the opening of trench 1263 may be wider than the top dielectric layer 1232 and the bottom portion of trench 1263 may be narrower than the top dielectric layer 1232. The top dielectric layer 1232 acts as an etch stop preventing trench 1263 from etching the dummy gate stack 1240 on either side of the dielectric fin 1224.

A channel etching process may be used to further etch the trenches 1262 by removing exposed fin-shaped structures 1210. The channel etching process may be a selective wet etching process, a selective dry etching process, or a combination thereof. The exposed fin-shaped structures 1210 may be etched using a suitable process such as described above with respect to FIG. 25B. The channel etching process etches the selected fin-shaped structures 1210, removing sacrificial layers 1206, channel layers 1208, and cladding layer 1226 and exposing a top surface of substrate 1202 without substantially etching dummy gate stack 1240, dielectric fins 1224, and STI 1216. Due to the removal of the cladding layer 1226, the trenches 1262 may have a wider top portion above the top surface of the STI 1216 and a narrower bottom portion under the top surface of the STI 1216.

In some embodiments, the CPO process and the channel etching process may be performed as separate processes. In the depicted embodiment, the CPO process and the channel etching process are performed as a single process. Performing the CPO process and the channel etching process together reduces the risk of a cut failure by etching through the third dielectric layer 1232. After the etching process is complete, trenches 1262 have a height H1 from the top surface of the substrate 1202 to a top surface of the dummy gate structure 1240. Height H1 is about 1100 nm to about 1150 nm. The trenches 1263 have a height H2 from a top surface of the dielectric fin 1224 to the top surface of the dummy gate structure 1240. Height H2 is about 50 nm to about 75 nm. The combined CPO process and channel etching process may be performed on short channel devices and long channel devices at the same time.

Referring to FIG. 25J, the method 1100 includes a block 1118 where cut polysilicon on oxide definition edge (CPODE) structures 1264 are formed in trenches 1262 and trenches 1263. CPODE structures 1264 provide gate isolation between individual MBC transistors and/or groups of MBC transistors. The CPODE structures 1264 further serve to enlarge the metal gate etching back (MGEB) processing window in future processes. The MGEB processing window for short channel devices may be different than the MGEB processing window for long channel devices due to the difference in channel region dimensions. The difference in processing windows may cause a different etch rate in the short channel devices as compared to the long channel devices. The different etch rates may cause a failure, such as for example, a short between metal gates. The CPODE structures 1264 formed according to method 1100 of the present disclosure provides a higher isolation structure than the dielectric fins 1224 alone. This increased height increases the processing window for the future MGEB process for both the short channel and long channel MBC transistors, providing improved loading and process control.

The CPODE structures 1264 may include a dielectric or insulating material. The dielectric material may be deposited and planarized by a CMP process to form the CPODE structures 1264 in the trenches 1262 and 1263. The dielectric material for the CPODE 1264 may be deposited using HDPCVD, CVD, ALD, or a suitable deposition technique. In some instances, the CPODE structures 1264 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. Due to the shape of the trenches 1262, the CPODE structures 1264 filling the trenches 1262 may also have a wider top portion above the top surface of the STI 1216 and a narrower bottom portion under the top surface of the STI 1216.

Referring to FIGS. 2K and 2L, the method 1100 includes a block 1120 where the dummy gate stacks 1240 and the sacrificial layers 1206 are selectively removed. The dummy gate stacks 1240 are removed from the workpiece 1200 by a selective etching process. The selective etching process may be a selective wet etching process, a selective dry etching process, or a combination thereof. In the depicted embodiment, the selective etching process selectively removes the dummy dielectric layer 1242 and the dummy electrode 1244 without substantially damaging the channel layers 1208. The removal of the dummy gate stacks 1240 results in gate trenches 1266 over the channel regions. After the removal of the dummy gate stacks 1240, the channel layers 1208, the sacrificial layers 1206, and the cladding layer 1226 in the channel regions are exposed in the gate trenches 1266. At the conclusion of the block 1120, the protruding portions of the dielectric fins 1224 not covered by CPODE structures 1264, particularly the third dielectric layer 1232, may be etched back in the channel regions, as illustrated in FIG. 25K. Subsequently, operations at the block 1120 selectively removes the sacrificial layers 1206 and the cladding layer 1226 from the gate trenches 1266 to release the channel layers 1208, as illustrated in FIG. 25L. The released channel layers 1208 at the conclusion of the block 1120 are also denoted as the channel members 1208. In the depicted embodiment where the channel members 1208 resemble a sheet or a nanosheet, the channel member release process may also be referred to as a sheet formation process. The channel members 1208 are vertically stacked along the Z direction. All channel members 1208 are spaced apart from the dielectric fins 1224 for a distance reserved by the cladding layer 1226. The selective removal of the sacrificial layers 1206 and the cladding layer 1226 may be implemented by selective dry etching, selective wet etching, or other selective etching processes. In some embodiments, the selective wet etching includes ammonium hydroxide (NH4OH), hydrogen fluoride (HF), hydrogen peroxide (H2O2), or a combination thereof (e.g. an APM etch that includes an ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as NH4OH. With the removal of the sacrificial layers 1206 and the cladding layer 1226 from the channel regions, the dielectric fins 1224, the channel members 1208, the top surface of the substrate 1202, and the isolation feature 1216 are exposed in the gate trenches 1266.

Referring to FIG. 25M, the method 1100 includes a block 1122 where the dielectric fins 1224 are thinned down in width by selectively removing outer dielectric layers—the first dielectric layer 1228—from sidewalls of the second dielectric layer 1230. The thinning of the dielectric fins 1224 provides a larger gate trench volume which in turn facilitates the deposition of various dielectric and metallic layers in the to-be-formed functional gate structures. The first dielectric layer 1228 exposed in the gate trenches 1266 are removed from the channel regions by a selective etching process. The selective etching process may be a selective wet etching process, a selective dry etching process, or a combination thereof. In the depicted embodiments, the selective etching process selectively removes the first dielectric layer 1228 without substantially damaging the second dielectric layer 1230. In some instances, the third dielectric layer 1232 also have some etching loss such that a width of the third dielectric layer 1232 becomes smaller than the second dielectric layer 1230 thereunder and the CPODE structure 1264 there above. As shown in FIG. 25M, some portions of the first dielectric layer 1228 sandwiched between the second dielectric layer 1230 and the CPODE structures 1264 may remain due to their less exposed area for etchant(s) and accordingly smaller etching rate. Similarly, some portions of the first dielectric layer 1228 sandwiched between the second dielectric layer 1230 and the STI 1216 may also remain.

Referring to FIGS. 2N, 2O, and 2P, the method 1100 includes a block 1124 where gate structures 1270 (also known as functional gate structures 1270 or metal gate structures 1270) are formed in the gate trenches 1266 to engage each of the channel members 1208. Each of the gate structures 1270 includes an interfacial layer 1271 disposed on the channel members 1208, a high-k dielectric layer 1272 disposed on the interfacial layer 1271, and a gate electrode layer 1274 over the gate dielectric layer 1272. The interfacial layer 1271 and the high-k dielectric layer 1272 are collectively referred to as a gate dielectric layer. The interfacial layer 1271 may include silicon oxide and be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed semiconductive surfaces of the channel members 1208 and exposed semiconductive surfaces of the overlaying semiconductor layer 1208B to form the interfacial layer. That is, the exposed dielectric surfaces of the isolation feature 1216 may be not covered by the interfacial layer 1271. The high-k dielectric layer 1272 is then deposited over the interfacial layer 1271 using ALD, CVD, and/or other suitable methods. The high-k dielectric layer 1272 also covers the exposed surfaces of the isolation feature 1216. The high-k dielectric layer 1272 includes high-K dielectric materials. In one embodiment, the high-k dielectric layer 1272 may include hafnium oxide. Alternatively, the high-k dielectric layer 1272 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material.

After the formation of the high-k dielectric layer 1272, the gate electrode layer 1274 is deposited over the high-k dielectric layer 1272, as illustrated in FIG. 25O. The gate electrode layer 1274 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 1274 may be formed by ALD, PVD, CVD, e-beam evaporation, or other suitable process. As illustrated in FIG. 25O, the gate structures 1270 are deposited as a joint gate structure, filling gate trenches 1266 and covering top surfaces of CPODE structures 1264. In a next step, illustrated in FIG. 25P, a metal gate etch back process is performed to recess the gate structures 1270 until they are below a bottom surface of CPODE structures 1264. In some embodiments, the top surface of the gate structures 1270 may be recessed below the top surface of the dielectric fins 1224. The dielectric fins 1224 provide electrical isolation between neighboring gate structures 1270 and the CPODE structures 1264 increase the processing window for the metal gate etch back process. Increasing the processing window decreases the chances of etching too much material and exposing a top channel layer 1208 or not etching enough material causing a short between adjacent MBC transistors. Furthermore, the difference in processing windows between short channel devices and long channel devices is decreased, and the processing windows may overlap. This may allow for performing metal gate etch back processing on both short channel devices and long channel devices at the same time. The etching back of the gate structures 1270 may include a selective wet etching process that uses nitric acid, hydrochloric acid, sulfuric acid, ammonium hydroxide, hydrogen peroxide, or a combination thereof. In the depicted embodiment, each of the channel members 1208 is wrapped around by a respective gate structure 1270. In the depicted embodiment, the gate structures 1270 are formed over a top portion of the dielectric fins 1224 and adjacent the CPODE structures 1264. The increased size of the gate structures 1270 provided by this configuration improves the gate control of the transistor.

Referring to FIG. 26, depicted is a device 1300 according to embodiments of the present disclosure that may be formed according to the steps of method 1100. The device 1300 includes a substrate 1202, channel layers 1208, dielectric fins 1224, Continuous Poly on Diffusion Edge (CPODE) structures 1264, and metal gate structures 1270 surrounding channel layers 1208. The dielectric fins 1224 separate each of the MBC transistors illustrated by the channel layers 1208 and metal gate structures 1270. As illustrated, the top surface of the metal gate structures 1270 are recessed below the top surface of the dielectric fins 1224. In some embodiments, the CPODE structures 1264 formed over the dielectric fins may be partially etched during subsequent etching processes resulting in tapered CPODE structures 1264. The top portion of CPODE structures 1264 have a width W12 along the Y direction. The width W12 may be about 20 nm to about 30 nm. The bottom portions of CPODE structures 1264 have a width W13 along the Y direction. The width W13 may be about 15 nm to about 25 nm. A top portion of the dielectric fins 1224 has a width W14 along the Y direction. The width W14 may be about 15 nm to about 35 nm. As discussed above, the arrangement of the CPODE structure 1264 and the dielectric fin 1224 is caused by the etching process used to form the CPODE structure 1264. This may cause the width W12 to be larger than the width W13 and the width W13 to be smaller than the width W14. In some embodiments, the width W12 may be larger than the width W14. In some other embodiments, the width W12 may be equal to or smaller than the width W14.

In one exemplary aspect, the present disclosure is directed to a method. The method includes forming a first semiconductor fin and a second semiconductor fin protruding from a substrate, each of the first and the second semiconductor fins including a stack of alternating channel layers and non-channel layers, forming a dielectric helmet between and protruding from the first and the second semiconductor fins, forming a dummy gate stack over the dielectric helmet, patterning the dummy gate stack to expose a portion of the dielectric helmet, removing the exposed portion of the dielectric helmet, forming a metal gate structure in place of the dummy gate stack and the non-channel layers, such that a remaining portion of the dielectric helmet separates the metal gate structure between the first and the second semiconductor fins, and forming a contact feature over a portion of the metal gate structure. A sidewall of the contact feature is between one of the first or the second semiconductor fin and the remaining portion of the dielectric helmet. In some embodiments, the method further includes forming source/drain (S/D) features in the first and the second semiconductor fins before patterning the dummy gate stack, and recessing the metal gate structure with respect to the dielectric helmet, such that the dielectric helmet protrudes from and separates the metal gate structure. In some embodiments, the method further includes forming a dielectric layer over the recessed metal gate structure, such that the contact feature extends through the dielectric layer to directly contact the portion of the metal gate structure. In some embodiments, bottom portions of the first and the second semiconductor fins are separated by first isolation structures, and forming the dielectric helmet includes forming second isolation structures over the first isolation features to fill space between the first and the second semiconductor fins, recessing the second isolation structures with respect to the first and the second semiconductor fins, and forming the dielectric helmet over the recessed second isolation structures. In some embodiments, the contact feature is formed over a portion of the recessed second isolation features. In some embodiments, patterning the dummy gate stack includes forming a patterned mask to expose portions of the dummy gate stack, a width of the patterned mask being less than a width of the dielectric helmet, removing the exposed portions of the dummy gate stack to expose the portion of the dielectric helmet, and removing the patterned mask to expose remaining portions of the dummy gate stack disposed over the remaining portion of the dielectric helmet. In some embodiments, forming the first and the second semiconductor fins includes forming a cladding layer along sidewalls of each of the first and the second semiconductor fins. The metal gate structure is formed in place of the cladding layer. The contact feature is disposed over a portion of the metal gate structure formed in place of the cladding layer.

In another exemplary aspect, the present disclosure is directed to a method. The method includes forming a semiconductor fin protruding from a substrate, the semiconductor fin including a stack of alternating channel layers and non-channel layers, forming a cladding layer along a sidewall of the semiconductor fin, forming an isolation structure along the cladding layer, forming a dielectric helmet over the isolation structure, such that the dielectric helmet protrudes from the semiconductor fin, forming a dummy gate stack over the dielectric helmet, etching the dummy gate stack to expose a portion of the dielectric helmet, removing the exposed portion of the dielectric helmet to expose a portion of the isolation structure, forming a metal gate structure. A first portion of the metal gate structure replaces the dummy gate stack, a second portion of the metal gate structure replaces the non-channel layers, and a third portion of the metal gate structure replaces the cladding layer. A remaining portion of the dielectric helmet defines a sidewall of the metal gate structure. The method also includes forming a gate contact in contact with the metal gate structure. The gate contact is formed over the third portion of the metal gate structure. In some embodiments, the metal gate structure includes a fourth portion formed over the exposed portion of the isolation structure. The gate contact is formed over the fourth portion of the metal gate structure. In some embodiments, the method further includes recessing the metal gate structure such that the remaining portion of the dielectric helmet protrudes from the recessed metal gate structure, and forming a dielectric layer over the recessed metal gate structure such that the gate contact is formed in the dielectric layer. In some embodiments, the method further includes forming a metallization layer over the gate contact. In some embodiments, etching the dummy gate stack includes forming a patterned masking element over the dummy gate stack, a width of the patterned masking element being less than a width of the dielectric helmet, and etching the dummy gate stack using the patterned masking element as an etch mask to expose the portion of the dielectric helmet. In some embodiments, removing the exposed portion of the dielectric helmet includes etching the dielectric helmet using the etched dummy gate stack as an etch mask. In some embodiments, a difference between the width of the patterned masking element and the width of the dielectric helmet is less than a width of the remaining portion of the dielectric helmet.

In another exemplary aspect, the present disclosure is directed to a method. The method includes providing a workpiece including a substrate, a first plurality of channel members over a first portion of the substrate, a second plurality of channel members over a second portion of the substrate and a dummy gate structure disposed over the first plurality of channel members and the second plurality of channel members, forming a first dielectric fin between the first plurality of channel member and the second plurality of channel members, adjacent a first side of the first plurality of channel members, forming a second dielectric fin adjacent an opposing second side of the first plurality of channel members, forming a first trench and a second trench as part of the same process, the first trench exposing the first dielectric fin, and the second trench being adjacent the second dielectric fin and exposing the substrate, and forming a first dielectric structure in the first trench and a second dielectric structure in the second trench. In some embodiments, the method further includes forming the dummy gate structure over the first plurality of channel members, the second plurality of channel members, the first dielectric fin, and the second dielectric fin. In some embodiments, the forming the first trench further includes etching through the dummy gate structure to expose the first dielectric fin. In some embodiments, the forming the second trench further includes etching through the dummy gate structure to expose a top surface of the second plurality of channel members, and etching through the second plurality of channel members to expose a top surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first semiconductor fin and a second semiconductor fin protruding from a substrate, wherein each of the first and the second semiconductor fins includes a stack of alternating channel layers and non-channel layers;
    forming a dielectric helmet between and protruding from the first and the second semiconductor fins;
    forming a dummy gate stack over the dielectric helmet;
    patterning the dummy gate stack to expose a portion of the dielectric helmet;
    removing the exposed portion of the dielectric helmet;
    forming a metal gate structure in place of the dummy gate stack and the non-channel layers, such that a remaining portion of the dielectric helmet separates the metal gate structure between the first and the second semiconductor fins; and
    forming a contact feature over a portion of the metal gate structure, wherein a sidewall of the contact feature is between one of the first or the second semiconductor fin and the remaining portion of the dielectric helmet.

2. The method of claim 1, further comprising:
    forming source/drain (S/D) features in the first and the second semiconductor fins before patterning the dummy gate stack; and
    recessing the metal gate structure with respect to the dielectric helmet, such that the dielectric helmet protrudes from and separates the metal gate structure.

3. The method of claim 2, further comprising forming a dielectric layer over the recessed metal gate structure, such that the contact feature extends through the dielectric layer to directly contact the portion of the metal gate structure.

4. The method of claim 1, wherein bottom portions of the first and the second semiconductor fins are separated by first isolation structures, and wherein forming the dielectric helmet includes:
    forming second isolation structures over the first isolation features to fill space between the first and the second semiconductor fins;
    recessing the second isolation structures with respect to the first and the second semiconductor fins; and
    forming the dielectric helmet over the recessed second isolation structures.

5. The method of claim 4, wherein the contact feature is formed over a portion of the recessed second isolation features.

6. The method of claim 1, wherein patterning the dummy gate stack includes:
    forming a patterned mask to expose portions of the dummy gate stack, wherein a width of the patterned mask is less than a width of the dielectric helmet;
    removing the exposed portions of the dummy gate stack to expose the portion of the dielectric helmet; and
    removing the patterned mask to expose remaining portions of the dummy gate stack disposed over the remaining portion of the dielectric helmet.

7. The method of claim 1, wherein forming the first and the second semiconductor fins includes forming a cladding layer along sidewalls of each of the first and the second semiconductor fins, wherein the metal gate structure is formed in place of the cladding layer, and wherein the contact feature is disposed over a portion of the metal gate structure formed in place of the cladding layer.

8. A method, comprising:
    forming a semiconductor fin protruding from a substrate, wherein the semiconductor fin includes a stack of alternating channel layers and non-channel layers;
    forming a cladding layer along a sidewall of the semiconductor fin;
    forming an isolation structure along the cladding layer;
    forming a dielectric helmet over the isolation structure, such that the dielectric helmet protrudes from the semiconductor fin;
    forming a dummy gate stack over the dielectric helmet;
    etching the dummy gate stack to expose a portion of the dielectric helmet;
    removing the exposed portion of the dielectric helmet to expose a portion of the isolation structure;
    forming a metal gate structure, wherein a first portion of the metal gate structure replaces the dummy gate stack, a second portion of the metal gate structure replaces the non-channel layers, and a third portion of the metal gate structure replaces the cladding layer, and wherein a remaining portion of the dielectric helmet defines a sidewall of the metal gate structure; and
    forming a gate contact in contact with the metal gate structure, wherein the gate contact is formed over the third portion of the metal gate structure.

9. The method of claim 8, wherein the metal gate structure includes a fourth portion formed over the exposed portion of the isolation structure, and wherein the gate contact is formed over the fourth portion of the metal gate structure.

10. The method of claim 8, further comprising:
   recessing the metal gate structure such that the remaining portion of the dielectric helmet protrudes from the recessed metal gate structure; and
   forming a dielectric layer over the recessed metal gate structure such that the gate contact is formed in the dielectric layer.

11. The method of claim 8, further comprising forming a metallization layer over the gate contact.

12. The method of claim 8, wherein etching the dummy gate stack includes:
   forming a patterned masking element over the dummy gate stack, wherein a width of the patterned masking element is less than a width of the dielectric helmet; and
   etching the dummy gate stack using the patterned masking element as an etch mask to expose the portion of the dielectric helmet.

13. The method of claim 12, wherein removing the exposed portion of the dielectric helmet includes etching the dielectric helmet using the etched dummy gate stack as an etch mask.

14. The method of claim 12, wherein a difference between the width of the patterned masking element and the width of the dielectric helmet is less than a width of the remaining portion of the dielectric helmet.

15. A method, comprising:
   forming a stack of semiconductor layers over a semiconductor substrate;
   forming an isolation structure along a height of the stack of semiconductor layers;
   forming a metal gate structure over and interleaved with the stack of semiconductor layers;
   depositing a gate isolation feature disposed over a top surface of the isolation structure, wherein the gate isolation feature protrudes from and defines a sidewall of the metal gate structure, and wherein a width of the gate isolation feature is less than a width of the isolation structure; and
   depositing a gate contact over the metal gate structure, wherein the gate contact is disposed closer to a sidewall of the gate isolation feature than to a sidewall of the stack of semiconductor layers.

16. The method of claim 15, wherein the gate isolation feature includes a high-k dielectric material.

17. The method of claim 15, wherein the metal gate structure includes a sidewall portion disposed along a height of the stack of semiconductor layers, and wherein the gate contact is disposed over the sidewall portion of the metal gate structure.

18. The method of claim 15, wherein a portion of the metal gate structure is disposed over the top surface of the isolation structure.

19. The method of claim 15, wherein the gate contact is disposed over the top surface of the isolation structure.

20. The method of claim 15, further comprising:
   forming a conductive line electrically connected to the gate contact.

* * * * *